United States Patent
Messick et al.

(10) Patent No.: US 12,411,536 B2
(45) Date of Patent: Sep. 9, 2025

(54) POWER MANAGEMENT SYSTEM

(71) Applicant: Dell Products L.P., Round Rock, TX (US)

(72) Inventors: Douglas Evan Messick, Austin, TX (US); Craig Anthony Klein, Elgin, TX (US); John Erven Jenne, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 190 days.

(21) Appl. No.: 18/206,814

(22) Filed: Jun. 7, 2023

(65) Prior Publication Data

US 2023/0315183 A1 Oct. 5, 2023

Related U.S. Application Data

(63) Continuation-in-part of application No. 18/072,835, filed on Dec. 1, 2022, now abandoned, which is a
(Continued)

(51) Int. Cl.
| | |
|---|---|
| *G06F 1/32* | (2019.01) |
| *G06F 1/3206* | (2019.01) |
| *G06F 1/3287* | (2019.01) |
| *G06F 1/3296* | (2019.01) |
| *G06F 1/24* | (2006.01) |
| *G06F 1/30* | (2006.01) |

(52) U.S. Cl.
CPC .......... *G06F 1/3206* (2013.01); *G06F 1/3287* (2013.01); *G06F 1/3296* (2013.01); *G06F 1/24* (2013.01); *G06F 1/30* (2013.01)

(58) Field of Classification Search
None
See application file for complete search history.

(56) References Cited

U.S. PATENT DOCUMENTS 9,838,003 B1 * 12/2017 Prasad ................ H01L 23/5256
2018/0052431 A1 * 2/2018 Shaikh .................... H02J 3/003
(Continued)

*Primary Examiner* — Fahmida Rahman
(74) *Attorney, Agent, or Firm* — Joseph Mencher

(57) ABSTRACT

A power management system includes a power infrastructure having power infrastructure components that couple computing devices to power source(s), and a power management subsystem coupled to the computing devices. The power management subsystem identifies power requirement information for each of the computing devices and power transmission limitation information for the power infrastructure components, and determines a power infrastructure architecture that identifies how the power infrastructure components couple the computing devices to the power source(s). The power management subsystem then uses the power requirement information, the power transmission limitation information, and the power infrastructure architecture to generate and provide a respective input current limit to each of the computing devices. Each respective input current limit is configured to maximize performance of the respective computing device for which it was generated while ensuring availability of the power infrastructure in the event of an unavailability of a subset of the power infrastructure components.

20 Claims, 23 Drawing Sheets

Related U.S. Application Data continuation of application No. 16/950,572, filed on Nov. 17, 2020, now Pat. No. 11,520,396, which is a continuation of application No. 16/179,137, filed on Nov. 2, 2018, now Pat. No. 10,852,804.

(56) References Cited

U.S. PATENT DOCUMENTS

2018/0189432 A1\* 7/2018 Leslie ................... G06F 1/189
2020/0166977 A1\* 5/2020 Jayaraman ............. G06F 1/206

\* cited by examiner

| 1500a | | | | PHASE PAIRS | | | PDU 1210 PHASE PAIRS | | | PDU 1212 PHASE PAIRS | | |
|---|---|---|---|---|---|---|---|---|---|---|---|---|
| PSU 1202 | PDU | BANK | OUTLET | PHASE PAIR 1304 | PHASE PAIR 1306 | PHASE PAIR 1308 | PHASE PAIR 1304 | PHASE PAIR 1306 | PHASE PAIR 1308 | PHASE PAIR 1304 | PHASE PAIR 1306 | PHASE PAIR 1308 |
| a | 1210 | 1 | 3 | X | | | 3.35 | 0.00 | 0.00 | 0.00 | 0.00 | 0.00 |
| b | 1210 | 3 | 9 | | | X | 0.00 | 0.00 | 3.35 | 0.00 | 0.00 | 0.00 |
| c | 1210 | 5 | 15 | | X | | 0.00 | 3.35 | 0.00 | 0.00 | 0.00 | 0.00 |
| d | 1212 | 1 | 3 | X | | | 0.00 | 0.00 | 0.00 | 3.35 | 0.00 | 0.00 |
| e | 1212 | 3 | 9 | | | X | 0.00 | 0.00 | 0.00 | 0.00 | 0.00 | 3.35 |
| f | 1212 | 5 | 15 | | X | | 0.00 | 0.00 | 0.00 | 0.00 | 3.35 | 0.00 |

| 1500b | | | | PHASE PAIRS | | | PDU 1210 PHASE PAIRS | | | PDU 1212 PHASE PAIRS | | |
|---|---|---|---|---|---|---|---|---|---|---|---|---|
| PSU 1204 | PDU | BANK | OUTLET | PHASE PAIR 1304 | PHASE PAIR 1306 | PHASE PAIR 1308 | PHASE PAIR 1304 | PHASE PAIR 1306 | PHASE PAIR 1308 | PHASE PAIR 1304 | PHASE PAIR 1306 | PHASE PAIR 1308 |
| a | 1210 | 2 | 5 | X | | | 3.35 | 0.00 | 0.00 | 0.00 | 0.00 | 0.00 |
| b | 1210 | 4 | 11 | | | X | 0.00 | 0.00 | 3.35 | 0.00 | 0.00 | 0.00 |
| c | 1210 | 6 | 17 | | X | | 0.00 | 3.35 | 0.00 | 0.00 | 0.00 | 0.00 |
| d | 1212 | 2 | 5 | X | | | 0.00 | 0.00 | 0.00 | 3.35 | 0.00 | 0.00 |
| e | 1212 | 4 | 11 | | | X | 0.00 | 0.00 | 0.00 | 0.00 | 0.00 | 3.35 |
| f | 1212 | 6 | 17 | | X | | 0.00 | 0.00 | 0.00 | 0.00 | 3.35 | 0.00 |
| | | | | | | | 6.70 | 6.70 | 6.70 | 6.70 | 6.70 | 6.70 |

Table 1500a:

| PSU 1202 | PDU | BANK | OUTLET | PHASE PAIRS | | | PDU 1210 PHASE PAIRS | | | PDU 1212 PHASE PAIRS | | |
|---|---|---|---|---|---|---|---|---|---|---|---|---|
| | | | | PHASE PAIR 1304 | PHASE PAIR 1306 | PHASE PAIR 1308 | PHASE PAIR 1304 | PHASE PAIR 1306 | PHASE PAIR 1308 | PHASE PAIR 1304 | PHASE PAIR 1306 | PHASE PAIR 1308 |
| a | 1210 | 1 | 3 | X | | | 6.70 | 0.00 | 0.00 | 0.00 | 0.00 | 0.00 |
| b | 1210 | 3 | 9 | | | X | 0.00 | 0.00 | 6.70 | 0.00 | 0.00 | 0.00 |
| c | 1210 | 5 | 15 | | X | | 0.00 | 6.70 | 0.00 | 0.00 | 0.00 | 0.00 |
| d | 1212 | 1 | 3 | X | | | 0.00 | 0.00 | 0.00 | 0.00 | 0.00 | 0.00 |
| e | 1212 | 3 | 9 | | | X | 0.00 | 0.00 | 0.00 | 0.00 | 0.00 | 0.00 |
| f | 1212 | 5 | 15 | | X | | 0.00 | 0.00 | 0.00 | 0.00 | 0.00 | 0.00 |

Table 1500b:

| PSU 1204 | PDU | BANK | OUTLET | PHASE PAIR 1304 | PHASE PAIR 1306 | PHASE PAIR 1308 | PHASE PAIR 1304 | PHASE PAIR 1306 | PHASE PAIR 1308 | PHASE PAIR 1304 | PHASE PAIR 1306 | PHASE PAIR 1308 |
|---|---|---|---|---|---|---|---|---|---|---|---|---|
| a | 1210 | 2 | 5 | X | | | 6.70 | 0.00 | 0.00 | 0.00 | 0.00 | 0.00 |
| b | 1210 | 4 | 11 | | | X | 0.00 | 0.00 | 6.70 | 0.00 | 0.00 | 0.00 |
| c | 1210 | 6 | 17 | | X | | 0.00 | 6.70 | 0.00 | 0.00 | 0.00 | 0.00 |
| d | 1212 | 2 | 5 | X | | | 0.00 | 0.00 | 0.00 | 0.00 | 0.00 | 0.00 |
| e | 1212 | 4 | 11 | | | X | 0.00 | 0.00 | 13.40 | 0.00 | 0.00 | 0.00 |
| f | 1212 | 6 | 17 | | X | | 13.40 | 13.40 | 0.00 | 0.00 | 0.00 | 0.00 |

| 1600a → | | | | PHASE PAIRS | | | PDU 1214 PHASE PAIRS | | | PDU 1216 PHASE PAIRS | | |
|---|---|---|---|---|---|---|---|---|---|---|---|---|
| PSU 1206 | PDU | BANK | OUTLET | PHASE PAIR 1304 | PHASE PAIR 1306 | PHASE PAIR 1308 | PHASE PAIR 1304 | PHASE PAIR 1306 | PHASE PAIR 1308 | PHASE PAIR 1304 | PHASE PAIR 1306 | PHASE PAIR 1308 |
| a | 1214 | 1 | 3 | X | | | 4.33 | 0.00 | 0.00 | 0.00 | 0.00 | 0.00 |
| b | 1214 | 3 | 9 | | | X | 0.00 | 0.00 | 4.33 | 0.00 | 0.00 | 0.00 |
| c | 1214 | 5 | 15 | | X | | 0.00 | 4.33 | 0.00 | 0.00 | 0.00 | 0.00 |
| d | 1216 | 1 | 3 | X | | | 0.00 | 0.00 | 0.00 | 4.33 | 0.00 | 0.00 |
| e | 1216 | 3 | 9 | | | X | 0.00 | 0.00 | 0.00 | 0.00 | 0.00 | 4.33 |
| f | 1216 | 5 | 15 | | X | | 0.00 | 0.00 | 0.00 | 0.00 | 4.33 | 0.00 |

| 1600b → | | | | PHASE PAIRS | | | PDU 1214 PHASE PAIRS | | | PDU 1216 PHASE PAIRS | | |
|---|---|---|---|---|---|---|---|---|---|---|---|---|
| PSU 1208 | PDU | BANK | OUTLET | PHASE PAIR 1304 | PHASE PAIR 1306 | PHASE PAIR 1308 | PHASE PAIR 1304 | PHASE PAIR 1306 | PHASE PAIR 1308 | PHASE PAIR 1304 | PHASE PAIR 1306 | PHASE PAIR 1308 |
| a | 1214 | 2 | 5 | X | | | 4.33 | 0.00 | 0.00 | 0.00 | 0.00 | 0.00 |
| b | 1214 | 4 | 11 | | | X | 0.00 | 0.00 | 4.33 | 0.00 | 0.00 | 0.00 |
| c | 1214 | 6 | 17 | | X | | 0.00 | 4.33 | 0.00 | 0.00 | 0.00 | 0.00 |
| d | 1216 | 2 | 5 | X | | | 0.00 | 0.00 | 0.00 | 4.33 | 0.00 | 0.00 |
| e | 1216 | 4 | 11 | | | X | 0.00 | 0.00 | 0.00 | 0.00 | 0.00 | 4.33 |
| f | 1216 | 6 | 17 | | X | | 0.00 | 0.00 | 0.00 | 0.00 | 4.33 | 0.00 |
| | | | | | | | 8.67 | 8.67 | 8.67 | 8.67 | 8.67 | 8.67 |

| PSU 1206 | PDU | BANK | OUTLET | PHASE PAIRS | | | PDU 1214 PHASE PAIRS | | | PDU 1216 PHASE PAIRS | | |
|---|---|---|---|---|---|---|---|---|---|---|---|---|
| | | | | PHASE PAIR 1304 | PHASE PAIR 1306 | PHASE PAIR 1308 | PHASE PAIR 1304 | PHASE PAIR 1306 | PHASE PAIR 1308 | PHASE PAIR 1304 | PHASE PAIR 1306 | PHASE PAIR 1308 |
| a | 1214 | 1 | 3 | X | | | 0.00 | 0.00 | 0.00 | 0.00 | 0.00 | 0.00 |
| b | 1214 | 3 | 9 | | | X | 0.00 | 0.00 | 0.00 | 0.00 | 0.00 | 0.00 |
| c | 1214 | 5 | 15 | | X | | 0.00 | 0.00 | 0.00 | 0.00 | 0.00 | 0.00 |
| d | 1216 | 1 | 3 | X | | | 8.67 | 0.00 | 0.00 | 8.67 | 0.00 | 0.00 |
| e | 1216 | 3 | 9 | | | X | 0.00 | 0.00 | 0.00 | 0.00 | 0.00 | 8.67 |
| f | 1216 | 5 | 15 | | X | | 0.00 | 0.00 | 0.00 | 0.00 | 8.67 | 0.00 |

1600b

| PSU 1208 | PDU | BANK | OUTLET | PHASE PAIRS | | | PDU 1214 PHASE PAIRS | | | PDU 1216 PHASE PAIRS | | |
|---|---|---|---|---|---|---|---|---|---|---|---|---|
| | | | | PHASE PAIR 1304 | PHASE PAIR 1306 | PHASE PAIR 1308 | PHASE PAIR 1304 | PHASE PAIR 1306 | PHASE PAIR 1308 | PHASE PAIR 1304 | PHASE PAIR 1306 | PHASE PAIR 1308 |
| a | 1214 | 2 | 5 | X | | | 0.00 | 0.00 | 0.00 | 0.00 | 0.00 | 0.00 |
| b | 1214 | 4 | 11 | | | X | 0.00 | 0.00 | 0.00 | 0.00 | 0.00 | 0.00 |
| c | 1214 | 6 | 17 | | X | | 0.00 | 0.00 | 0.00 | 0.00 | 0.00 | 0.00 |
| d | 1216 | 2 | 5 | X | | | 8.67 | 0.00 | 0.00 | 8.67 | 0.00 | 0.00 |
| e | 1216 | 4 | 11 | | | X | 0.00 | 0.00 | 0.00 | 0.00 | 8.67 | 0.00 |
| f | 1216 | 6 | 17 | | X | | 0.00 | 0.00 | 0.00 | 17.33 | 17.33 | 17.33 |

POWER MANAGEMENT SYSTEM

CROSS-REFERENCE TO RELATED APPLICATIONS

The present disclosure is a continuation-in-part of U.S. patent application Ser. No. 18/072,835, filed Dec. 1, 2022, which is a continuation of U.S. patent application Ser. No. 16/950,572, filed Nov. 17, 2020, now U.S. Pat. No. 11,520,396, which is a continuation of U.S. patent application Ser. No. 16/179,137, filed Nov. 2, 2018, now U.S. Pat. No. 10,852,804, the disclosures of which are incorporated by reference herein in their entirety.

BACKGROUND

The present disclosure relates generally to information handling systems, and more particularly to power management for information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems that are configured to perform critical functions such as, for example, server devices in a datacenter, are often provided with redundant power supplied through circuit breakers coupled to respective independent power grids. Conventionally, circuit breakers are often sized for failover based on a total Power Supply Unit (PSU) capacity of the PSUs in the server devices coupled to that circuit breaker. However, sizing circuit breakers in such a manner typically results in "stranded power" (i.e., allocated power that is not actually utilized by the server devices), particularly when the PSUs in the server devices are oversized compared to the actual power loads of their server devices. Conventionally, stranded power is reduced by capping per-server-device power to a specified power level, which allows the administrator of the datacenter to size circuit breakers for failover based on the total capped power for the server devices coupled to that circuit breaker or, given a particular circuit breaker size, to limit the server devices coupled to that circuit breaker based on the total capped power of those server devices. However, such conventional solutions suffer from a number of shortcomings.

For example, most general use circuit breakers are defined by a current rating (e.g., 20A). "I2T" or ampere-squared-second terms are used to help show the amount of heat or energy it takes to trip such circuit breakers. As such, server device power capping provides indirect protection, and requires that the administrator of the datacenter convert from a current limit to a power limit. In order to protect against the highest possible input current (i.e., when the voltage sags), the server device power capping based on current conversions using the lowest operable input voltage will result in stranded power. To provide a specific example, 220 nominal volts (V) of alternating current power can operate down to 170V, and capping power for a 50 amp (A) circuit breaker coupled to a rack of server devices based on 170V strands [(220V−170V)*50A]=2500 watts (W) of the possible [220V*50A]=11,000 W that are available. As such, the power limit in this example is 2500 W lower than is required due to voltage sag issues.

Furthermore, conventional server device power capping provides a single power limit level per server device, which either assumes identical independent power grids, circuit breakers, and/or other power system components, or requires the system to be set for the lowest capability power grid, circuit breaker, and/or other components. As such, stranded power can result, particularly when the system includes a primary power grid that supplies more power than the secondary power grid, and the circuit breakers are sized differently. Furthermore, newer generation server devices are often provided in an existing infrastructure, and such single per-server-device power limit levels do not support a power grid fault tolerant redundant configuration which would allow the typically higher-powered newer generation server devices to operate at full (or higher) workloads when both power grids are available, and at throttled (or reduced) workloads upon the unavailability of one of the power grids. Finally, hardware backup solutions are typically not available, or require that a baseboard management controller in the server device know that the server device is about to go offline due to an impending reset.

Some of the inventors of the present disclosure have developed a power management system that may be provided in a server device to allow an input current draw from power grid(s) by power supply unit(s) in the server device to be limited based on the respective circuit breaker through which they are coupled to the power grid(s), which allows those circuit breaker(s) to be sized for failover according to a total input current limit for the server device, and that power management system is described in U.S. patent application Ser. No. 16/950,572, filed Nov. 17, 2020, now U.S. Pat. No. 11,520,396, and U.S. patent application Ser. No. 16/179,137, filed Nov. 2, 2018, now U.S. Pat. No. 10,852,804, the disclosures of which are incorporated by reference herein in their entirety. As described in those patent documents, the power management system allows for "fine-grained" throttling of server device components based on a configurable input current limit applied to power supply units in that server device in order to avoid tripping of circuit breakers while also minimizing stranded power associated with that server device.

However, the inventors of the present disclosure have recognized a need for more accuracy in the determination of the input current limits utilized in the power management systems described above. For example, in most situations, a relatively large number of server devices will be connected to the power grid(s) described above via power systems that include the power supply unit(s) in the server devices, power distribution units, circuit breakers, and/or other power system components known in the art, and thus the determination of the input current limit for application to any particular server device based only on considerations of that server device can raise issues. Furthermore, as power density for server device racks in datacenters continues to increase, the provisioning of sufficient power infrastructure that will supply sufficient power to the server devices in those server device racks, as well as provide redundant power to the server devices in those server device racks in the event of a power availability issue with the power infrastructure, becomes a challenge.

In most cases, network administrators and/or other users of the datacenter will provide and/or configure the power infrastructure in the datacenter such that "full" performance of the server devices is enabled when that power infrastructure is "healthy" (i.e., there are no issues with that power infrastructure), but often do not properly ensure the operation of those server devices in the event of a power availability issue with the power infrastructure (e.g., when some of the power infrastructure fails, is "taken down" for maintenance, etc.) due to cost issues, power infrastructure availability, human error, and/or other reasons that would be apparent to one of skill in the art. As such, server devices in datacenters will often become unavailable in the event of power availability issues with the power infrastructure, which is particularly troublesome when the network administrator or other user of the datacenter has incorrectly configured the power infrastructure for the server devices in those server device racks such that they believe redundant power is available. For example, in the "Uptime's annual outage analysis 2022: The causes and impacts of data center outages" released by the Uptime Institute of New York City, New York, United States, power availability issues with power infrastructure were found to be the cause of 44% of the most recent impactful incident or outage with datacenters, with human error identified as playing a contributory factor in between 60-80% of those incidents or outages.

Accordingly, it would be desirable to provide a power management system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a power management engine that is configured to: identify power requirement information for each of the plurality of computing devices that are coupled to the processing system; identify power transmission limitation information for a plurality of power infrastructure components in a power infrastructure that couple the plurality of computing devices to at least one power source; determine a power infrastructure architecture that identifies how the power infrastructure components in the power infrastructure couple the plurality of computing devices to the at least one power source; generate, for each of the plurality of computing devices based on the power requirement information, the power transmission limitation information, and the power infrastructure architecture, a respective input current limit that is configured to maximize performance of that computing device while ensuring availability of the power infrastructure in the event of an unavailability of one or more of the power infrastructure components in the power infrastructure; and provide, to each of the plurality of computing devices, the respective input current limit that was generated for that computing device.

BRIEF DESCRIPTION OF THE DRAWINGS

FIG. 15A is a chart view illustrating an embodiment of an operating scenario for the networked system of FIG. 7.

FIG. 15B is a chart view illustrating an embodiment of an operating scenario for the networked system of FIG. 7.

FIG. 16A is a chart view illustrating an embodiment of an operating scenario for the networked system of FIG. 7.

FIG. 16B is a chart view illustrating an embodiment of an operating scenario for the networked system of FIG. 7.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
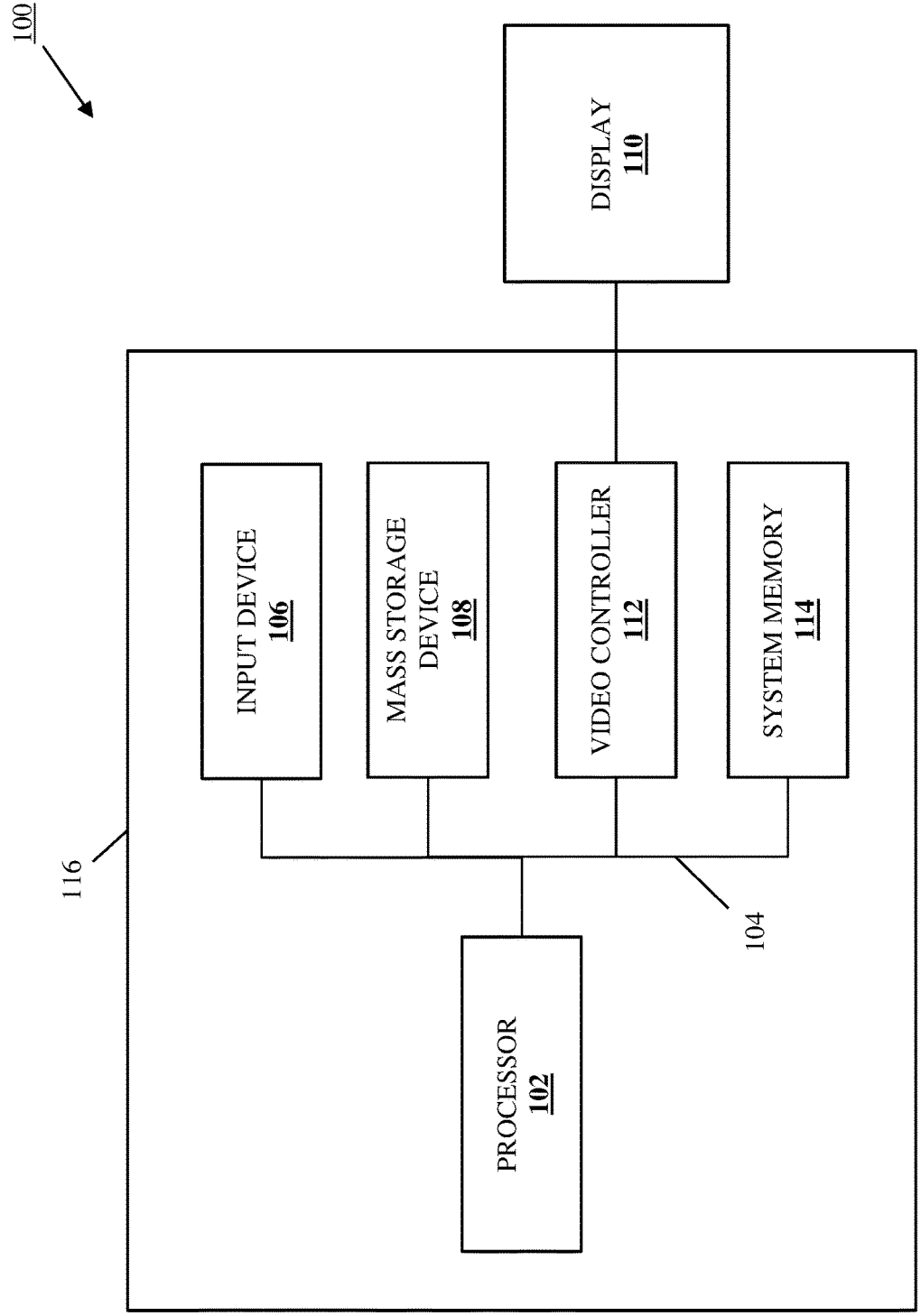
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
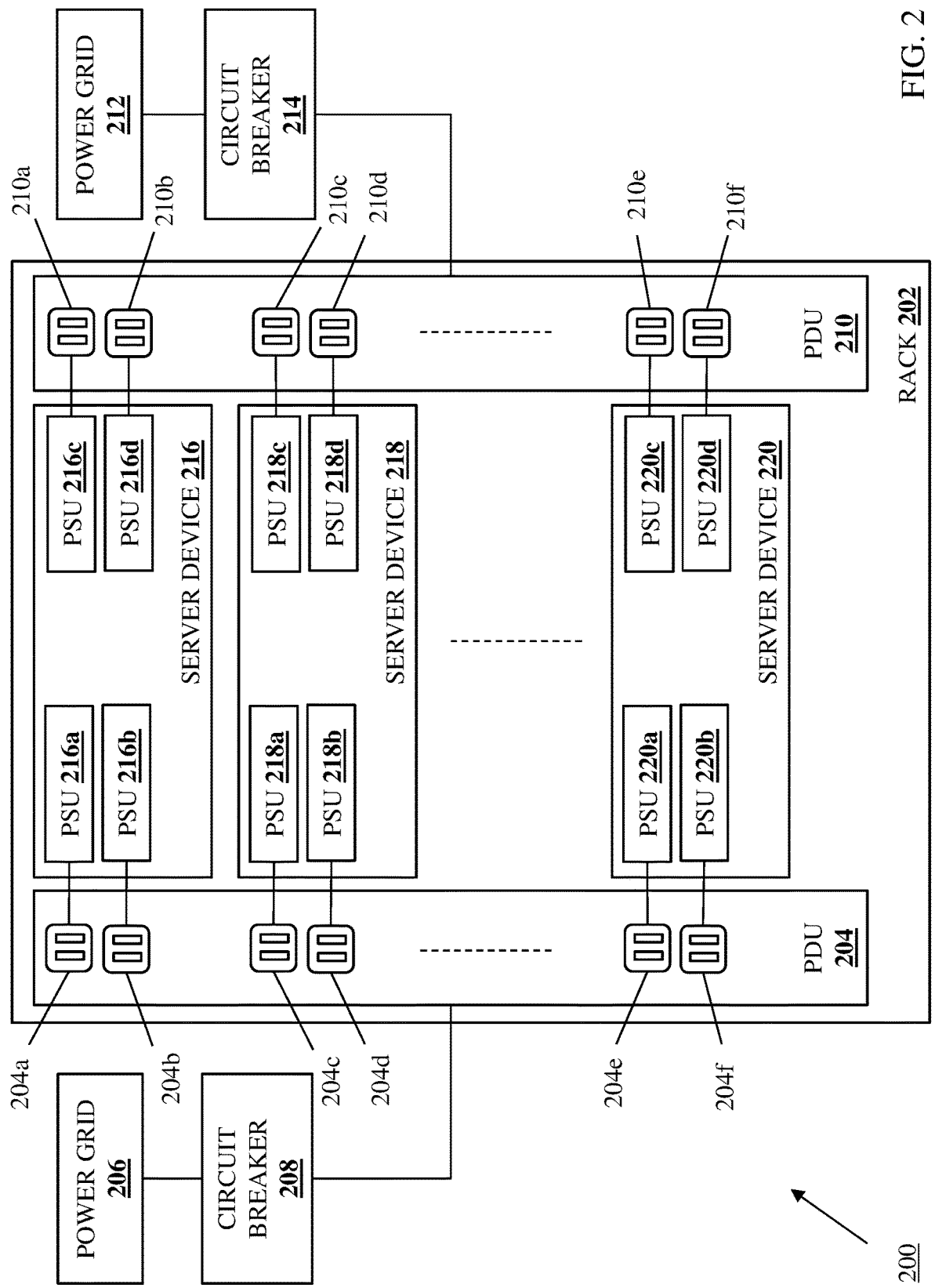
FIG. 2 is a schematic view illustrating an embodiment of a power management system according to the teachings of the present disclosure.

Referring now to FIG. 2, an embodiment of a power management system 200 according to the teachings of the present disclosure is illustrated. In the illustrated embodiment, the power management system 200 includes a rack 202 that, in the examples provided below, is a server rack that is used to house a plurality of server devices. However, in other embodiments, the rack 202 may be omitted, used to house other types of devices, and/or modified in a variety of manners that will be apparent to one of skill in the art in possession of the present disclosure. The rack 202 includes a power distribution unit (PDU) 204 that, in some of the examples discussed below, may also be referred to as a "first" PDU 204. The PDU 204 is coupled to a power grid 206 via a circuit breaker 208, each of which may be referred to below as a "first" power grid 206 and a "first" circuit breaker 208, respectively. The rack 202 also includes a PDU 210 that, in some of the examples discussed below, may also be referred to as a "second" PDU 210. The PDU 210 is coupled to a power grid 212 via a circuit breaker 214, each of which may be referred to below as a "second" power grid 212 and a "second" circuit breaker 214, respectively. As would be understood by one of skill in the art, the power grids 206 and 208 may be connected to a local power utility company, with each power grid 206 and 208 connected to national grid sectors via a separate transformer in order operate independently and ensure operation of at least one of the power grids should the other become unavailable. However, while a specific example has been described, one of skill in the art in possession of the present disclosure will recognize that a variety of datacenter power distribution technologies/architectures may be provided (e.g., with an Uninterruptible Power Supply (UPS) between the circuit breakers and the PDUs that may operate to provide line conditioning that ensures a clean power source for end devices, generators utilized in addition to (or in place of) a second power grid, an Automatic Transfer Switch (ATS), etc.) while remaining within the scope of the present disclosure as well. Furthermore, the circuit breakers 208 and 214 may be provided by automatically-operating electrical switches that are configured to protect electrical circuit(s), wiring, equipment, etc. connected to the power grids 206 and 212, respectively, from damage by excess current that may be drawn via the PDUs 204 and 210 by the power supply units in the server devices discussed below.

In the illustrated embodiment, the rack 202 includes a plurality of server devices 216, 218, and up to 220, any or all of which may be provided by the IHS 100 discussed above with reference to FIG. 1, and/or that may include any or all of the components of the IHS 100. As discussed above, while illustrated and described as server devices, one of skill in the art in possession of the present disclosure will recognize that the power management system of the present disclosure may be beneficial for a variety of devices (e.g., networking devices, storage devices, and/or other computing devices that would be apparent to one of skill in the art in possession of the present disclosure), and thus its application to those devices is envisioned as falling within the scope of the present disclosure as well. Each of the plurality of server device 216-220 includes a plurality of power supply units (PSUs) such as the PSUs 216a, 216b, 216c, and 216d included in the server device 216; the PSUs 218a, 218b, 218c, and 218d included in the server device 218; and the PSUs 220a, 220b, 220c, and 220d included in the server device 220. In the illustrated embodiment, the PSUs 216a and 216b in the server device 216 are connected the PDU 204 via its respective power connections 204a and 204b, the PSUs 218a and 218b in the server device 218 are connected the PDU 204 via its respective power connections 204c and 204d, and the PSUs 220a and 220b in the server device 220 are connected the PDU 204 via its respective power connections 204e and 204f.

Similarly, the PSUs 216c and 216d in the server device 216 are connected the PDU 210 via its respective power connections 210a and 210b, the PSUs 218c and 218d in the server device 218 are connected the PDU 210 via its respective power connections 210c and 210d, and the PSUs 220c and 220d in the server device 220 are connected the PDU 210 via its respective power connections 210e and 210f. While a specific power management system 200 is illustrated and described herein, one of skill in the art in possession of the present disclosure will recognize that a wide variety of modification to the power management system 200 illustrated in FIG. 2 will fall within the scope of the present disclosure well, including different numbers of power grids/circuit breakers/PDUs providing power to the server devices 216-220, different numbers of PSUs provided in the server devices 216-220, etc. In particular, while each server device 216-220 includes four PSUs in the illustrated embodiment, one of skill in the art in possession of the present disclosure will recognize that a vast majority of server devices utilize a two PSU system, with the PSUs provided in a 1+1 power grid redundant configuration, an such server devices will fall within the scope of the present disclosure as well.

Figure 3:
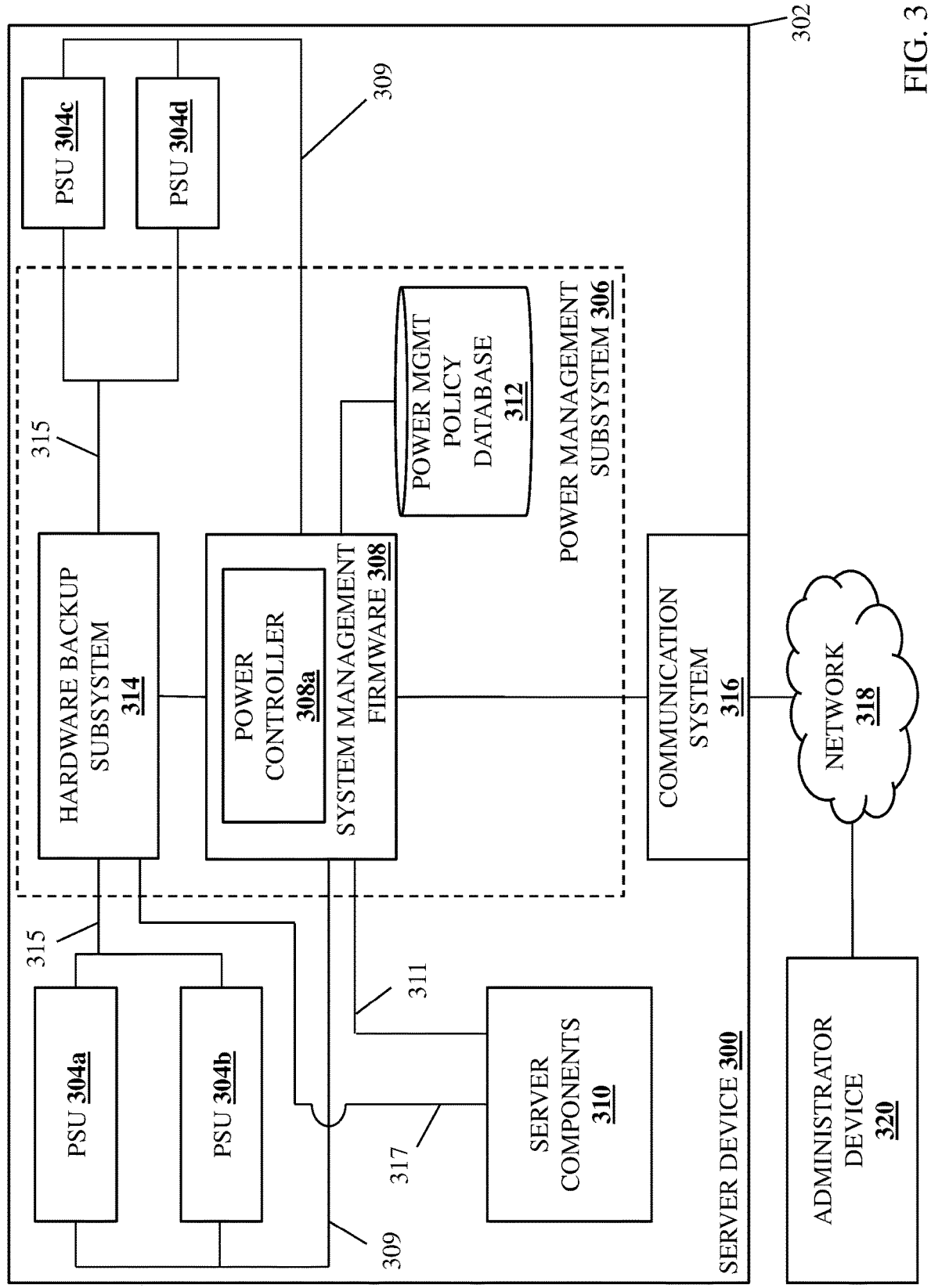
FIG. 3 is a schematic view illustrating an embodiment of a server device that may be utilized in the power management system of the present disclosure.

Referring now to FIG. 3, an embodiment of a server device 300 that may be utilized in the power management system of the present disclosure is illustrated. The server device 300 may be provided as any or all of the server devices 216-220 discussed above with reference to FIG. 2 and, as such, the server device 300 may be provided by the IHS 100 discussed above with reference to FIG. 1, and/or may include some or all of the components of the IHS 100. Furthermore, as also discussed above with regard to the server devices 216-220, the server device 300 may be replaced with networking devices, storage devices, and/or other computing devices while remaining within the scope of the present disclosure as well. In the illustrated embodiment, the server device 300 includes a chassis 302 that houses the components of the server device 300, only some of which are illustrated in FIG. 3. For example, in the illustrated embodiment, the chassis 302 houses PSUs 304a, 304b, 304c, and 304d, which in the examples below may correspond to the PSUs 216a, 216b, 216c, and 216d included in the server device 216, respectively; the PSUs 218a, 218b, 218c, and 218d included in the server device 218, respectively; and/or the PSUs 220a, 220b, 220c, and 220d included in the server device 220, respectively. As such, the PSUs 304a and 304b may be coupled to the power grid 206 via the circuit breaker 208, and the PSUs 340c and 304d may be coupled to the power grid 212 via the circuit breaker 214.

The chassis 302 also houses a power management subsystem 306 that, in the illustrated embodiment, includes system management firmware 308. For example, the system management firmware 308 may be provided on a Baseboard Management Controller (BMC) such as, for example, the integrated DELL® Remote Access Controller (iDRAC) available from DELL® Inc. of Round Rock, Texas, United States. However, one of skill in the art in possession of the present disclosure will recognize that other components may be utilized to provide the functionality of the system management firmware 308 and power management subsystem 306 discussed below while remaining within the scope of the present disclosure as well. In the examples discussed below, the system management firmware 308 is configured (e.g., via combinations of hardware and software) to provide a power controller 308a that performs the power management functionality discussed below (i.e., in addition to conventional system management firmware functionality performed by the system management firmware 306).

In the illustrated embodiment, the power controller 308a/system management firmware 308 is coupled to each of the PSUs 304a-304d via coupling(s) 309 between the system management firmware 308 and the PSUs 304a-304b, as well as to server components 310 that are housed in the chassis 302 via coupling(s) 311 between the system management firmware 308 and the server components 310. For example, the couplings 309 and/or 311 may be provided by one or more digital bus systems that would be apparent to one of skill in the art in possession of the present disclosure. In an embodiment, the server components 310 may include processing systems (not illustrated, but which may include the processor 102 discussed above with reference to FIG. 1), memory systems (not illustrated, but which may include the memory 114 discussed above with reference to FIG. 1), networking systems, and/or any other server components that would be apparent to one of skill in the art in possession of the present disclosure. The power controller 308a/system management firmware 308 is also coupled to a storage device (not illustrated, but which may include the storage device 108 discussed above with reference to FIG. 1) that is housed in the chassis 302 and that includes a power management policy database 312 that is configured to store any of the information utilized by the power management subsystem 306 (e.g., the power controller 308a/system management firmware 308) as described below.

In the illustrated embodiment, the power management subsystem 306 also includes a hardware backup subsystem 314 that is coupled to the power controller 308a/system management firmware 308. For example, the hardware backup subsystem 306 may be provided by a Complex Programmable Logic Device (CPLD) operating in conjunction with hardware in the PSUs 304a-204d and/or other components of the server device 300. However, one of skill in the art in possession of the present disclosure will recognize that other components may be utilized to provide the functionality of the system management firmware 308 and hardware backup subsystem 314 discussed below while remaining within the scope of the present disclosure as well. In the illustrated embodiment, the hardware backup subsystem 314 is coupled to each of the PSUs 304a-304d via coupling(s) 315 between the hardware backup subsystem 314 and the PSUs 304a-304b, as well as to the server components 310 via coupling(s) 317 between the hardware backup subsystem 314 and the server components.

The chassis 302 may also house a communication system 316 that is coupled to the power controller 308a/system management firmware 308 in the power management subsystem 206, and that may include a Network Interface Controller (NIC), a wireless communication subsystem (e.g., a BLUETOOTH® communication subsystem, a Near Field Communication (NFC) subsystem, a WiFi communication subsystem, etc.), and/or other wireless communication components that would be apparent to one of skill in the art in possession of the present disclosure. As illustrated, the communication system 316 may be coupled (e.g., via an Ethernet connection) to a network 318 that may be provided by a Local Area Network (LAN), the Internet, and/or other networks that would be apparent to one of skill in the art in possession of the present disclosure, and an administrator device 320 (e.g., a desktop computing device, a laptop/notebook computing device, a tablet computing device, a mobile phone, etc.) may be coupled to the network 318 as well to allow the communications between the administrator device 320 and the server device 300 discussed below. While a specific server device 300 has been illustrated and described, one of skill in the art in possession of the present disclosure will recognize that server devices may include a variety of components for providing conventional server device functionality, as well as the functionality described below, while remaining within the scope of the present disclosure as well.

Figure 4:
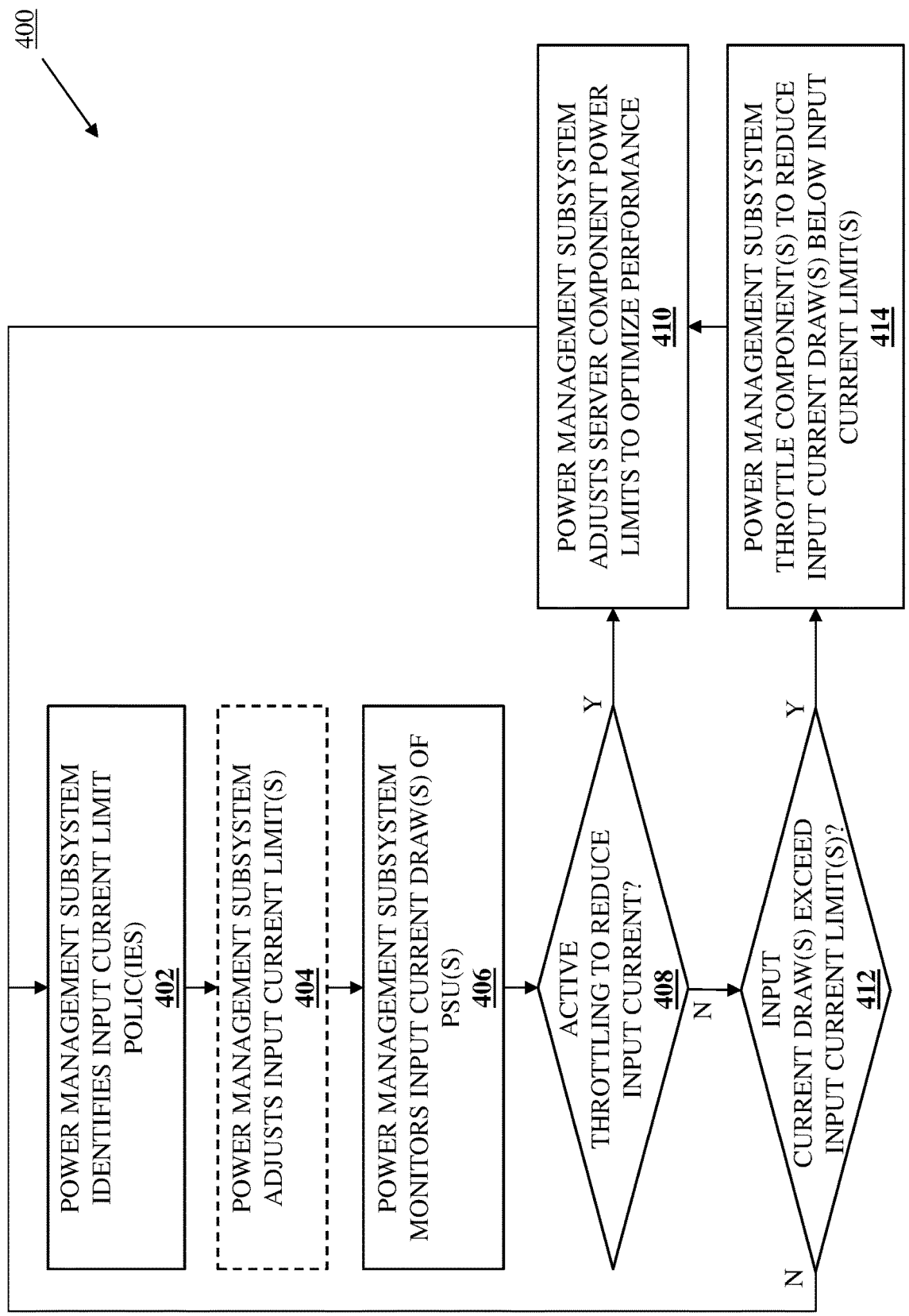
FIG. 4 is a flow chart illustrating an embodiment of a method for managing power.

Referring now to FIG. 4, an embodiment of a method 400 for managing power is illustrated. As discussed below, embodiments of the systems and methods of the present disclosure provide a firmware-based power controller that executes firmware-based power controller policies that allow the input current draw of power supply unit(s) in a server/system from the power grid to which they are coupled to be limited based on the respective circuit breaker through which they are coupled to that power grid, which allows those circuit breaker(s) to be sized for failover according to a total input current limit. Furthermore, if a particular sized circuit breaker couples the power supply unit(s) to a power grid, servers/systems may be coupled to the circuit breaker(s) as per the total input current limit. Further still, when the server/system includes different power supply units that are coupled to different power grids, the firmware-based power controller policies allow for different input current limits for power supply unit(s) in the server/system coupled to different power grid that may be based on the different sized circuit breaker used to couple the power supply units to those different power grids. Finally, a hardware-based subsystem may be provided to trigger server/system throttling when the firmware-based power controller is unavailable or unable to respond quickly enough, and may be configured to take over for the firmware-based power controller regardless of whether the firmware-based power controller is aware it is about to go offline due to a coming server/system reset.

In an embodiment, during or prior to the method 400, a mapping of power supply units to power grids may be provided and/or determined. For example, a mapping of the power supply units in any or all of the server devices 216-220 to the power grids 206 and 212 may be provided to the power controller 308a in each server device 300 by a user, or determined by the power controller 308a in each server device 300. In a specific example, power supply unit slots, which are included in the server devices and configured to receive the power supply units, may be statically mapped to the power grids to which they are connected via the PDUs and circuit breakers in, for example, a platform power budget table stored in a baseboard management controller such as the iDRAC available from DELL® Inc. of Round Rock, Texas, United States. Such mappings may be provided manually by an administrator or other user (e.g., via the administrator device 320 and through the network 318), or determined dynamically by the power controller 308a using techniques that would be apparent to one of skill in the art in possession of the present disclosure.

The method 400 begins at block 402 where a power management subsystem identifies one or more input current limit policies. In an embodiment, at block 402, the power controller 308a provided by the system management firmware 308 in the power management subsystem 306 may identify one or more input current limit policies. In some examples, one or more input current limit policies may be enabled or disabled by an administrator or other user through the network 318 via the administrator device 320. For example, FIGS. 5A, 5B, and 6 illustrate an administrator device 500 (which may be the administrator device 320 of FIG. 3) including a chassis 502 that houses a display subsystem 502, with that display subsystem 502 displaying graphical user interfaces that are configured to allow the administrator or other user to enable or disable input current limit policies and/or other power management policies that would be apparent to one of skill in the art in possession of the present disclosure.

Figure 5A:
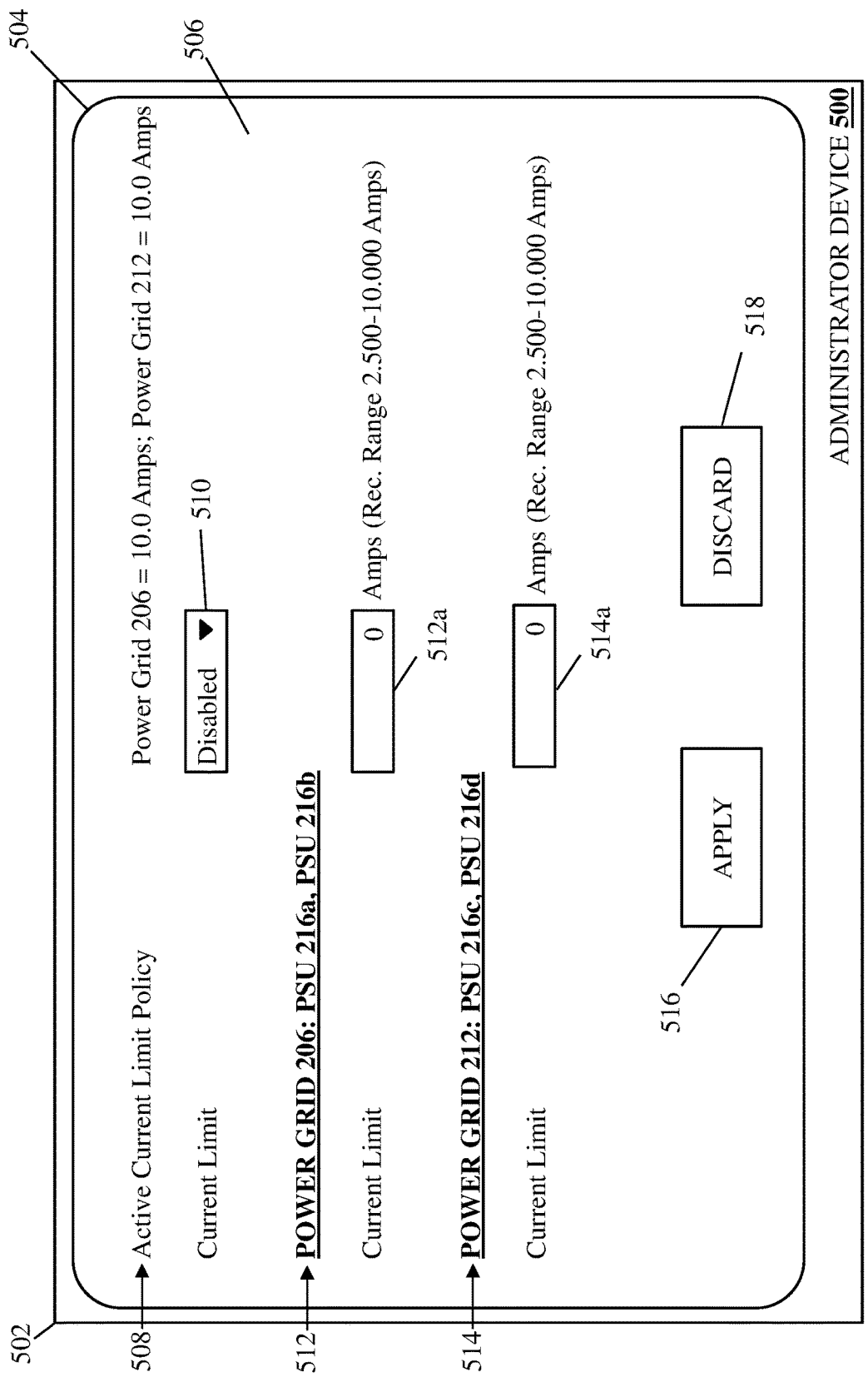
FIG. 5A is a screen shot illustrating an embodiment of a graphical user interface for setting a power management policy.
Figure 5B:
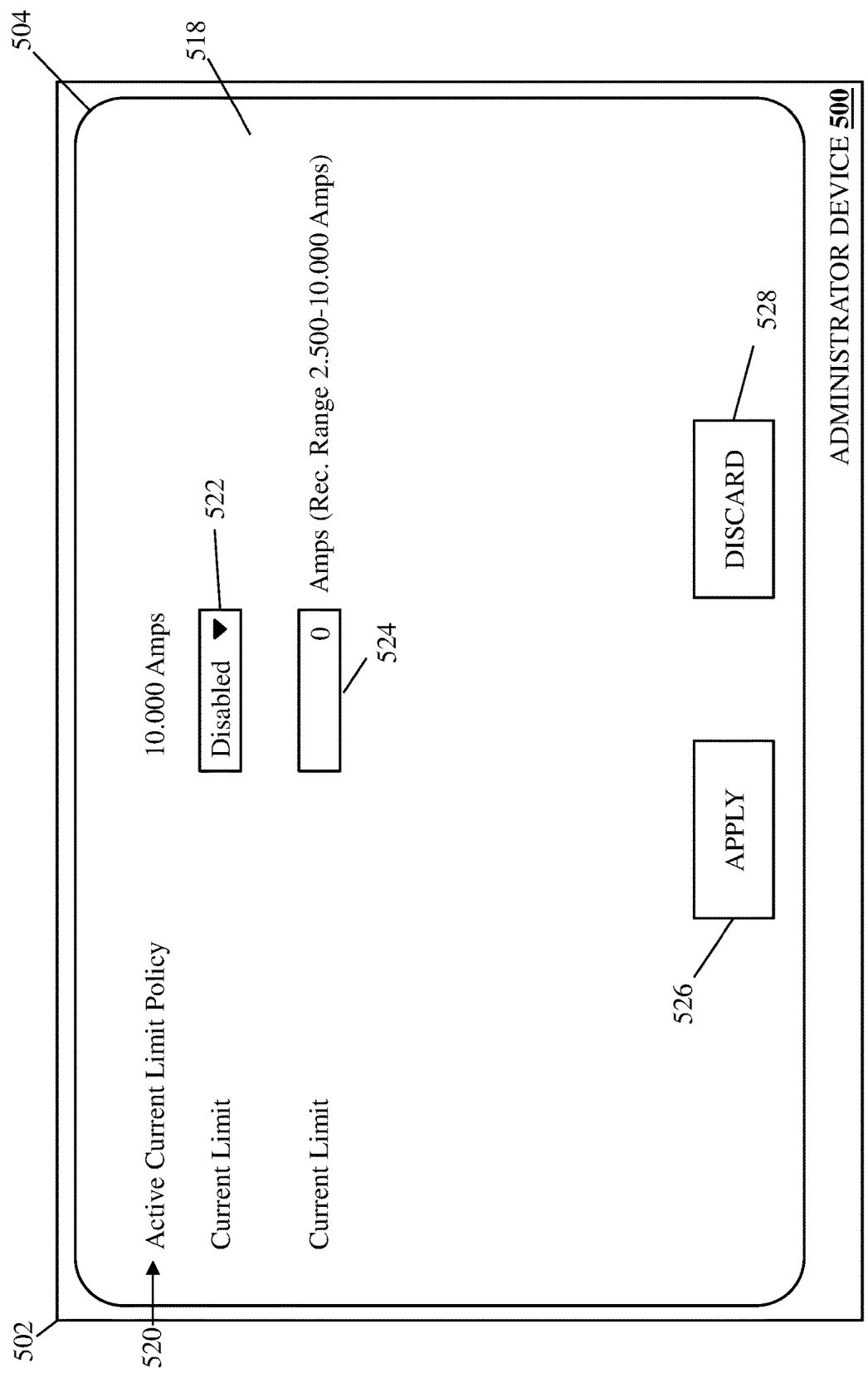
FIG. 5B is a screen shot illustrating an embodiment of a graphical user interface for setting a power management policy.
Figure 6:
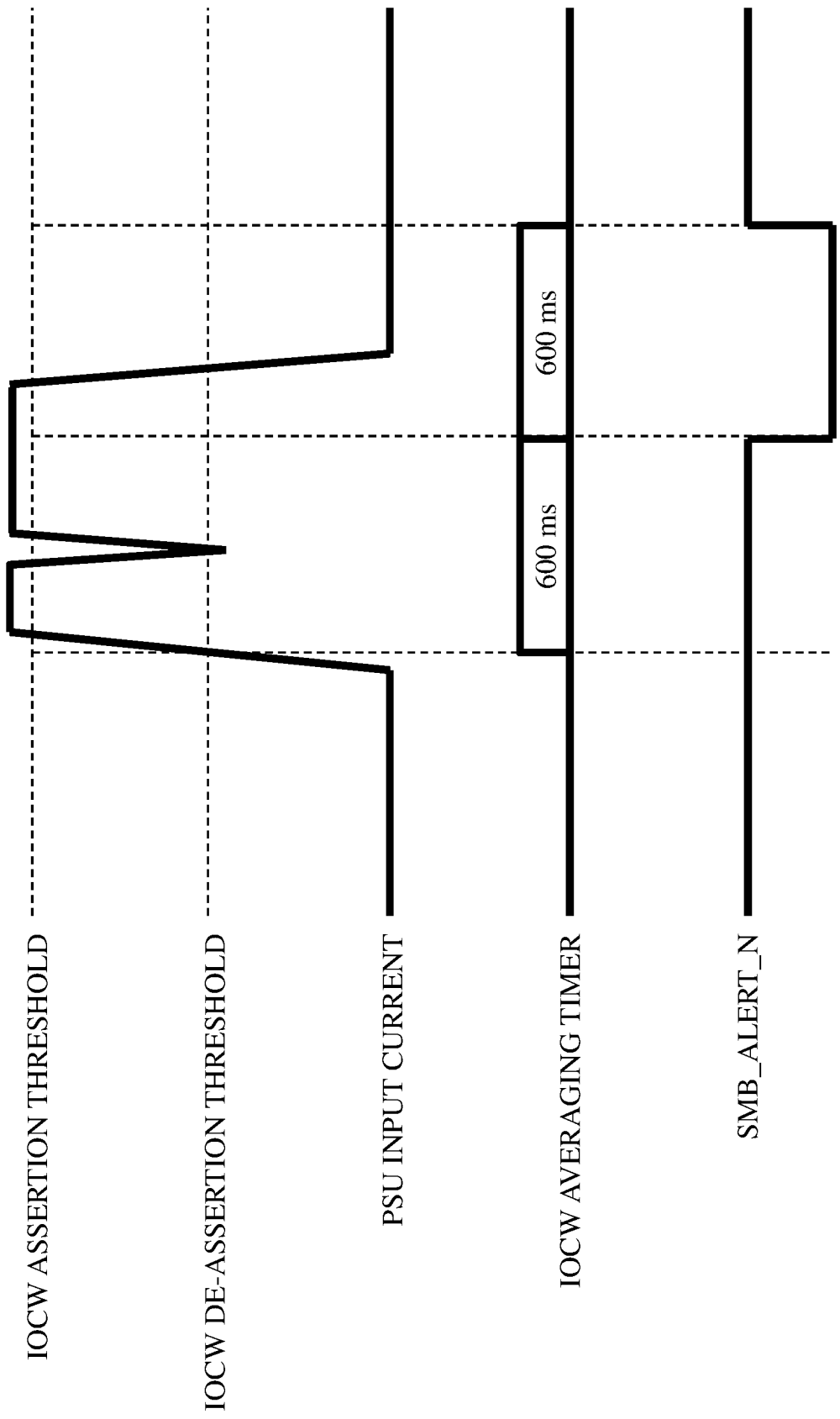
FIG. 6 is a chart illustrating an embodiment of power supply unit IOCW behavior and timing utilized by a hardware backup subsystem in the power management system of FIG. 2.

With reference to FIG. 5A, a power-grid-redundant graphical user interface 506 is illustrated as being displayed on the display subsystem 504 of the administrator device 500. For example, with reference to the server device 300 illustrated in FIG. 3, the power controller 308a provided by the system management firmware 308 included in the power management subsystem 306 may operate at block 402 to provide, via the communication system 316 and through the network 318 to the administrator device 320, information that is utilized by the administrator device 320 to display the power-grid-redundant graphical user interface 506. As such, any of the server devices 216, 218, and up to 220 may operate to provide a power-grid-redundant graphical user interface similar to the power-grid-redundant graphical user interface 506 illustrated in FIG. 5A for display on the administrator device 320 in response to, for example, a request by the administrator device 320 to provide or modify a power management policy for that server device.

As discussed below, the power-grid-redundant graphical user interface 506 may be displayed when the administrator device 500 is being used to provide a power management policy/input current limit policy for a server device (e.g., any of the server devices 216-220 in FIG. 2) that is coupled to multiple power grids (e.g., the power grids 206 and 212) in a "power-grid-redundant configuration". As would be understood by one of skill in the art in possession of the present disclosure, a server device may be coupled to multiple power grids in a power-grid-redundant configuration when the power supply units in that server device are sufficient to provide the server components in the server device with redundant power (i.e., a first subset of power supply units coupled to a first power grid are available to provide a power amount to the server device that is sufficient to allow a desired operating level for that server device, and a second subset of power supply units coupled to a second power grid are available to provide the power amount to the server device that is sufficient to allow the desired operating level for that server device in the event that the first subset of power supply units and/or their first power grid become unavailable.) As such, the server device 216 may be in a power-grid-redundant configuration when the power supply units 216a and 216b coupled to the power grid 206 via the circuit breaker 208 provide sufficient power to the server device 216 to allow for a desired operating level, and the power supply units 216c and 216d coupled to the power grid 212 via the circuit breaker 214 provide sufficient power to the server device 216 to allow for the desired operating level in the event the power supply units 216a and 216b and/or their power grid 206 become unavailable. One of skill in the art in possession of the present disclosure will recognize that the server devices 218 and 220 may be in a power-grid-redundant configuration based on their power supply units 218a-d and 220a-d, respectively, coupled to the power grids 206 and 212 in a similar manner as described above for the server device 216.

The power-grid-redundant graphical user interface 506 allows the administrator or other user to enable separate input current limits for each of the multiple power grids coupled to a server device, which may be based on the size of the respective circuit breakers 208 and 214 that couple the respective PDUs 204 and 210 to the respective power grids 206 and 212. In the embodiment illustrated in FIG. 5A, the power-grid-redundant graphical user interface 506 is provided to configure the power management policy/input current limit policy for the server device 216 in the power-grid-redundant configuration discussed above. As such, the power-grid-redundant graphical user interface 506 identifies an active current limit policy 508 that, in the illustrated example, limits the input current drawn from the power grid 206 and through the circuit breaker 208 to 10.0 amps, and limits the input current drawn from the power grid 212 and through the circuit breaker 214 to 10.0 amps. In addition, the power-grid-redundant graphical user interface 506 includes an input current limit activation box 510 that, in the illustrated embodiment, is set to "disabled", but which may be configured to provide a "drop-down" menu that allows the setting of "enable", "set—automatic", "set—manual", and/or any other power management policy setting that would be apparent to one of skill in the art in possession of the present disclosure. As such, with the input current limit activation box 510 set to "disabled" as illustrated, the input current limits of the present disclosure may not be applied to the server device 216, while if the input current limit activation box 510 is set to "enabled", the active current limit policy 508 (e.g., which limits the input current drawn from the power grid 206 and through the circuit breaker 208 to 10.0 amps, and limits the input current drawn from the power grid 212 and through the circuit breaker 214 to 10.0 amps) may be enabled and applied to the server device 216.

The power-grid-redundant graphical user interface 506 also identifies a first power grid section 512 that, in the illustrated embodiment, identifies the power grid 206 and the power supply units 216a and 216b in the server device 216 that are coupled to the power grid 206, as well as an input current limit box 512a that allows the administrator or other user to provide an input current limit that will operate to limit the input current drawn from the power grid 206 and through the circuit breaker 208 by the power supply units 216a and 216b. Similarly, the power-grid-redundant graphical user interface 506 identifies a second power grid section 514 that, in the illustrated embodiment, identifies the power grid 212 and the power supply units 216c and 216d in the server device 216 that are coupled to the power grid 212, as well as an input current limit box 514a that allows the administrator or other user to provide an input current limit that will operate to limit the input current drawn from the power grid 212 and through the circuit breaker 214 by the power supply units 216c and 216c. In the illustrated embodiment, the power-grid-redundant graphical user interface 506 identifies recommended input current limit ranges adjacent each of the input current limit boxes 512a and 514a (e.g., 2.500-10.000 amps). Finally, the power-grid-redundant graphical user interface 506 includes an apply button 516 and a discard button 518 that the administrator or other user may select to apply (or discard) any power management policy/input current limit defined using the power-grid-redundant graphical user interface 506.

In an embodiment, the setting of the input current limit activation box 510 to "set—automatic" may provide an instruction to the power controller 308a to automatically determine the input current limits that are associated with the power grids 206 and 212 and that are based on their associated current breakers 208 and 214, respectively. For example, in response to the administrator or other user setting the input current limit activation box 510 to "set—automatic", the power controller 308a may automatically determine, set, and display (e.g., via the input current limit boxes 512a and 514a) the input current limits associated with each of the power grids 206 and 212 based on, for example, the server device power budget for the server device 216, the maximum sustained workload for the server device 216, and/or any other information that would be apparent to one of skill in the art in possession of the present disclosure. Furthermore, in some examples, the "set—automatic" option for the input current limit activation box 510 may be expanded to address multiple operations based on a plurality of pre-characterized workloads that are to-be provided on the server device 216.

In another embodiment, the setting of the input current limit activation box 510 to "set—manual" may allow the administrator or other user to provide instructions to the power controller 308a to set the input current limits that are associated with the power grids 206 and 212 and that are based on their associated current breakers 208 and 214, respectively. For example, in response to the administrator or other user setting the input current limit activation box 510 to "set—manual", the administrator or other user may provide values in the input current limit boxes 512a and 514a to set the input current limits associated with each of the power grids 206 and 212 based on, for example, the capabilities of the power grids 206 and 212, the size of the circuit breakers 208 and 214, and/or any other information that would be apparent to one of skill in the art in possession of the present disclosure. In particular embodiments, the input current limits provided in the input current limit boxes 512a and 514a may be different (e.g., 5.0 amps and 10.0 amps, respectively) based on, for example, the different sizes of the circuit breakers 208 and 214, respectively, the different capabilities of the power grids 206 and 212, etc. While the provisioning of input current limits for a pair of power grids (i.e., the power grids 206 and 212) that is based on the sizes of their respective circuit breakers (i.e., the circuit breakers 208 and 214) has been described, one of skill in the art in possession of the present disclosure will recognize that input current limits associated with additional power grids and their respective circuit breakers will fall within the scope of the present disclosure as well.

With reference to FIG. 5B, a non-power-grid-redundant graphical user interface 518 is illustrated as being displayed on the display subsystem 504 of the administrator device 500. For example, with reference to the server device 300 illustrated in FIG. 3, the power controller 308a provided by the system management firmware 308 included in the power management subsystem 306 may operate at block 402 to provide, via the communication system 316 and through the network 318 to the administrator device 500, information that is utilized by the administrator device 500 to display the non-power-grid-redundant graphical user interface 518. As such, any of the server devices 216, 218, and up to 220 may operate to provide a non-power-grid-redundant graphical user interface similar to the non-power-grid-redundant graphical user interface illustrated in FIG. 5B for display on the administrator device 500 in response to, for example, a request by the administrator device 500 to provide or modify a power management policy for that server device.

As discussed below, the non-power-grid-redundant graphical user interface 518 may be displayed when the administrator device 500 is being used to provide a power management policy/input current limit policy for a server device (e.g., any of the server devices 216-220 in FIG. 2) that is coupled to one or more power grids (e.g., the power grids 206 and/or 212) in a "non-power-grid-redundant configuration". As would be understood by one of skill in the art in possession of the present disclosure, a server device may be coupled to one or more power grids in a non-power-grid-redundant configuration when the power supply units in that server device are not sufficient to provide the server components in the server device with redundant power (i.e., the power supply units include a first subset of power supply units that are coupled to the power grid(s) and that are available to provide a power amount to the server device that is sufficient to allow a desired operating level for that server device, but do not include a second subset of power supply units that are available to provide the power amount to the server device that is sufficient to allow the desired operating level for that server device in the event that the first subset of power supply units and/or a power grid become unavailable).

As such, the server device 216 may be in a non-power-grid-redundant configuration when the power supply units 216a, 216b, 216c, and/or 216d coupled to the power grids 206 and 208 via the circuit breakers 208 and 214 provide sufficient power to the server device 216 to allow for a desired operating level (e.g., the power supply units 216a-c may be utilized to provide that sufficient power), but do not include power supply units that can provide sufficient power to the server device 216 to allow for the desired operating level in the event the power supply units 216a, 216b, 216c, and/or 216d and/or their power grids 206 and 212 become unavailable (e.g., the power supply unit 216d cannot provide sufficient power in the event the power supply units 216a-c become unavailable). One of skill in the art in possession of the present disclosure will recognize that the server devices 218 and 220 may be in a non-power-grid-redundant configuration based on the power supply units 218a-d and 220a-d, respectively, coupled to the power grids 206 and/or 212 in a similar manner as described above for the server device 216.

The non-power-grid-redundant graphical user interface 518 allows the administrator or other user to enable a single input current limit for the multiple power grids coupled to a server device (or for a single power grid coupled to the server device, not illustrated). In the embodiment illustrated in FIG. 5B, the non-power-grid-redundant graphical user interface 518 is provided to configure the power management policy/input current limit policy for the server device 216 in the non-power-grid-redundant configuration discussed above. As such, the non-power-grid-redundant graphical user interface 518 identifies an active current limit policy 520 that, in the illustrated example, limits the input current drawn from the power grids 206 and 212 and through their respective circuit breakers 208 and 214 to 10.000 amps. In addition, the non-power-grid-redundant graphical user interface 518 includes an input current limit activation box 522 that in the illustrated embodiment is set to "disabled", but which may be configured to provide a "drop-down" menu that allows the setting of "enable", "set—automatic", "set—manual", and/or any other power management policy setting that would be apparent to one of skill in the art in possession of the present disclosure. As such, with the input current limit activation box 522 set to "disabled" as illustrated, the input current limits of the present disclosure may not be applied to the server device 216, while if the input current limit activation box 522 is set to "enabled", the active current limit policy 520 (e.g., which limits the input current drawn from the power grids 206 and 212 and through their respective circuit breakers 208 and 214 to 10.0 amps) may be enabled and applied to the server device 216.

The non-power-grid-redundant graphical user interface 518 also includes an input current limit box 524 that allows the administrator or other user to provide an input current limit that will operate to limit the input current drawn from the power grids 206 and 212 and through their respective circuit breakers 208 and 214 by the power supply units 216a-216d. In the illustrated embodiment, the non-power-grid-redundant graphical user interface 518 identifies a recommended input current limit range adjacent the input current limit box 524 (e.g., 2.500-10.000 amps). Finally, the non-power-grid-redundant graphical user interface 518 includes an apply button 526 and a discard button 528 that the administrator or other user may select to apply (or discard) any power management policy/input current limit defined using the non-power-grid-redundant graphical user interface 518.

In an embodiment, the setting of the input current limit activation box 522 to "set—automatic" may provide an instruction to the power controller 308a to automatically determine the input current limit that is associated with the power grids 206 and 212 and that are based on their associated current breakers 208 and 214, respectively. For example, in response to the administrator or other user setting the input current limit activation box 522 to "set—automatic", the power controller 308a may automatically determine, set, and display (e.g., via the input current limit box 524) the input current limit associated with each of the power grids 206 and 212 based on, for example, the server device power budget for the server device 216, the maximum sustained workload for the server device 216, and/or any other information that would be apparent to one of skill in the art in possession of the present disclosure. Furthermore, in some examples, the "set—automatic" option for the input current limit activation box 522 may be expanded to address multiple operations based on a plurality of pre-characterized workloads that are to-be provided on the server device 216.

In another embodiment, the setting of the input current limit activation box 522 to "set—manual" may allow the administrator or other user to provide instructions to the power controller 308a to set the input current limit that is associated with the power grids 206 and 212 and that are based on their associated current breakers 208 and 214, respectively. For example, in response to the administrator or other user setting the input current limit activation box 522 to "set—manual", the administrator or other user may provide a value in the input current limit box 524 to set the input current limit associated with each of the power grids 206 and 212 based on, for example, the capabilities of the power grids 206 and 212, the size of the circuit breakers 208 and 214, and/or any other information that would be apparent to one of skill in the art in possession of the present disclosure. While a variety of specific examples of the power management subsystem identifying input current limit polic(ies) for a server device have been illustrated and described, one of skill in the art in possession of the present disclosure will recognize that the input current limit policies may be identified in a variety of manner that will remain within the scope of the present disclosure.

The first pseudo code below provides a specific example of how an input current limit may be determined for one or more power grids by any particular server device:

```
// Initialization - Determine which PSU(s) are associated with each input
line
If ( CurrentCapPolicyEnable ) {
  If ( !GridRedundantCfg ) { // single grid or input line
    For each installed PSU {
      PsuConvertedInputCurrent[i] = PsuOutputPower[i] /
      PsuEfficiency[i] / LineInputVoltage
    }
    PsuConvertedInputCurrent = sum ( all
    PsuConvertedInputCurrent[i] )
    PsuInputCurrent = sum( all installed PSUs input current )
```

-continued

```
    DerivedPsuInputCurrent = max( PsuInputCurrent,
    PsuConvertedInputCurrent )
    OverLimit = max (0,
      ( DerivedPsuInputCurrent − CurrentLimit ) *
      PsuInputVoltage * PsuEfficiency ) // in Watts
  } else // grid redundant config
    HighestOverCurrent = 0 // initialize
    for each grid { // Index i
      for each installed PSU within grid { // Index j
        PsuConvertedInputCurrent[j] = PsuOutputPower[j] /
        PsuEfficiency[j] / GridInputVoltage[i]
      }
      Grid ConvertedInputCurrent[i] = sum ( all
      PsuConvertedInputCurrent[j] )
      GridInputCurrent[i] = sum ( all installed PSUs input current on
      this grid )
      DerivedGridInputCurrent[i] = max( GridInputCurrent[i],
      GridConvertedInputCurrent[i] )
      // CurrentLimit[i] is per grid
      If( HighestOverCurrent < ( DerivedGridInputCurrent[i] −
        CurrentLimit[i] )){
          HighestOverCurrent = ( DerivedGridInputCurrent[i] −
          CurrentLimit[i] )
          HighestGrid = j
      }
    }
    // Num ActivePsu is total number of currently active PSUs
    // NumActivePsuInGrid[ ] is total within each grid
    OverLimit = max( 0, HighestOverCurrent *
      ( NumActivePsu / NumActivePsuInGrid[ HighestGrid ] ) *
      GridInputVoltage[ HighestGrid ] * PsuEfficiency *
VrEfficiency ) // in Watts
  }
}
```

While one of skill in the art in possession of the present disclosure will recognize that the first pseudo code above provides a specific example of code that is written as a single input current limit policy, but that code providing multiple, separate input current limit policies will fall within the scope of the present disclosure as well (e.g., one for each power grid, and each with its own current limit).

As discussed below, the power controller 308a may operate to determine whether to throttle its server device based on a total power supply unit input current draw for each power grid coupled to that server device—if the total input current exceeds the input current limit (e.g., "OverLimit" in the first pseudo code above), the power controller 308a will throttle one or more of the server components 310. In some embodiments, due to stored energy in the power supply units, there may be a lag from when the server device load is seen at a power supply unit output (i.e., the output of the power supply unit to the server components 310/power controller 308a) until it is seen at the power supply unit input (i.e., the input to the power supply unit from the power distribution unit/power grid). As such, to avoid tripping the circuit breaker provided for the power grid, the power controller 308a may monitor the output of the power supply units, and convert that output via calculation to determine the input current draw of those power supply units, and then throttle based on the larger of the converted input current draws and the actual input current draws (as identified in the first pseudo code above).

As illustrated in FIGS. 5A and 5B, graphical user interfaces may be provided to assist administrators or other users in determining the appropriate input current limits for the power management system 200 by providing recommended input current ranges that may be determined based on, for example, valid power supply unit Over Current Warning (OCW) ranges, system worst-case max-throttled power budgets (e.g., via Node manager Lower Boundary (NLB)), and system maximum sustained power budgets (e.g., based on thermal limits via Thermal Design Power (TDP)). In a specific example, given the NLB and TDP discussed above, second pseudo code for determining recommended input current limit ranges may include:

```
// PsuInputOCWMin = minimum of PSU input OCW supported range
// PsuInputOCWMax = maximum of PSU input OCW supported range
// SystemNLBAsInputCurrent = system NLB budget converted to PSU
input current
// SystemTDP AsInputCurrent = system TDP budget converted to PSU
input current
If( !GridRedundantCfg ) {
  UserCurretnCapMin = 0 // initialize
  UserCurrentCapMax = 0 // inititalize
  for each good PSU {
    UserCurrentCapMin = UserCurrentCapMin + PsuInputOCWMin[i]
    UserCurrentCapMax = UserCurrentCapMax + PsuInputOCWMax[i]
  }
  UserCurrentCapMin =max( UserCurrentCapMin,
    SystemNLBAsInputCurrent )
  UserCurrentCapMax = min( UserCurrentCapMax,
    SystemTDPAsInputCurrent )
} else { // GridRedundantCfg
  If( (1+1) Grid Redundant ) {
    For each grid { // Index i
      UserCurrentCapMin[i] = max( PsuInputOCWMin,
      SystemNLBAsInputCurrent )
      UserCurrentCapMax[i] = min(PsuInputOCWMax,
      SystemTDPAsInputCurrent )
    }
  } else { // >(1+1) grid redundant
    For each grid { // Inex i
      UserCurrentCapMax[i] = 0 // initialize
      for each installed PSU within grid { // Index j
        UserCurrentCapMax[i] = UserCurrentCapMax[i] +
        PsuInputOXWMax[j]
      }
      If ( (UserCurrentCapMax[i] / 2 )> UserDefinedCurrentLiit[i] ) {
        Suggest to use to remove extraneous PSUs or turn them
        (cold-sparing)
      }
      UserCurretnCapMin[i] = max( (UserCurrentCapMax[i] / 2),
      SystemNLBAsInputCurrent )
      UserCurrentCapMax[i] = min( UserCurretnCapMax[i],
      System TDP AsInputCurrent )
    }
  }
}
```

As discussed below, on subsequent iterations of the method 400, block 402 may be followed by optional block 404 where the power management subsystem adjusts input current limit(s) in order to reduce the amount of power being stranded by the server devices. However, on the initial iteration of the method 400, optional block 404 may be skipped. As such, on the initial iteration of the method 400, block 402 is followed by block 406 where the power management subsystem monitors one or more input current draws of respective power supply unit(s). In an embodiment, at block 406, the power controller 308a provided by the system management firmware 308 included in the power management subsystem 306 operates to monitor the input current draw of the power supply units 304a, 304b, 304c, and 304d.

The method 400 then proceeds to decision block 408 where it is determined whether active throttling is being performed to reduce input current. In an embodiment, at decision block 408, the power controller 308a provided by the system management firmware 308 included in the power management subsystem 306 operates to determine whether the power management subsystem 306 is operating to actively throttle any of the server components 310 in order to reduce the amount of input current being drawn by those server components from the PSUs 304a, 304b, 304c, and/or 304d. For example, the power controller 308a may monitor processing systems, memory systems, and/or any of the other server components 310 in order to determine whether those server component(s) 310 are being actively throttled to reduce the input current draw on the PSUs 304a-304c in the server device 300. If, at decision block 408, it is determined that at least one of the server components 310 is being actively throttled to reduce the input current draw on the PSUs 304a-304c, the method 400 may proceed to block 410 where the power management subsystem 308 adjusts server component power limits to optimize performance. In an embodiment, at block 410, the power controller 308a provided by the system management firmware 308 included in the power management subsystem 306 may operate to adjust the power limits of any of the server component(s) 310 in order to optimize their performance (e.g., based on the active throttling of those or other server components 310). For example, at block 410, the power controller 308a may operate to adjust the power limits of a processing system in the server device 300 based on the active throttling of that processing system.

If, at decision block 408, it is determined that none of the server components 310 is being actively throttled to reduce the input current draw on the PSUs 304a-304c, the method 400 then proceeds to decision block 412 where it is determined whether the input current draw(s) of the power supply unit(s) exceed input current limit(s). In an embodiment, at decision block 412, the power controller 308a provided by the system management firmware 308 included in the power management subsystem 306 operates to determine whether the input current draw of the power supply units 304a, 304b, 304c, and 304d exceeds the input current limit(s) identified at block 402. For example, at decision block 412 and in embodiments in which the server device 216 is in the power-grid-redundant configuration, the power controller 308a in the server device 300/216 may determine whether the input current draw of the power supply units 216a and 216b exceed the input current limit set for the power grid 206/circuit breaker 208, and whether the input current draw of the power supply units 216c and 216d exceed the input current limit set for the power grid 212/circuit breaker 214. In another example, at decision block 412 and in embodiments in which the server device 216 is in the non-power-grid-redundant configuration, the power controller 308a in the server device 300/216 may determine whether the input current draw of the power supply units 216a, 216b, 216c, and/or 216b exceeds the input current limit set for the power grids 206 and 212/circuit breakers 208 and 214.

If, at decision block 412, it is determined that the input current draw(s) of the power supply unit(s) do not exceed input current limit(s), the method 400 returns to block 402 where the power management subsystem may identify new input current limit polic(ies), and/or continue to monitor the input current draw(s) of the power supply unit(s). As such, following the identification of the input current limit polic(ies) at block 402, the method 400 may loop through blocks 402 and 404 and decision block 406 to update any input current limit policies (if available), and monitor the input current draw(s) of the power supply unit(s) as long as the input current draw(s) of the power supply unit(s) do not exceed the input current limit(s).

If, at decision block 412, it is determined that the input current draw(s) of the power supply unit(s) exceed input current limit(s), the method 400 proceeds to block 414 where the power management subsystem throttles component(s) to reduce the input current draw(s) of the power supply unit(s) below the input current limit(s). In an embodiment, at block 414, the power controller 308a provided by the system management firmware 308 included in the power management subsystem 306 operates to throttle one or more of the server components 310 to reduce the input current draws of the power supply units 304a, 304b, 304c, and/or 304d below the input current limits. For example, at block 414 and in embodiments in which the server device 216 is in the power-grid-redundant configuration, the power controller 308a in the server device 300/216 may throttle one or more of the server components 310 to reduce the input current draw of the power supply units 216a and 216b below the input current limit set for the power grid 206/circuit breaker 208, and reduce the input current draw of the power supply units 216c and 216d below the input current limit set for the power grid 212/circuit breaker 214. In another example, at block 414 and in embodiments in which the server device 216 is in the non-power-grid-redundant configuration, the power controller 308a in the server device 300/216 may operate to reduce the input current draw of the power supply units 216a, 216b, 216c, and/or 216b below the input current limit set for the power grids 206 and 212/circuit breakers 208 and 214.

In examples in which a server device is in the power-grid-redundant configuration discussed above, the amount to throttle the server component(s) 310 may be based on the highest "OverLimit" of the power grids (as detailed in the first pseudo code above), and may also be multiplied by the ratio of the number of total active power supply units to the total number of active power supply units within a power grid. This allows for power supply unit failure when more than two power supply units are involved. For example, consider a Central Processing Unit (CPU) as the server component 310 that is throttled at block 410, with the server device 216 of FIG. 2 in a power-grid-redundant configuration with the power supply units 216a and 216b coupled to the power grid 206, and the power supply units 216c and 216d coupled to the power grid 212. If the power supply unit 216d becomes unavailable, power grid redundancy will be lost, with the power grid 206 coupled to active power supply units 216a and 216b, and the power grid 212 coupled to the active power supply unit 216c and the unavailable power supply unit 216d.

In the event power grid 206 is determined to have the highest amount of current to reduce, in order to effectively lower the current drawn from the power grid 206 and through the circuit breaker 208 by 1 amp, the amount of CPU power to reduce is multiplied by the number of total active power supply units (3—the power supply units 216a, 216b, and 216) divided by the total number of active power supply units within the grid (2—the power supply units 216a and 216b), and the amount of CPU power will be reduced by a multiple of 1.5 (i.e., 1.5 amps). Similarly, in the event power grid 212 is determined to have the highest amount of current to reduce, in order to effectively lower the current drawn from the power grid 212 through the circuit breaker 314 by 1 amp, the amount of CPU power to reduce is multiplied by the number of total active power supply units (3—the power supply units 216a, 216b, and 216c) divided by the total number of active power supply units within the grid (1—the power supply unit 216c), and the amount of CPU power will be reduced by a multiple of 3 (i.e., 3 amps).

In another example, consider a CPU as the server component 310 that is throttled at block 410, with the server device 216 of FIG. 2 in a power-grid-redundant configuration with the power supply units 216a and 216b coupled to the power grid 206, and the power supply units 216c and 216d coupled to the power grid 212. If the power grid 212 becomes unavailable, power grid redundancy will be lost, with the power grid 206 coupled to active power supply units 216a and 216b, and the power supply units 216c and 216d coupled to the unavailable power grid 212. In order to effectively lower the current drawn from the power grid 206 and through the circuit breaker 208 by 1 amp, the amount of CPU power to reduce is multiplied by the number of total active power supply units (2—the power supply units 216a and 216b) divided by the total number of active power supply units within the grid (2—the power supply units 216a and 216b), and the amount of CPU power will be reduced by a multiple of 1 (i.e., 1 amp).

Furthermore, as detailed in the first pseudo code above, with system throttling typically performed at the CPUs via CPU power limiting, "OverLimit" may be converted to power to reduce in watts, with the inclusion of PSU and VR efficiency where appropriate/needed. As would be understood by one of skill in the art in possession of the present disclosure, various algorithms exist to manage system power by managing subsystem power, and those algorithms may be implemented while remaining within the scope of the present disclosure.

The method 400 may then proceed to block 410 where the power management system adjusts server component power limits to optimize performance in substantially the same manner as described above, and then may begin subsequent iterations in which block 410 is followed by block 402 where the power management subsystem may operate to again identify input current limit polic(ies). In an embodiment, following the throttling of component(s) at block 414 to reduce input current draw(s) of power supply unit(s) below the input current limit(s) and the adjustment of server component power limits to optimize performance at block 410, at blocks 402 and 404, the power controller 308 may operates to re-determine/adjust the input current limit(s) to reduce a current draw difference between the input current limit(s) and a throttled current draw that results when the at least one server component is throttled. For example, the power controller may periodically determine "OverLimit" (described in the first pseudo code above), and then apply needed system throttling to get the input current draw just below that input current limit, and once the total input current draw of the power supply units is below the input current limit, server components will be throttled at a level such that the current draw difference between the input current limit(s) and a throttled current draw stays just below the input current limits (with care to avoid exceeding those input current limits with added hysteresis).

For example, in a non-power-grid-redundant configuration, the current draw difference ("RaiseLimit") may be reduced via the third pseudo code below:

```
RaiseLimit = min( 0,
  (( CurrentLimit – DerivedPsuInputCurrent ) * PsuInputVoltage –
  Hysteresis ) * Psu Efficiency * VrEfficiency ) // in Watts
```

In another example, in a power-grid-redundant configuration, the current draw difference ("RaiseLimit") may be based on the minimum of the power grids ("LowestRaiseCurrent"), and may be determined by the fourth pseudo code below:

```
LowestRaiseCurrent = 0xFFFF // initialize to a large positive value for
each grid { // index i
  // UserDefinedCurrentLimit[i] is per grid
  If( LowestRaiseCurrent > ( CurrentLimit[i] –
  DerivedGridInputCurrent[i] )) {
```

-continued

```
    LowestRaiseCurrent = ( CurrentLimit[i] –
    DerivedGridInputCurrent[i] )
    LowestGrid = i
  }
RaiseLimit = min( 0,
  ( LowestRaiseCurrent * ( NumActivePsu / NumActivePsuInGrid[
  LowestGrid ] )* GridInputVoltage[ LowestGrid ] – Hysteresis ) *
  PsuEfficiency * VrEfficiency ) // in Watts
```

For the purposes of the discussion below, "hot sparing" may be utilized to refer to a power system feature in which PSUs connected to a redundant power grid are configured to be placed in a sleep state in order to consolidate the power load of their server device in the active PSUs in that server device. Such functionality may be activated in relatively light power load conditions in order to improve the operating efficiency of the PSUs, which reduces power consumption and associated operating costs. As such, the PSUs in the server device may go in and out of sleep states based on their load, which may be monitored by those PSUs internally. In some embodiments, hot sparing may be enabled for the power management subsystem 200 and configured to provide a backup power grid (e.g., the power grid 212) that does not provide power to the server devices 216-220 unless a primary power grid (e.g., the power grid 206) becomes unavailable. In such situations, during normal operation, the power controllers 308a in the power management subsystems 206 may only enforce the input current limit for the primary power grid 206, as no load will be measured for the backup power grid 212. However, when the primary power grid 206 becomes unavailable, hot sparing operations may be performed to "wake up" the backup power grid 212 to supply power to the server devices 216-220, and the power controllers 308a in the power management subsystems 206 would then enforce the input current limits on the backup power grid 212, as no load will be measured for the unavailable primary power grid 212.

In some embodiments, the power management system 200 may be expanded to support per-power-supply-unit input current limits rather than per-power-grid input current limits, which may be particularly beneficial to protect power input cords, power distribution unit plugs, and/or other power supply unit components that would be apparent to one of skill in the art in possession of the present disclosure. Furthermore, one of skill in the art in possession of the present disclosure will recognize that such embodiments may also be useful to provide a power supply unit fault tolerant redundant mode.

In some embodiments, datacenter-level management systems may be coupled to the power management system and configured to access the per-power-grid input current limits, sum those per-power-grid input current limits, and check those per-power-grid input current limit sums against the PDUs (e.g., the PDUs 204 and 206 in FIG. 2) as well as the sizes of the circuit breakers (e.g., the circuit breakers 208 and 214) in order to determine whether proper connections and/or configurations have been provided. Such functionality allows the datacenter-level management systems to alert an administrator or other user (e.g., of the administrator device 320) when the configuration of the power management system 200 is wrong, inefficient, and/or could otherwise be improved.

One of skill in the art in possession of the present disclosure will recognize how conventional power management systems may support multiple power limiting policies that are managed concurrently by the power management system, and that the input current limits/policies of the present disclosure may be managed concurrently with conventional power limiting policies to provide support for the new usage models described herein while maintaining support for existing/conventional usage models.

In some embodiments, the power controller 308a provided by the system management firmware 308 in the power management subsystem 306 may be offline, or unable to respond quickly enough to protect (e.g., avoid tripping) the circuit breakers that couple the power supply units to the power grids. In such situations, an input over-current warning may be provided by the power supply unit(s) to the hardware backup subsystem 314 that triggers hardware throttling by the hardware backup subsystem 314 on the server components 310, with the hardware backup subsystem 314 configured to take over for the power controller 308a with regard to the throttling of the server components 310 regardless of whether the power controller 308a knows it is about to go offline due to an impending reset (as is required in conventional system). As such, the power controller 308a provided by the system management firmware 308 may operate according to the method 300 to perform relatively small amounts of throttling to the server components 310 to enforce the input current limits while maximizing the performance of its server device, while the hardware backup subsystem 314 may be configured to perform relatively large amounts of throttling to ensure that the input current limits are not exceeded for any significant amount of time.

The functionality of the hardware backup subsystem 314 may be enabled via Input Over Current Warning (IOCW) _protection in the power supply units with a configurable threshold and, in optional embodiments, configurable assertion/de-assertion trigger delays. For example, the power supply units in the server devices may operate to monitor their input currents and, if their input current limits are exceeded, assert an interrupt such as, an SMB_ALERT_N alert to their server device (which may be configured via SMBALERT_MASK). The hardware backup subsystem 314 (e.g., provided by CPLD) may receive the interrupt asserted by the power supply unit(s) and, in response, transmit throttling signal(s) to the server component(s) 310. When de-assertion is triggered, the power supply units may de-assert the SMB_ALERT_N alert to their server device (assuming no other power supply unit event/source needs to assert the SMB_ALERT_N alert).

In some embodiments, the power controller 308a provided by the system management firmware 308 may configure an Input Over-Current Warning (IOCW) threshold in the power supply units based on, for example, the user-defined (or automatically determined) per-power-grid input current limits discussed above. Furthermore, in embodiments in which assertion/de-assertion trigger delays are configurable, the power controller 308a provided by the system management firmware 308 may configure those as well. In embodiments in which the assertion/de-assertion trigger delays are configurable, an IOCW assertion trigger delay in the power supply units may be provided such that it lasts long enough to allows the system-management-firmware-based throttling (which limits the input current draw by power supply units) to operate when the power controller 308a is available, and short enough to still allow for throttling of the server components 310 by the hardware backup subsystem 314 in a time period that is sufficient to avoid tripping the circuit breakers 208 and 214. Additionally, the IOCW de-assertion trigger delay in the power supply units should be provided such that it lasts long enough to avoid tripping the circuit breakers due to repeated "hits" (i.e., where the power load resumes and exceeds that IOCW threshold repeatedly), which allows the circuit breakers 208 and 214 to cool off. One of skill in the art in possession of the present disclosure will recognize that, if the IOCW de-assertion trigger delay for the power supply units is not adequate, the associated negative implications may be remedied on the server device side via, for example, reduced throttling durations.

In an experimental embodiment, the design target for circuit breaker protection included ensuring "power excursions" (e.g., input current draws exceeding the input current limit(s)) were reduced below the input current limit within 1 second. In order to provide the power controller 308a sufficient time to respond to such power excursions (and time for that response to take effect), the power management subsystem 306 implemented an IOCW assertion trigger delay of 600 milliseconds, with the IOCW de-assertion trigger delay being at least 600 milliseconds or more. Referring now to FIG. 6, an embodiment of the power supply unit IOCW behavior and timing according to the experimental embodiment is illustrated. As can be seen, an advantage of using an averaging window (as opposed to checking for contiguous time above the IOCW assertion threshold) is that doing so allows the triggering of the SMB_ALERT_N alert even if the power load momentarily drops below the IOCW assertion threshold but averages above the IOCW assertion threshold, which avoids tripping the circuit breakers 208 and 214. However, while specific IOCW assertion/de-assertion trigger delays utilized in the experimental embodiment are illustrated, one of skill in the art in possession of the present disclosure will recognize that other IOCW assertion trigger delays and IOCW de-assertion trigger delays will fall within the scope of the present disclosure as well.

Once configured by the power controller 308a provided by the system management firmware 308, the IOCW mechanism in the power supply units (i.e., the IOCW threshold, IOCW assertion trigger delay, and IOCW de-assertion trigger delay, etc.) operates independently of the power controller 308a. As such, the IOCW mechanism in the power supply units may provide for the assertion of the power supply unit SMB_ALERT_N alert (when the IOCW threshold and IOCW assertion trigger delay are met) to initiate throttling of the server components 310 regardless of whether the power controller 308a provided by the system management firmware 308 is available. When configurable, the SMB_ALERT_N alert assertion based on the IOCW threshold is configured to be non-latching (i.e., it does not stay asserted until it is de-asserted), as no entity in the system is configured to clear the SMB_ALERT_N alert assertion when the power controller 308a is unavailable. Rather, the SMB_ALERT_N alert may de-assert when the IOCW de-assertion trigger delay is met, and one of skill in the art in possession of the present disclosure will recognize how hysteresis between the IOCW assertion and de-assertion thresholds can be enabled in the power management system 306 while remaining within the scope of the present disclosure.

In a specific embodiment, the Input Over Current Warnings (IOCWs) discussed above may be implemented in hardware in the PSUs. As such, if firmware in the server device fails to manage the power load of the server device, the PSU(s) may detect a current draw that exceeds a configured limit and respond by driving a discrete signal (e.g., SMBAlert #) to the server device that will initiate hardware based throttling controls. For example, the server device may be configured to assist a user in determining a valid current limit set point via the provisioning of guidance on valid current ranges and, in particular, valid current limit floors, which may be influenced by a dynamic power range of installed hardware that can be controlled by the power management system, a limited range of PSU OCW range sensors, etc.

The server devices will typically route SMB_ALERT_N alert assertions in order to assert CPU throttling (e.g., via CPU PROCHOT) to throttle CPU power to a minimum. However, the server devices may be configured to assert MEMHOT_N as well for memory bandwidth throttling, Peripheral Component Interconnect express (PCIe) POWER BRAKE N for PCIe throttling, and/or other hardware power controls in response to the assertion of SMB_ALERT_N alert. However, one of skill in the art in possession of the present disclosure will recognize that such throttling actions bring the performance of the server devices to a minimum, which is why the hardware backup subsystem 314 is provided as a backup solution to the firmware-based input current limit policies enforced by the power controller 308a provided in the system management firmware 308 as discussed above, which is capable of relatively "fine-grained" control that can keep the server devices operating just below the input current limits (instead of at the minimum operating level provided via throttling by the hardware backup subsystem 314), and thus operates to optimize the performance of the server devices in consideration of the input current limits that prevent tripping of the circuit breakers 208 and 214.

In embodiments in which multiple power supply units are provided in a server device (e.g., the power supply units 304a-d in the server device 300), those power supply units may be configured to share the system load, but one of skill in the art in possession of the present disclosure will recognize that the server device load will never be shared completely equally between each of those power supply units, which results in a power supply unit output current sharing error. In some examples, that power supply unit output current sharing error may be handled by the power management system 306. For example, the power controller 308a provided by the system management firmware 308 may add some margin ("PsuSharingMargin" in the fifth pseudo code provided below), and take that margin into account in configuring the power supply unit IOCW threshold in order to avoid unnecessary SMB_ALERT_N alert assertions. Due to the power supply unit output current sharing error, the administrator or other user may provide some margin between the aggregate input current limit for a power grid/circuit breaker, and the size of the circuit breaker, which one of skill in the art in possession of the present disclosure will recognize may result in some stranded power.

Furthermore, in configuring the power supply unit IOCW threshold, if the server devices and their power supply units support hot sparing (i.e., where a subset of the power supply units are put to "sleep" under relatively light power loads while another subset of the power supply units support the entire power load), the hot sparing switching regions may be handled, avoided, or made irrelevant based on the power supply unit "N+M" configuration. Setting the power supply unit IOCW threshold in the hot spare switching region may result in unnecessary SMB_ALERT_N alert assertions when the power supply units switch from sharing the power load to hot sparing (in which the power load is not shared as discussed above), resulting in a higher power load on the active power supply unit(s).

As such, in some examples, in non-power-grid-redundant configurations hot sparing may be disabled so that the hot sparing switching region does not apply. For example, in a "1+1" power-grid-redundant configuration (i.e., 1 primary power supply unit and 1 redundant power supply unit), the power supply unit IOCW threshold may be configured for failover, which inherently allows the hot spare switching region to be handled, as covering failover also covers situations in which one of the two available power supply units are put to "sleep". In a greater than "1+1" power-grid-redundant configuration, the power supply unit IOCW threshold may not be configured below 50% of power supply unit capacity in order to avoid the hot spare switching region (e.g., 20% to 50%). For example, in a "2+2" power-grid-redundant configuration (i.e., 2 primary power supply units and 2 redundant power supply units), if the administrator or other user-specified input current limit results in the power supply unit IOCW threshold being below 50% (i.e., "2+2" power supply units are installed, but limited to "1+1" power supply units (or less)), extraneous power supply units may be turned off to force the IOCW threshold of the remaining power supply units above 50%. Optionally, the system may recommend to the administrator or other user to reduce the number of installed power supply units in such a case. In situations in which the server devices or power supply units do not support hot sparing, the restrictions for the greater than "1+1" power-grid-redundant configurations discussed above may not apply.

As such, the IOCW threshold for power supply units may be configured according to the fifth pseudo code provided in the example below:

```
// Num ActivePsu is total number of currently active PSUs
// Num ActivePsuInGrid[ ] is total within each grid
// PsuSharingMargin = 2.5% of 100% max rated output current* converted to input current
// *regardless of line input level
// 2.5% adjustment to allow margin for output current sharing error of +/- 2% of 100% load
// PsuRatedOutputCurrent is input line independent and equivalent to 100% capacity
// PsuSharingMargin = 2.5% * (PsuRatedOutputCurrent * PsuOutputVoltage ) / PsuInputVoltage
// PsuInputOCWhalf is input current equivalent to 50% PSU output capacity
// PsuInputOCWhalf - 50% * (PsuRatedOutputCurrent * PsuOutputVoltage ) / PsuInputVoltage
if( CurrentCapPolicyEnable ) {
   if( !GridRedundantCfg ) {
      if(NumActivePsu == 1)
         PsuInputOCW = CurrentLimit
      else // Num AcivePsu M 1
         for each installed active PSU {
            PsuInputOCW[i] = (CurrentLimit / NumActivePsu ) + PsuSharingMargin
         }
   } else { // GridRedundantCfg ) {
      if( (1+1) Grid Redundant ) {
         for each grid { // Index i
            for each installed PSU { // Index j
               PsuInputOCW[j] = CurrentLimit[i] + PsuSharingMargin
            }
         }
      } else { // >(1+1) grid redundant
         for each grid { // Index i
            for each installed active PSU within grid { // index j
               // PsuInputOCWhalf is included here to avoid hat-spare region
               // Also, for example, no sense in installing 2+2 and cap to 1+1 or less
               PsuInputOCW[j] = max( PsuInputOCWhalf[j] + PsuSharingMargin,
                  (CurrentLimit[i] / NumActivePsuInGrid[i] ) +
```

```
            PSUSHaringMargin )
        }
      }
    }
  }
}
```

As would be understood by one of skill in the art in possession of the present disclosure, the fifth pseudo code provided above may have the IOCW threshold for the power supply units set to its minimum if the request is below the minimum, and set to its maximum if the request is above the maximum. Furthermore, the power controller 308*a* provided by the system management firmware 308 in the power management subsystem 206 may configured the IOCW threshold in the power supply units upon any of: a reset of the power controller 308*a*, a change to the input current limit by the administrator or other user, a hot-insertion or input power restore of a power supply unit, a failure of the power supply unit, and/or other situations that would be apparent to one of skill in the art in possession of the present disclosure.

In the event the input current limit policy is disabled, the power controller 308*a* provided by the system management firmware 308 in the power management subsystem 206 may revert the IOCW threshold for the power controller to a default (e.g., maximum) value, which may be enabled via the sixth pseudo code in the example below:

```
If( !CurrentCapPolicyEnable ) {
  // this needs to be done only once, so, use a flag to track if needed for
  each installed PSU
  {
    PsuInputOCW = PsuMaxInputOCW // reset to default (max)
  }
}
```

As such, specific embodiments of the systems and methods of the present disclosure may implement two primary power control loops: 1) A one-to-many power control loop that may be implemented by a systems management console (e.g., the DELL® OpenManage Power Center (OMPC) available from DELL® Inc. of Round Rock, Texas, United States) that may receive server-rack-level power grid limits specified by a user, and then monitor server device power loads on a per-power-grid basis in order to assign each power grid per-server power limits, which operates as a dynamic power control loop that prevents power from being allocated to server devices that are not actively using it, and 2) a server-level power control loop that may be implemented by the power management subsystem 306 that may respond to dynamic power limit updates to current limit policies from the OMPC, with the power management subsystem 306 dynamically monitoring per-power-grid power loads from the server devices and, in turn, dynamically adjusting power limits to server components that support power limiting, providing a dynamic power control loop that prevents power from being allocated to server components that are not actively using it. One of skill in the art in possession of the present disclosure will recognize how such power control loops may greatly reduce the amount of stranded power in such systems.

Thus, systems and methods have been described that provide a firmware-based power controller that executes firmware-based power controller policies that allow the input current draw of power supply unit(s) in a server/system from the power grid to which they are coupled to be limited based on the respective circuit breaker through which they are coupled to that power grid, which allows those circuit breaker(s) to be sized for failover according to a total input current limit. Furthermore, when the server/system includes different power supply units that are coupled to different power grids, the firmware-based power controller policies allow for different input current limits for power supply unit(s) in the server/system coupled to different power grid that may be based on the different sized circuit breaker used to couple the power supply units to those different power grids. Finally, a hardware-based subsystem may be provided to trigger server/system throttling when the firmware-based power controller is unavailable or unable to respond quickly enough, and may be configured to take over for the firmware-based power controller regardless of whether the firmware-based power controller is aware it is about to go offline due to a coming server/system reset. As such, the firmware-based power controller operates to provide "fine-grained" throttling of server/system components based on a configurable input current limit applied to power supply units in order to avoid tripping of circuit breakers, while a hardware backup subsystem is configured to throttle the server/system components to a minimum operating level to ensure that those input current limits are not exceeded to a point that trips those circuit breakers.

Figure 7:
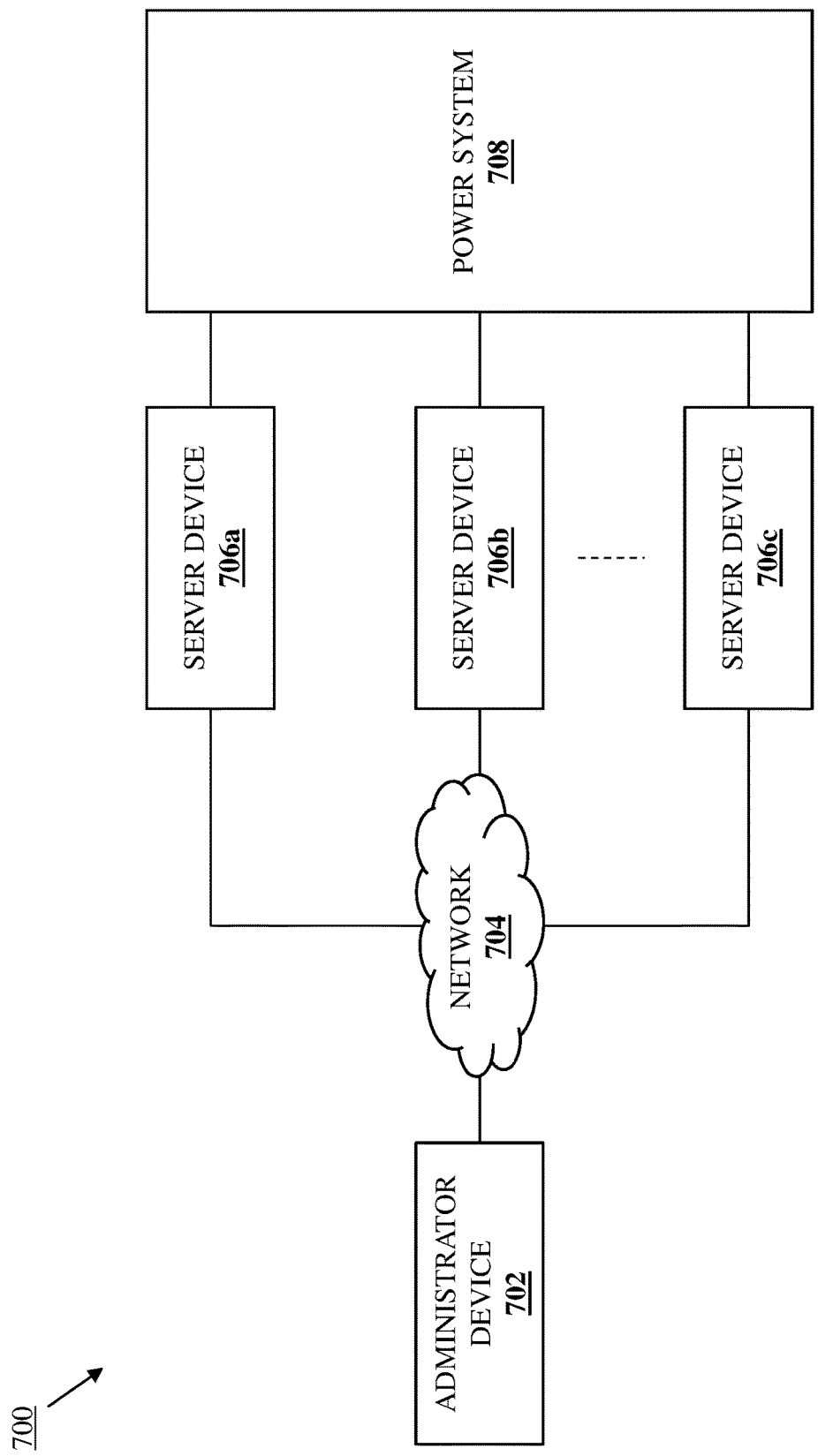
FIG. 7 is a schematic view illustrating an embodiment of a networked system that may include the power management system of the present disclosure.

Referring now to FIG. 7, an embodiment of a networked system 700 is illustrated that may include the power management system of the present disclosure. In the illustrated embodiment, the networked system 700 includes an administrator device 702 that may be provided by either of the administrator devices 320 and/or 500 discussed above. As such, administrator device 700 may be provided by the IHS 100 discussed above with reference to FIG. 1, and/or may include some or all of the components of the IHS 100, and, in specific examples may be provided by desktop computing devices, laptop/notebook computing devices, tablet computing devices, mobile phones, and/or any other computing devices that one of skill in the art in possession of the present disclosure will appreciate may provide the management "console" functionality described below. For example, as discussed below, the administrator device 702 may provide a DELL® OpenManage Enterprise (OME) infrastructure management console that is available form DELL® Inc. of Round Rock, Texas, United States, and that is configured to provide for the discovery, deployment, updating, and monitoring of DELL® server devices. However, while illustrated and discussed as being provided by a particular computing device providing a particular management console, one of skill in the art in possession of the present disclosure will recognize that administrator devices provided in the networked system 700 may include any devices that may be configured to operate similarly as the administrator device discussed below.

In the illustrated embodiment, the administrator device 702 is coupled to a network 704 that may be provided by a Local Areas Network (LAN), the Internet, combinations thereof, and/or any other networks that would be apparent to one of skill in the art in possession of the present disclosure. As illustrated, a plurality of server devices 706*a*, 706*b*, and up to 706*c* may be coupled to the network 704 as well, and may be provided by any of the server devices discussed above. For example, any or each of the server devices 706*a*-706*b* may be provided by the IHS 100 discussed above with reference to FIG. 1, and/or may include some or all of the components of the IHS 100. However, while illustrated and described as being provided by server devices, one of skill in the art in possession of the present disclosure will appreciate how the server devices 706a-706c may be replaced by other types of computing devices, networking devices, storage systems, etc., while remaining within the scope of the present disclosure as well. As will appreciated by one of skill in the art in possession of the present disclosure, each of the server devices 706a-706c may include the PSUs and/or any other server power components described above (e.g., with reference to FIG. 3) while remaining within the scope of the present disclosure.

Each of the server devices 706a-706c is coupled to a power system 708, and one of skill in the art in possession of the present disclosure will appreciate how the power system 708 may include the PDUs, circuit breakers, and/or other power system components described above (e.g., with reference to FIG. 2) while remaining within the scope of the present disclosure. As such, one of skill in the art in possession of the present disclosure will recognize how the networked system 700 includes a power infrastructure that includes power infrastructure components that couple the server devices 706a-706c to at least one power source (e.g., the power grids 206 and 212 discussed above with reference to FIG. 2), and that may include the PSUs and server power components in the server devices 706a-706c, the PDUs, circuit breakers, and/or other power system components in the power system 708, and/or any other power infrastructure components known in the art. However, while a specific networked system 700 has been illustrated and described, one of skill in the art in possession of the present disclosure will recognize that the power management system of the present disclosure may be implemented using a variety of components and component configurations while remaining within the scope of the present disclosure as well.

Figure 8:
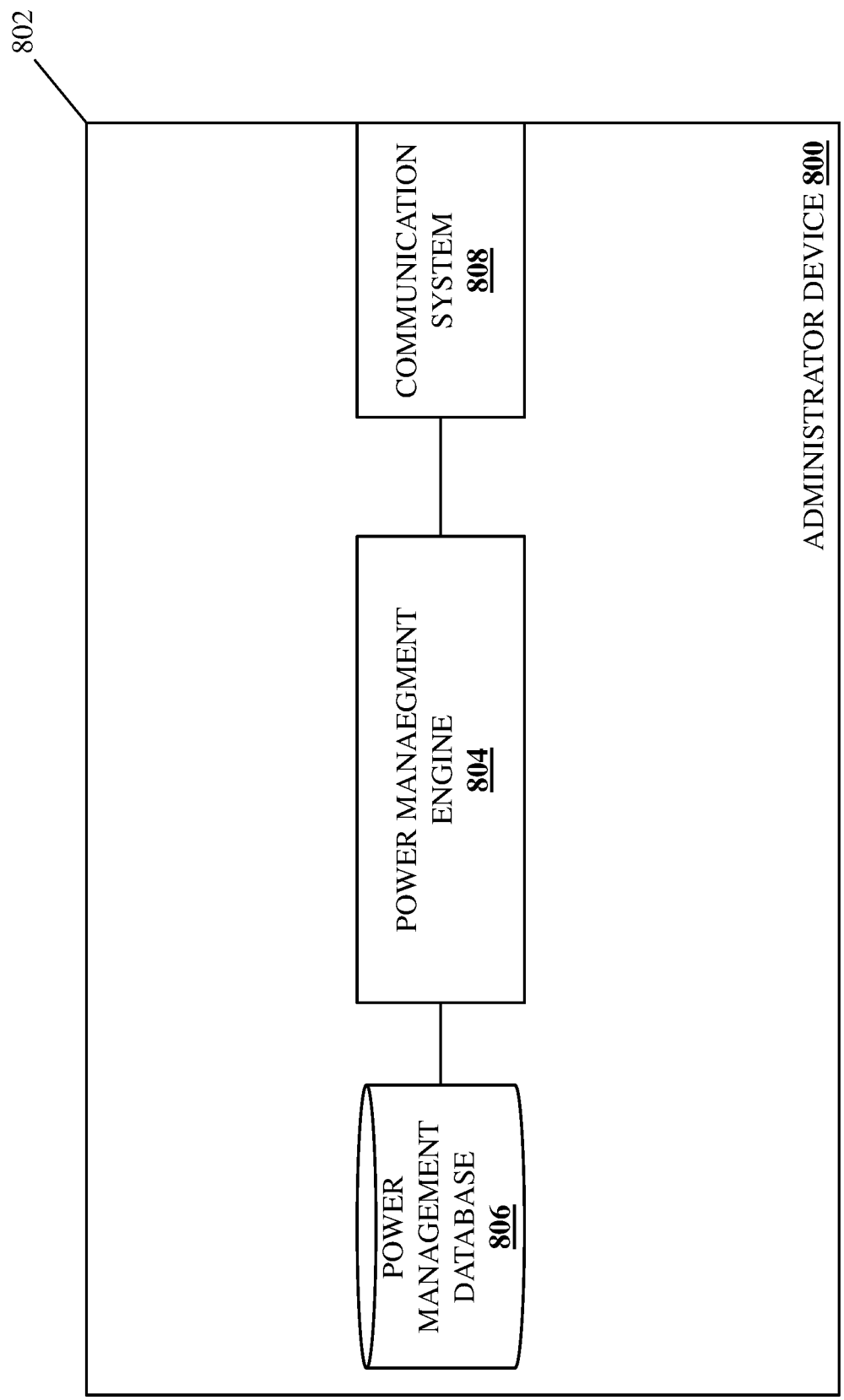
FIG. 8 is a schematic view illustrating an embodiment of an administrator device that may be included in the networked system of FIG. 7 and that may provide the power management system of the present disclosure.

Referring now to FIG. 8, an embodiment of an administrator device 800 is illustrated that may provide any or each of the administrator devices discussed above with reference to FIGS. 3, 5A, 5B, and/or 7. As such, the administrator device 800 may be provided by the IHS 100 discussed above with reference to FIG. 1 and/or may include some or all of the components of the IHS 100, and in specific examples may be provided by desktop computing devices, laptop/notebook computing devices, tablet computing devices, mobiles phones, and/or any other computing devices that one of skill in the art in possession of the present disclosure would recognize as providing the management console functionality described below. Furthermore, while illustrated and discussed as being provided by particular computing devices, one of skill in the art in possession of the present disclosure will recognize that the functionality of the administrator device 800 discussed below may be provided by other devices that are configured to operate similarly as the administrator device 800 discussed below.

In the illustrated embodiment, the administrator device 800 includes a chassis 802 that houses the components of the administrator device 800, only some of which are illustrated and described below. For example, the chassis 802 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a power management engine 804 that is configured to perform the functionality of the power management engines, power management subsystems, and/or administrator devices discussed below. In specific examples, the power management engine 804 may be provided by a "power management plugin" for a DELL® OpenManage Enterprise (OME) infrastructure management console that is available form DELL® Inc. of Round Rock, Texas, United States, although other management consoles are envisioned as falling within the scope of the present disclosure as well.

The chassis 802 may also house a storage system (not illustrated, but which may include the storage 108 discussed above with reference to FIG. 1) that is coupled to the power management engine 804 (e.g., via a coupling between the storage system and the processing system) and that includes a power management database 806 that is configured to store any of the information utilized by the power management engine 804 discussed below. The chassis 802 may also house a communication system 808 that is coupled to the power management engine 804 (e.g., via a coupling between the communication system 808 and the processing system) and that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure. However, while a specific administrator device 800 has been illustrated and described, one of skill in the art in possession of the present disclosure will recognize that administrator devices (or other devices operating according to the teachings of the present disclosure in a manner similar to that described below for the administrator device 800) may include a variety of components and/or component configurations for providing conventional administrator device/management console functionality, as well as the power management functionality discussed below, while remaining within the scope of the present disclosure as well.

Figure 9:
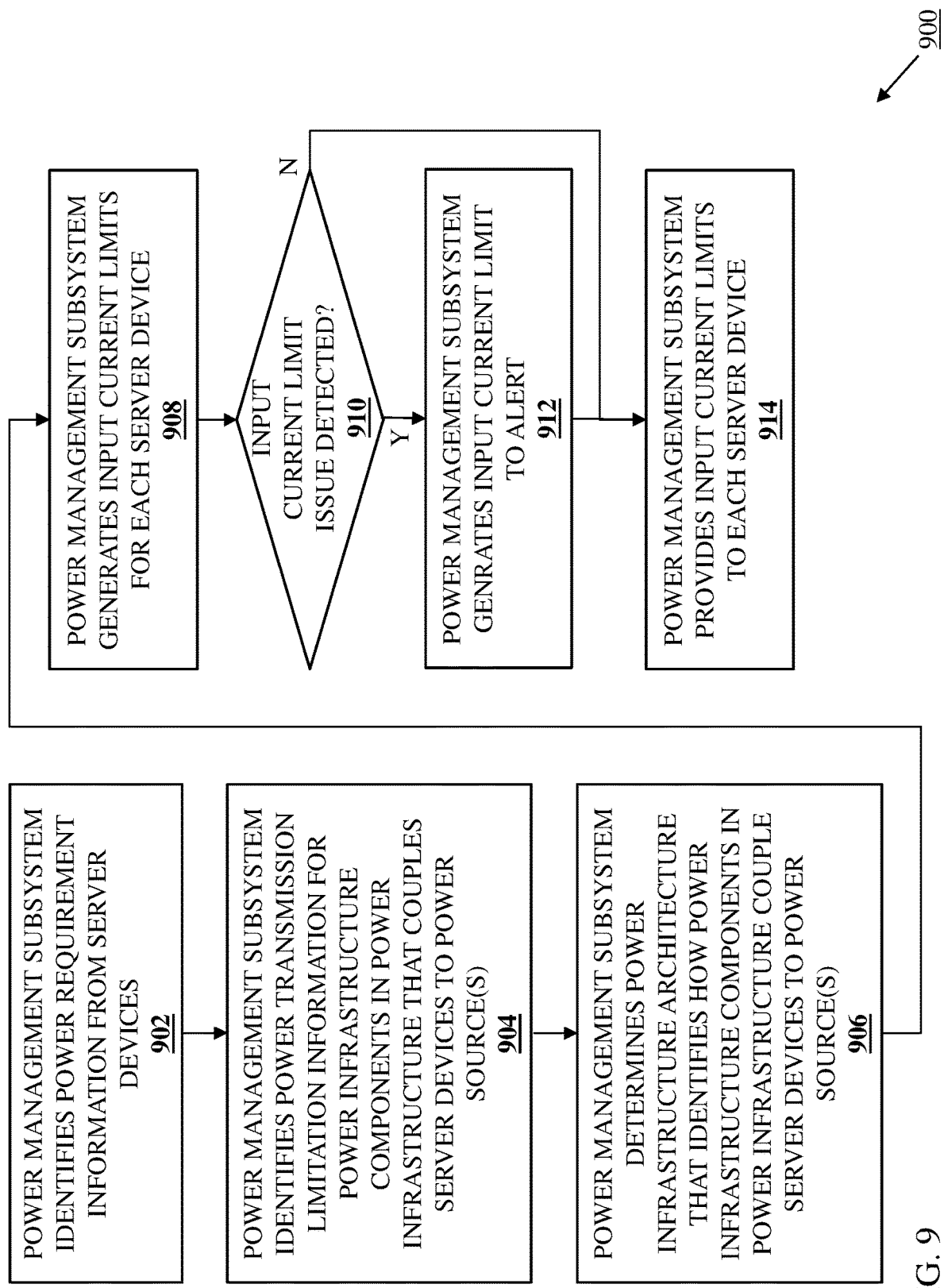
FIG. 9 is a flow chart illustrating an embodiment of a method for managing power.

Referring now to FIG. 9, an embodiment of a method 900 for managing power is illustrated. As discussed below, the systems and methods of the present disclosure provide for the use of power requirements of computing devices, power transmission limitations of power infrastructure components that couple those computing devices to power source(s), and a power infrastructure architecture that identifies how the power infrastructure components couple the computing devices to the power source(s), to generate input current limits for each of those computing devices. For example, the power management system of the present disclosure may include a power infrastructure having power infrastructure components that couple computing devices to power source(s), and a power management subsystem coupled to the computing devices. The power management subsystem identifies power requirement information for each of the computing devices and power transmission limitation information for the power infrastructure components, and determines a power infrastructure architecture that identifies how the power infrastructure components couple the computing devices to the power source(s). The power management subsystem then uses the power requirement information, the power transmission limitation information, and the power infrastructure architecture to generate and provide a respective input current limit to each of the computing devices. Each respective input current limit is configured to maximize performance of the respective computing device for which it was generated while ensuring availability of the power infrastructure in the event of an unavailability of a subset of the power infrastructure components. As such, the performance of each of the computing devices may be maximized while also ensuring availability of the power infrastructure in the event of an unavailability of one or more of the power infrastructure components.

Figure 10A:
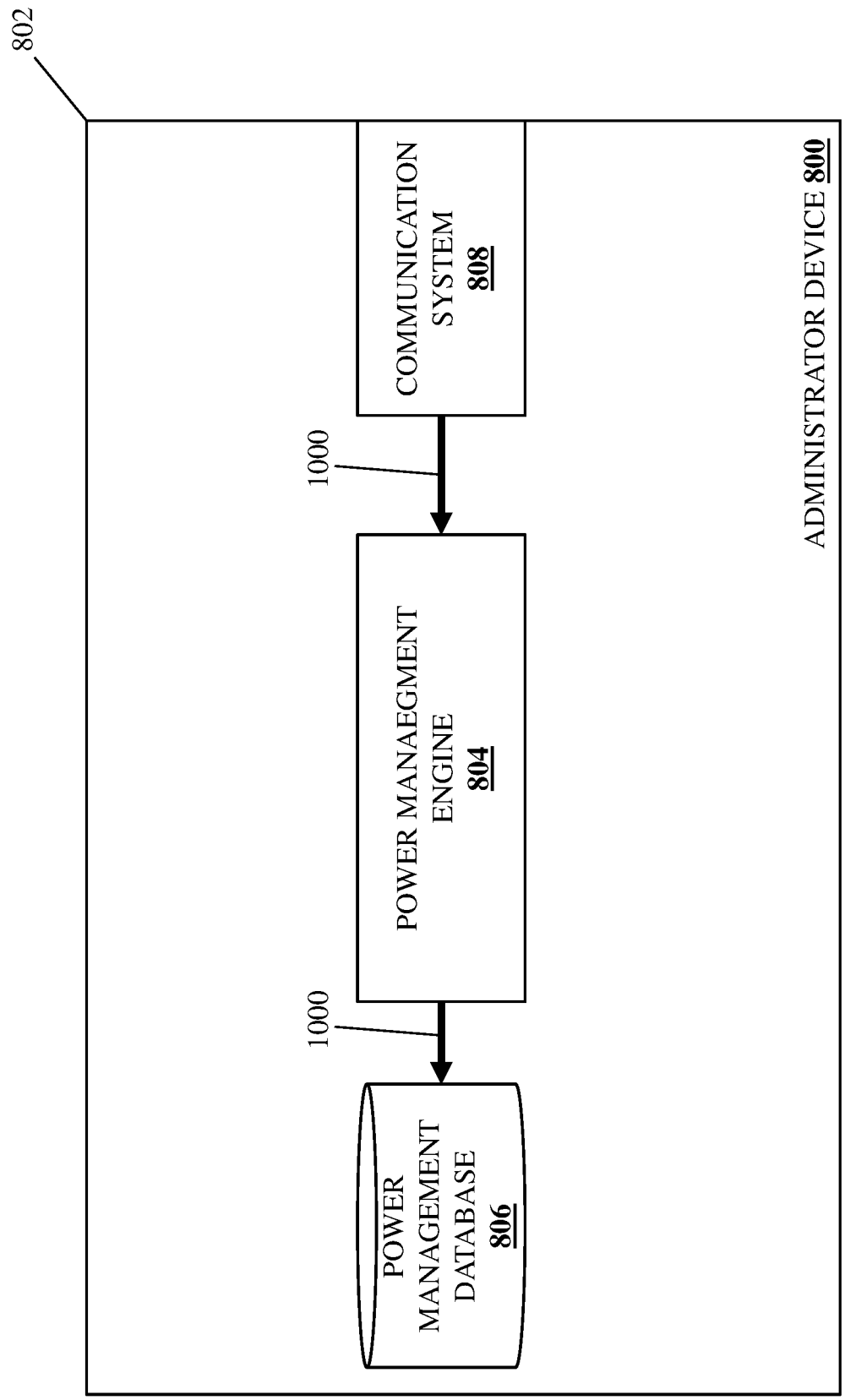
FIG. 10A is a schematic view illustrating an embodiment of the operation of the administrator device of FIG. 8 during the method of FIG. 9.
Figure 10B:
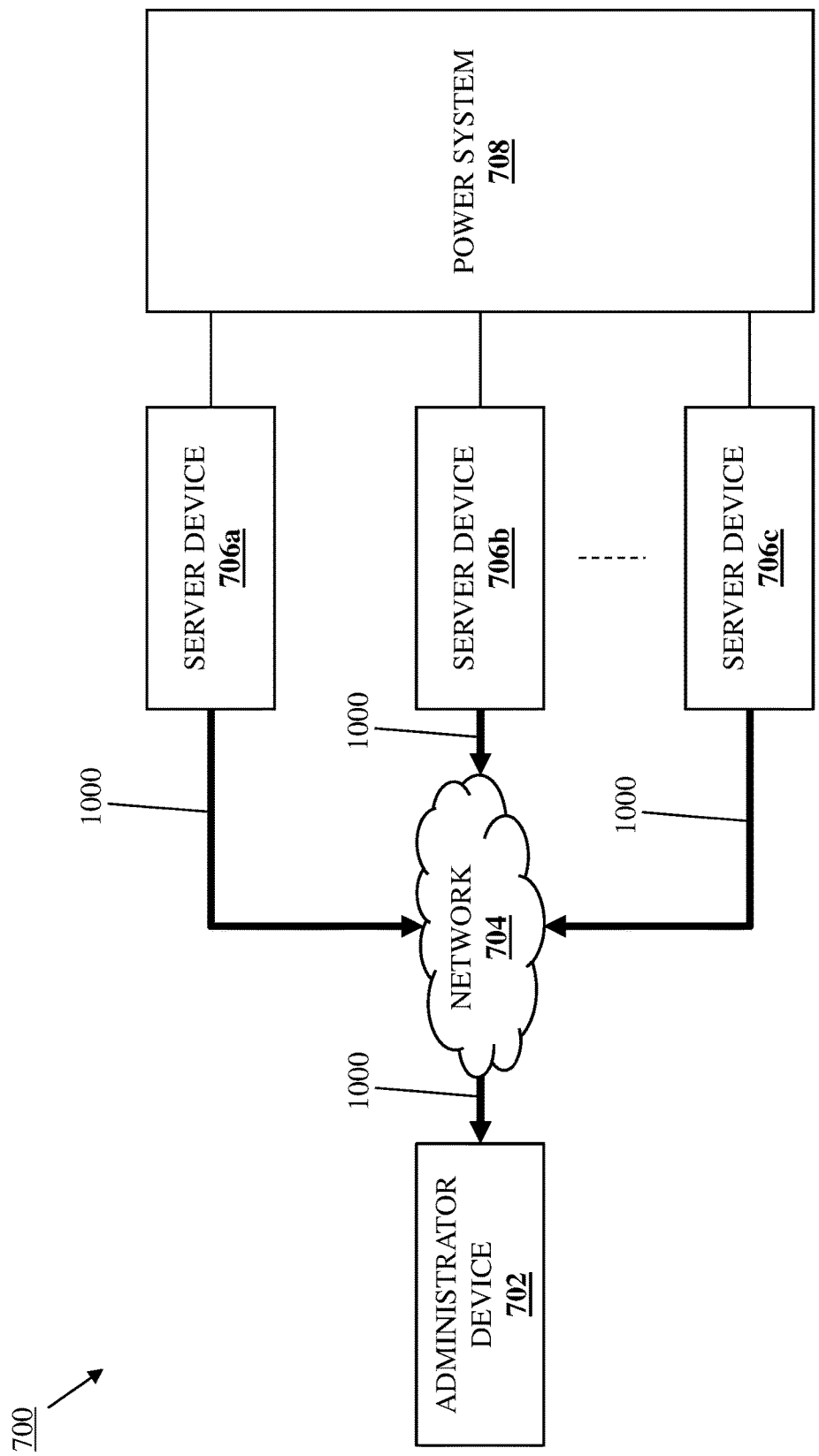
FIG. 10B is a schematic view illustrating an embodiment of the operation of the networked system of FIG. 7 during the method of FIG. 9.

The method 900 begins at block 902 where a power management subsystem identifies power requirement information from a plurality of server devices. With reference to FIGS. 10A and 10B, in an embodiment of block 902, the power management engine 804 in the administrator device 702/800 may perform power requirement information identification operations 1000 that may include retrieving power requirement information from each of the server devices 706a-706c through the network 704 via its communication system 808, and storing that power requirement information in its power management database 806. For example, the power requirement information retrieved from each of the server devices 706a-706c/800 may include a peak power consumption for that server device, a runtime power consumption by that server device, a full utilization/maximum power consumption for that server device, a fully throttled power consumption for that server device, a Thermal Design Power (TDP) for that server device (e.g., for the processing system in that server device), Thermal Design Current (TDC) for that server device (e.g., for the processing system in that server device), a PCIe Power Brake power or current for that server device (e.g., for PCIe devices in that server device), a storage device nominal and throttled power for that server device (e.g., for storage devices in that server device), a networking device nominal and throttled power for that server device (e.g., for networking devices in that server device), and/or any other power requirement information that one of skill in the art in possession of the present disclosure would recognize as allowing for the determination of the "targeted", "desired", and/or other power consumption levels of the server devices described below.

To provide a specific example, the power requirement information retrieved at block 902 from each of the server devices 706a-706c may be included in a power budget for that server device and may be retrieved from a management controller (e.g., an integrated DELL® Remote Access Controller (iDRAC) provided in server devices available from DELL® Inc. of Round Rock, Texas, United States; a Baseboard Management Controller (BMC) device, etc.) that is included in that server device. In another a specific example, the power requirement information retrieved at block 902 from each of the server devices 706a-706c may be a measured power consumption for that server device. However, while specific power requirement information has been described as being retrieved using particular techniques, one of skill in the art in possession of the present disclosure will appreciate how any of a variety of power requirement information may be identified for the server devices 706a-706c at block 902 using any of a variety of techniques while remaining within the scope of the present disclosure as well.

Figure 11A:
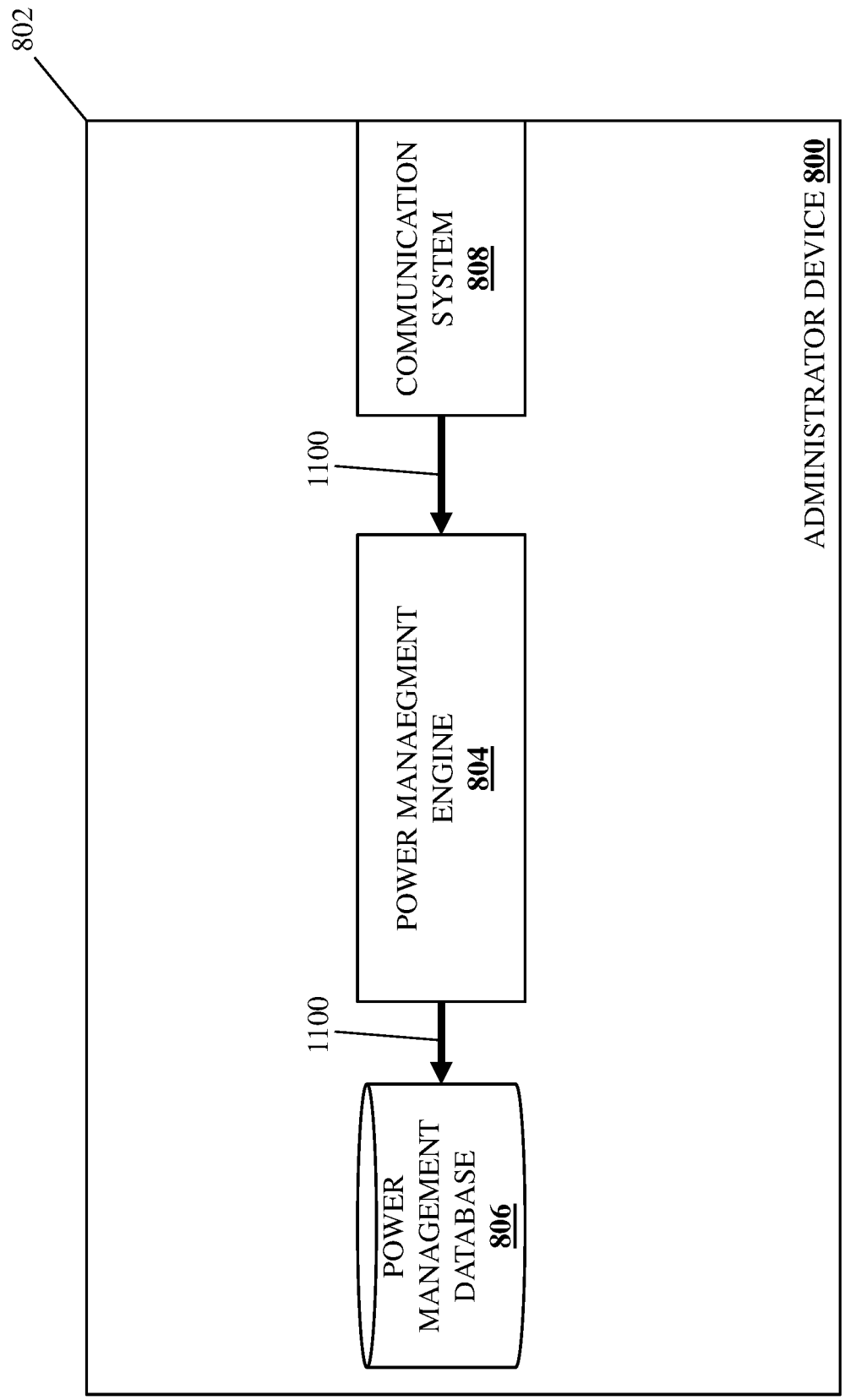
FIG. 11A is a schematic view illustrating an embodiment of the operation of the administrator device of FIG. 8 during the method of FIG. 9.
Figure 11B:
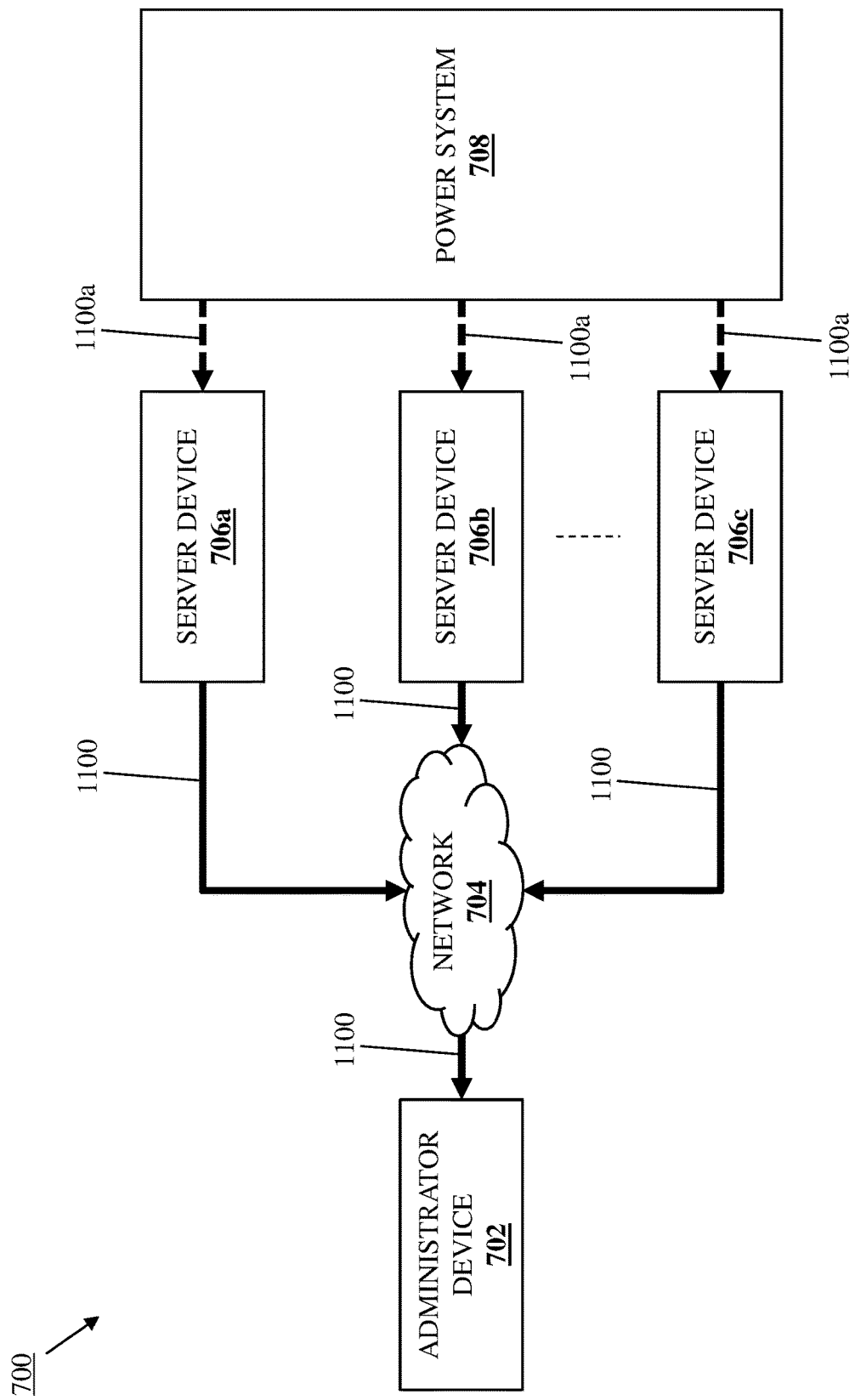
FIG. 11B is a schematic view illustrating an embodiment of the operation of the networked system of FIG. 7 during the method of FIG. 9.

The method 900 then proceeds to block 904 where the power management subsystem identifies power transmission limitation information for power infrastructure components in a power infrastructure that couples the server devices to one or more power sources. With reference to FIGS. 11A and 11B, in an embodiment of block 904, the power management engine 804 in the administrator device 702/800 may perform power transmission limitation information identification operations 1100 that may include retrieving power transmission limitation information for power infrastructure components that couple each of the server devices 706a-706c to power source(s) through the network 704 via its communication system 808, and storing that power transmission limitation information in its power management database 806. As will be appreciated by one of skill in the art in possession of the present disclosure, the power transmission limitation information retrieved at block 904 may include any information that defines the limits of the electrical loads that may be applied to any of the power infrastructure components in the power infrastructure.

For example, the power transmission limitation information retrieved from each of the server devices 706a-706c/800 may include power transmission limitation information for power infrastructure components that are included in that server device such as, for example, each of the PSUs that are included in that server device. To provide a specific example, the power transmission limitations information for each of the PSUs in that server device that may include a power input for that PSU, a power output by that PSU, current protection limits for that PSU (e.g., based on thermal limits), circuit breaker details for that PSU, hot swap controller (HSC) protection details for that PSU, connector max power or current for that PSU, sense resistor network max current for that PSU, and/or any other PSU power transmission limitation information that would be apparent to one of skill in the art in possession of the present disclosure. In the specific examples provided below, the PSU power transmission limitation information identified for each of the PSUs in the server devices 706a-706c includes an AC power input limitation for DC PSUs.

To provide a specific example, the PSU power transmission limitation information retrieved at block 904 from each of the server devices 706a-706c may be retrieved from the management controller discussed above that is included in that server device and that may be configured to retrieve and identify any of the power transmission limitations of the PSUs in that server device. However, while specific PSU power transmission limitation information has been described as being retrieved using particular techniques, one of skill in the art in possession of the present disclosure will appreciate how any of a variety of PSU power transmission limitation information may be identified for PSUs that coupled the server devices 706a-706c to power source(s) at block 904 using any of a variety of techniques (e.g., that PSU power transmission limitation information may have been provided by a network administrator or other user in the power management database 806 of the administrator device 702/800) while remaining within the scope of the present disclosure as well.

In another example, the power transmission limitation information retrieved from each of the server devices 706a-706c/800 may include power transmission limitation information for power infrastructure components that outside of that server device and that couple that server device to power source(s) such as, for example, each of the PDUs that are included in the power system 708 and coupled to the PSUs that are included in that server device. To provide a specific example, the power transmission limitations information for each of the PDUs in that power system 708 that may include power output by that PDU, current protection limits for that PDU (e.g., provided by circuit breakers), circuit breakers upstream and downstream of that PDU, safety derating of circuit breaker current limits for that PDU, power outlet max current for that PDU, power cable max current for that PDU, AC power factor limitations for that PDU, and/or any other PDU power transmission limitation information that would be apparent to one of skill in the art in possession of the present disclosure. In the specific examples provided below, the PDU power transmission limitation information identified for each of the PDUs that couple the server devices 706a-706c to the power source(s) includes current limitations for circuit breakers in banks of that PDU, and maximum outlet currents for outlets of that PDU.

To provide a specific example, the PDU power transmission limitation information retrieved at block 904 from each of the server devices 706a-706c may be retrieved from the management controller discussed above that is included in that server device and that may be configured to retrieve and identify any of the power transmission limitations of the PDUs that are coupled to the PSUs in that server device (e.g., as indicated by elements 1100a in FIG. 11B). However, while specific PDU power transmission limitation information has been described as being retrieved using particular techniques, one of skill in the art in possession of the present disclosure will appreciate how any of a variety of PDU power transmission limitation information may be identified for PDUs that coupled the server devices 706a-706c to power source(s) at block 904 using any of a variety of techniques (e.g., that PDU power transmission limitation information may have been provided by a network administrator or other user in the power management database 806 of the administrator device 702/800) while remaining within the scope of the present disclosure as well.

However, while two specific examples of the identification of power transmission limitation information for PSUs and PDUs that couple the server devices 706a-706c to power source(s) have been described, one of skill in the art in possession of the present disclosure will appreciate how power transmission limitation information may be identified at block 904 for power input from the power source(s), circuit breakers or other current protection devices outside of the PSUs and PDUs (e.g., the circuit breakers 208 and 214 described above with reference to FIG. 2), as well as any other power infrastructure components in the power infrastructure that couple the server devices 706a-706c to the power source(s) and that one of skill in the art in possession of the present disclosure will appreciate include power transmission limitations above which those power infrastructure components may no long transmit power and/or otherwise become unavailable. In the specific examples provided below, the other power infrastructure component power transmission limitation information identified at block 904 includes current limitations of the power input from the power source(s), and current limitations of phase pairs in the power input from the power source(s).

The method 900 then proceeds to block 906 where the power management subsystem determines a power infrastructure architecture that identifies how the power infrastructure components in the power infrastructure couple the server devices to the power source(s). In an embodiment, at block 906, the power management engine 804 in the administrator device 702/800 may perform power infrastructure architecture determination operations that include determining a power infrastructure architecture that identifies how the power infrastructure components (e.g., in the server devices 706a-706c and the power system 708) couple the server devices 706a-706c to the power source(s), and defines the electrical limits present in the particular deployment of server devices and power infrastructure components in the networked system 700. For example, a network administrator or other user of the networked system 700 may provide a power infrastructure architecture "map" or other diagram in the power management database 806 of the administrator device 702/800 that identifies how the PSUs in each server device 706a-706c are coupled to the PDUs in the power system 708, how the PDUs in the power system 708 are coupled to the power source(s), and/or any how any other power infrastructure component connections that would be apparent to one of skill in the art in possession of the present disclosure are used to provide power from the power source(s) to the server devices 706a-706c.

As such, the power management engine 804 may be configured to access that power infrastructure architecture map to determine the power infrastructure architecture at block 906 and, in particular, how each PDU in the power system 708 is connected to any PSUs in the server device(s) 706a-706c, as well as any of the power source(s). As will be appreciated by one of skill in the art in possession of the present disclosure, the determination of the power infrastructure architecture at block 906 may include a determination of any details about the power infrastructure, including power types (e.g., Alternating Current (AC) power type 3-phase, 1-phase, etc.), max currents, P-Factor measurement/mitigation information, circuit breaker details, wiring configurations (e.g., 4-wire or 5-wire), voltage limitations (e.g., Line-to-Line voltage limitations or Line-to-Neutral voltage limitations), max cable and plug current limits, bus bar max currents (if applicable), and/or other power infrastructure details that would be apparent to one of skill in the art in possession of the present disclosure. However, while specific power infrastructure architectures and particular techniques for determining power infrastructure architectures have been described, one of skill in the art in possession of the present disclosure will appreciate how any of a variety of power infrastructure architectures may be determined using any of a variety of power infrastructure architecture determination techniques (e.g., automated power infrastructure architecture determination techniques such as those enabled by Data Center Infrastructure Management (DCIM) applications used to document datacenter power architectures) while remaining within the scope of the present disclosure as well.

Figure 12:
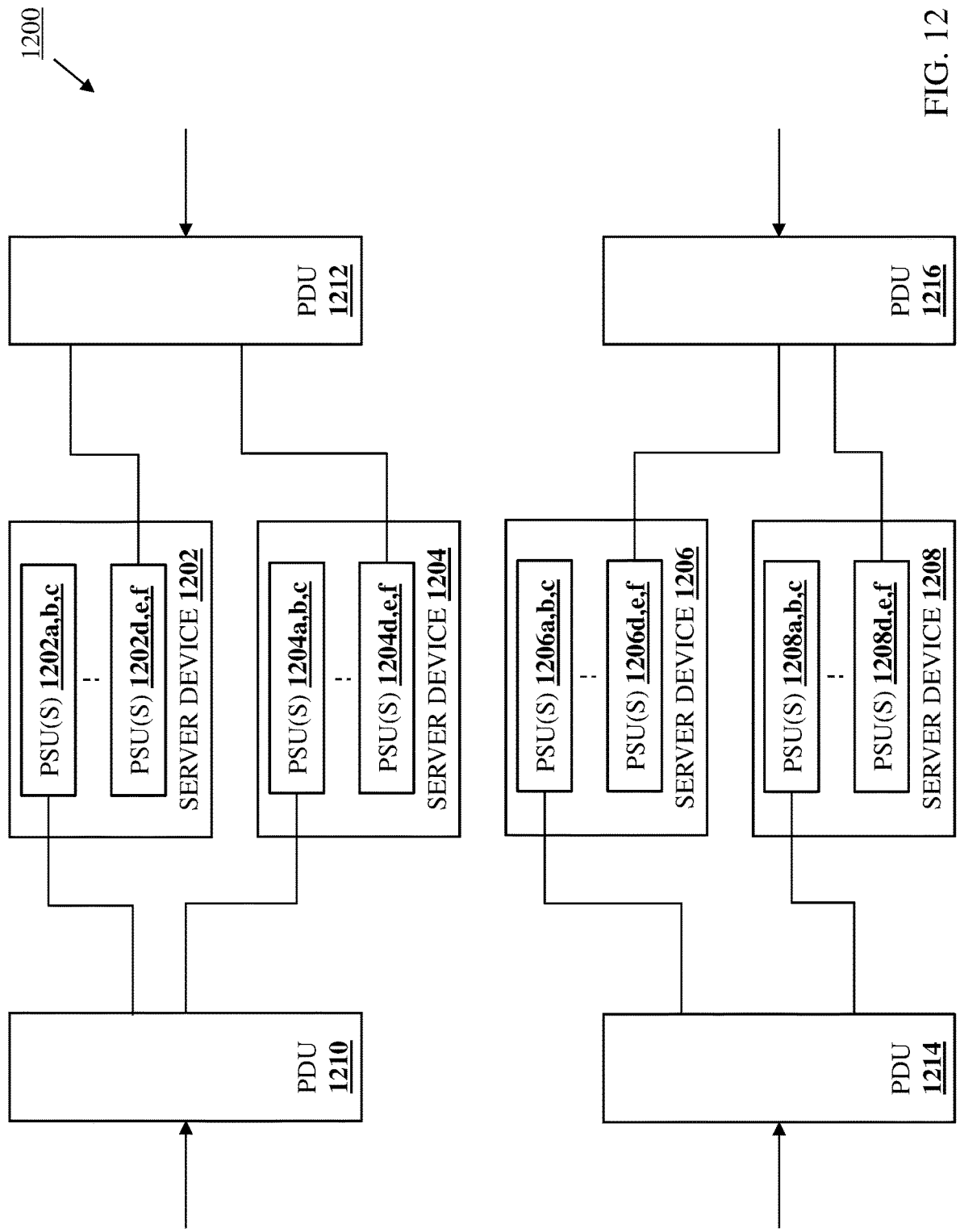
FIG. 12 is a schematic view illustrating a specific embodiment of the networked system of FIG. 7 utilized in the method of FIG. 9.

With reference to FIG. 12 for purposes of the discussion of the specific examples provided below, the power infrastructure architecture determination operations by the power management engine 804 in the administrator device 702/800 may determine a power infrastructure architecture 1200 that includes four server devices each having six PSUs, with a server device 1202 having PSUs 1202a, 1202b, 1202c, 1202d, 1202e, and 1202f; a server device 1204 having PSUs 1204a, 1204b, 1204c, 1204d, 1204e, and 1204f; a server device 1206 having PSUs 1206a, 1206b, 1206c, 1206d, 1206e, and 1206f; and a server device 1208 having PSUs 1208a, 1208b, 1208c, 1208d, 1208e, and 1208f.

Furthermore, the power infrastructure architecture 1200 determined via the power infrastructure architecture determination operations by the power management engine 804 also includes four PDUs 1210, 1212, 1214, and 1216, each of which may be connected to a respective power source (as indicated by the arrow provided with each PDU 1210-1216). As described below, each of the PSUs 1202a-c in the server device 1202 may be connected to different outlets on different banks, and different phase pairs, in the PDU 1210; each of the PSUs 1202d-f in the server device 1202 may be connected to different outlets on different banks, and different phase pairs, in the PDU 1212; each of the PSUs 1204a-c in the server device 1204 may be connected to different outlets on different banks, and different phase pairs, in the PDU 1210; each of the PSUs 1204d-f in the server device 1204 may be connected to different outlets on different banks, and different phase pairs, in the PDU 1212; each of the PSUs 1206a-c in the server device 1206 may be connected to different outlets on different banks, and different phase pairs, in a PDU 1214; each of the PSUs 1206d-f in the server device 1206 may be connected to different outlets on different banks, and different phase pairs, in a PDU 1216; each of the PSUs 1208*a-c* in the server device 1208 may be connected to different outlets on different banks, and different phase pairs, in the PDU 1214; and each of the PSUs 1208*d-f* in the server device 1208 may be connected to different outlets on different banks, and different phase pairs, in the PDU 1216.

Figure 13:
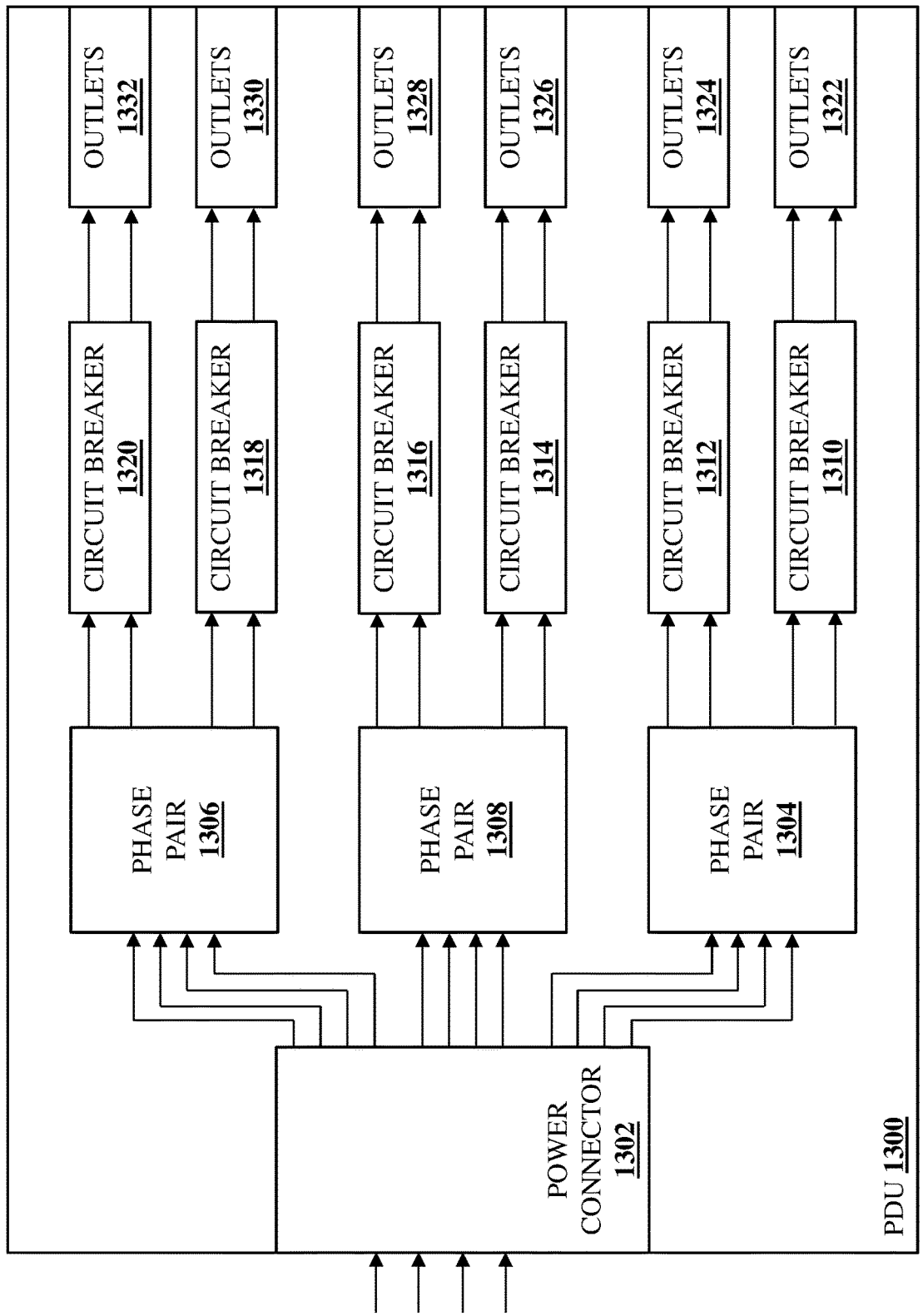
FIG. 13 is a schematic view illustrating a specific embodiment of a power distribution unit included in the networked system of FIG. 12 utilized in the method of FIG. 9.

With reference to FIG. 13, in the specific example provided below, the power infrastructure architecture determination operations by the power management engine 804 in the administrator device 702/800 may determine an architecture for a PDU 1300 that may be any or each of the PDUs 1210-1216 discussed above with reference to FIG. 12. As can be seen, the PDU 1300 includes a power connector 1302 that, as described below, may be configured to receive a power input (e.g., a 3-phase, 30 amp, 208 volt "whip" power input in the specific examples provided below) from its connected power source, and provide three phase pairs 1304, 1306, and 1308 (e.g., line-to-line phase pairs L1→L2, L1→L3, L2→L3, respectively, that are each 120 degrees out-of-phase with each other in the specific examples provided below) that each couple to two of the six banks on the PDU 1300 (with the phase pair 1304 (L1→L2) connected to banks 1 and 2 on the PDU 1300, the phase pair 1306 (L1→L3) connected to banks 3 and 4 on the PDU 1300, and the phase pair 1308 (L2→L3) connected to banks 5 and 6 on the PDU 1300 in the specific examples provided below). Furthermore, in the specific examples provided below, each bank on the PDU is provided with a 20 amp circuit breaker, with a first bank that is coupled to the phase pair 1304 provided with a circuit breaker 1310, a second bank that is coupled to the phase pair 1304 provided with a circuit breaker 1312, a third bank that is coupled to the phase pair 1308 provided with a circuit breaker 1314, a fourth bank that is coupled to the phase pair 1308 provided with a circuit breaker 1316, a fifth bank that is coupled to the phase pair 1306 provided with a circuit breaker 1318, and a sixth bank that is coupled to the phase pair 1306 provided with a circuit breaker 1320.

Further still, in the specific examples provided below, each bank on the PDU is coupled (via its circuit breaker) to at least two outlets (e.g., "C19" outlets, "C13" outlets, etc.), with the first bank coupled to outlets 1322 via its circuit breaker 1310, the second bank coupled to outlets 1324 via its circuit breaker 1312, the third bank coupled to outlets 1326 via its circuit breaker 1314, the fourth bank coupled to outlets 1328 via its circuit breaker 1316, the fifth bank coupled to outlets 1330 via its circuit breaker 1318, and the sixth bank coupled to outlets 1332 via its circuit breaker 1320. However, while a specific PDU is illustrated and utilized in the examples provided below, one of skill in the art in possession of the present disclosure will appreciate how a variety of PDU power component architectures will fall within the scope of the present disclosure as well.

Figure 14:
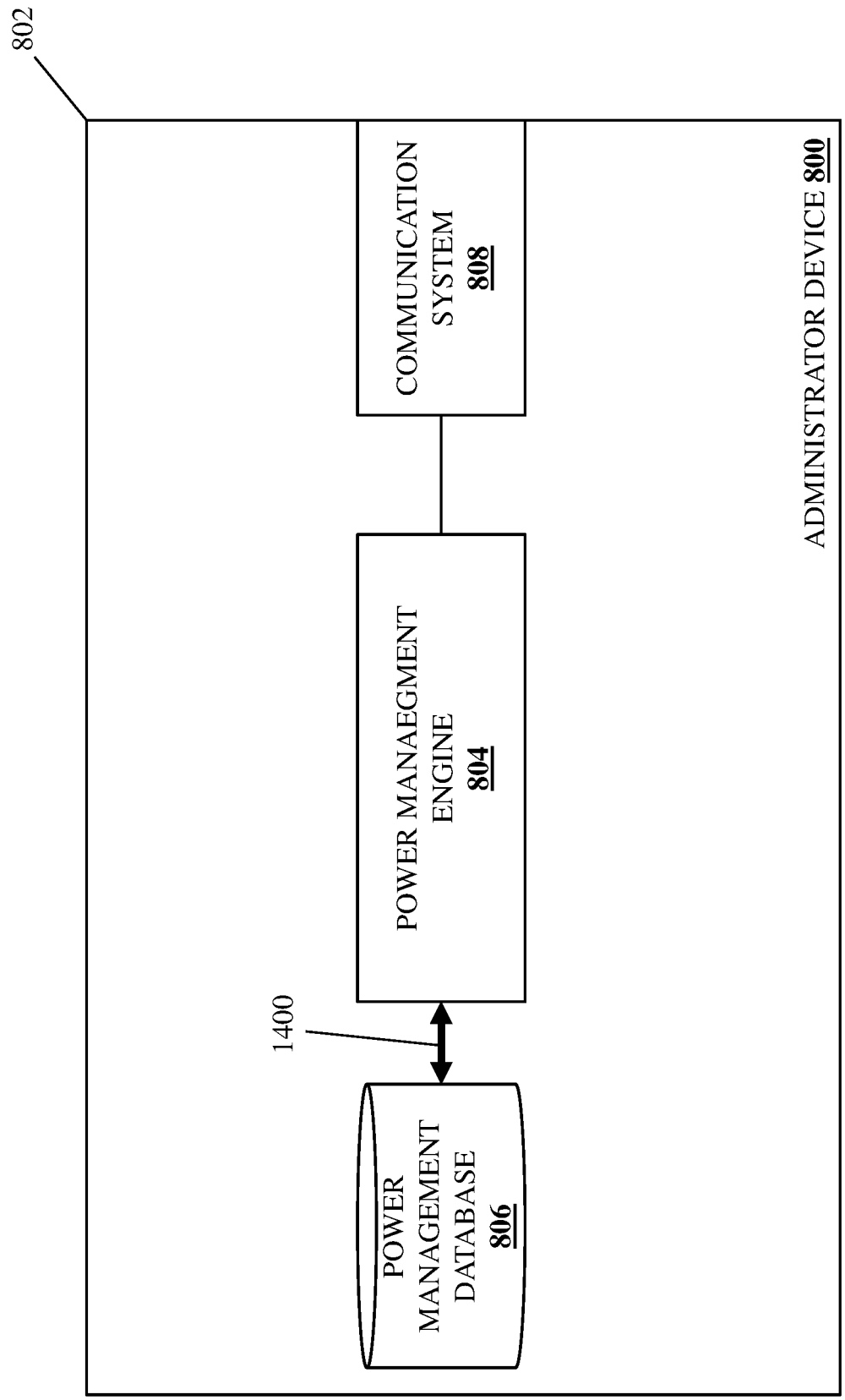
FIG. 14 is a schematic view illustrating an embodiment of the operation of the administrator device of FIG. 8 during the method of FIG. 9.

The method 900 then proceeds to block 908 where the power management subsystem generates input current limits for each of the server devices. With reference to FIG. 14, in an embodiment of block 908, the power management engine 804 in the administrator device 702/800 may perform input current limit generation operations 1400 that may include accessing its power management database 806, generating input current limits for each PSU in each of the server devices 706*a*-706*c* based on the power requirement information, the power transmission limitation, and the power infrastructure architecture described above, and storing those input current limits in its power management database 806. In an experimental embodiment, the inventors of the present disclosure utilized the techniques described herein in order to generate input current limits for the PSUs in the server devices 1202, 1204, 1206, and 1208 discussed above with reference to FIG. 12 connected to power sources via the PDUs discussed above with reference to FIGS. 12 and 13, and the discussion of block 908 of the method 900 below describes data generated during that experimental embodiment. However, one of skill in the art in possession of the present disclosure will also appreciate how the teachings of the present disclosure may be utilized to generate input current limits for any of a variety of computing devices and/or components connected via any of a variety of power infrastructure to any power sources while remaining within the scope of the present disclosure as well.

For example, at block 908, the power management engine 804 in the administrator device 702/800 may determine that the power input to the power connectors 1302 on the PDUs 1210-1216/1300 is provided by a 208 volt, 4-wire power cable (e.g., including Line 1 (L1), Line 2 (L2), Line 3 (L3), and Ground (G)), as illustrated by the four arrows identifying the power input to the power connector 1302 on the PDU 1300 in FIG. 13), which one of skill in the art in possession of the present disclosure in the art will recognize provides a 3-phase DELTA electrical configuration. However, while the discussion below is specific to a 3-phase DELTA electrical configuration, one of skill in the art in possession of the present disclosure will appreciate how other electrical configurations (e.g., a 5-wire power cable providing a WYE electrical configuration) will fall within the scope of the present disclosure as well.

Continuing with this example, one of skill in the art in possession of the present disclosure will appreciate how the power input provided by the 208 volt, 4-wire power cable will provide the three line-to-line phase pairs 1304 (L1→L2), 1306 (L1→L3), and 1308 (L2→L3), respectively, that are each 120 degrees out-of-phase with each other, and the power management engine 804 in the administrator device 702/800 may determine that a 30 amp circuit breaker is provided at the source of power to each phase pair 1304, 1306, and 1308, as well as that the load on any of the phase pairs 1304, 1306, and 1308 has a standard Underwriters Laboratory (UL) derating of 20%, resulting in a maximum current of (30 amps*80%=) 24 amps that should be provided to phase pair 1304, 1306, and 1308 in order to avoid tripping those circuit breakers.

As such, at block 908 the power management engine 804 may determine that a 3-phase, 30 amp, 208 volt "whip" power input provided to the power connectors 1302 on the PDUs 1210-1216/1300 results in a maximum current that should be provided to each of the phase pairs 1304, 1306, and 1308 of 24 amps. However, due to the phase pairs 1304-1308 being 120 degrees out-of-phase with each other, the power management engine 204 may then determine that a maximum current of (24 amps*√3=) 13.856 amps may be transmitted by the phase pairs 1304, 1306, and 1308.

Furthermore, at block 908, the power management engine 804 may determine that each of the six banks on the PDUs 1210-1216/1300 includes a 20 amp circuit breaker (e.g., the circuit breakers 1310-1320), and based on the UL derating of 20% discussed above, that a maximum current of (20 amps*80%=) 16 amps should be provided to each of the six banks on the PDUs 1210-1216/1300 in order to avoid tripping their corresponding circuit breakers.

Further still, at block 908, the power management engine 804 may determine that each of the outlets (e.g., the outlets 1322-1332 provided by C19 outlets in this example) for the six banks on the PDUs 1210-1216/1300 is configured to transmit a maximum current of 16 amps. However, while a specific example using C19 outlets is provided, one of skill in the art in possession of the present disclosure will appreciate how other outlets with other maximum current capabilities (e.g., C13 outlets configured to transmit a maximum current of 10 amps) will fall within the scope of the present disclosure as well.

Finally, at block 908, the power management engine 804 may determine that each of the PSUs in the server devices 1202, 1204, 1206, and 1208 is a 3 kW DC PSU having an AC power input limitation of (DC 3 kW/93%=) 3226 watts AC. As will be appreciated by one of skill in the art in possession of the present disclosure, power input limitations like the AC power input limitation of the PSUs described above may cause those PSUs to be the limiting factor for power consumption by the server devices from the power source(s). For example, a 3 kW DC output PSU may only be allowed to consume 16 A of AC power due to connector/cable derating and limitations, and an analysis of the power infrastructure may determine that the AC whip circuit breaker, derating, cable, PDU, bank circuit breaker, and outlet are more than capable of delivering 16 A or greater, thus identifying AC power input limitation of the PSU input as the factor limiting power consumption to 16 A or less. Furthermore, in situations where an AC input voltage drops and causes a corresponding AC current to rise, a 16 A limit may require throttling if that voltage drop causes the corresponding current to exceed 16 A.

As such, and as described in more detail below, at block 908 the power management engine 804 may identify that while the outlets 1322-1332 on the PDUs 1210-1216/1300 and their corresponding circuit breakers 1310-1320 (e.g., the outlets/circuit breaker combination for each bank on the PDUs 1210-1216/1300) are each configured to transmit a maximum current of 16 amps (i.e., such that a maximum current of 16 amps or less should be transmitted to each bank on the PDUs 1210-1216/1300), the maximum current that should be transmitted to each phase pair 1304-1308 in the PDUs 1210-1216/1300 should be less than 13.856 amps. Thus, in the specific example provided above, the phase pairs 1304-1308 in the PDUs 1210-1216/1300 may operate to limit the amount of power that the server devices 1202-1208 may draw via the power infrastructure.

To provide a specific example, if a fifth bank on a PDU that utilizes the circuit breaker 1318 will transmit a current of 7 amps to the outlets 1330 (e.g., based on the power requirement information for the server device(s) connected to those outlets 1330), and a sixth bank on that PDU that utilizes the circuit breaker 1320 will transmit a current of 7 amps to the outlets 1332 (e.g., based on the power requirement information for the server device(s) connected to those outlets 1332), then the current (14 amp) that will be transmitted by the phase pair 1306 (L1→L3) will exceed its maximum current of 13.856 amps. As such, at block 908, the power management engine 804 may generate an input current limit for the PSUs in the server device(s) 1202, 1204, 1206, and 1208 that are connected to the outlets 1330 and 1332 that ensures that the maximum current drawn via the outlets 1330 and 1332 will prevent the current transmitted by the phase pair 1306 (L1→L3) from exceeding its maximum current of 13.856 amps (e.g., the PSUs in the server devices connected to the outlets 1330 and 1332 may be limited to drawing a maximum current of 6.425 amps via each of those outlets 1330 and 1332 to limit the maximum current transmitted by the phase pair 1306 (L1→L3) to 13.850 amps).

Furthermore, the input current limit generation operations 1400 at block 908 may include the power management engine 804 in the administrator device 702/800 performing a variety of power infrastructure component unavailability analysis operations to determine input current limits that will ensure the availability of the power infrastructure in the event of the unavailability of power infrastructure components in that power infrastructure. In the specific examples provided below, the power infrastructure component unavailability analysis operations utilize the power transmission limitations described above, with a maximum current of 24 amps that should be provided via the power input to each of the phase pairs 1304, 1306, and 1308; a maximum current of 13.856 amps that may be transmitted by the phase pairs 1304, 1306, and 1308; a maximum current of 16 amps that should be transmitted to the circuit breakers 1310-1320 and outlets 1322-1332, and a maximum AC input to the PSU in the server devices 1202-1208 of 3226 watts.

With reference to FIGS. 15A, 15B, 16A, and 16B, embodiments of different operating scenarios for the power infrastructure architecture 1200 of FIG. 12 (including the PDU 1300 of FIG. 13 providing the PDUs 1210-1216) are illustrated. As will be appreciated by one of skill in the art in possession of the present disclosure, the operating scenarios illustrated in FIGS. 15A and 15B include a server device 1202 portion 1500a that identifies the details about the PSUs 1202a-1202f in the server device 1202, with the PSU 1202a connected via outlet 3 on bank 1 of the PDU 1210/1300 to its phase pair 1304, the PSU 1202b connected via outlet 9 on bank 3 of the PDU 1210/1300 to its phase pair 1308, the PSU 1202c connected via outlet 15 on bank 5 of the PDU 1210/1300 to its phase pair 1306, the PSU 1202d connected via outlet 3 on bank 1 of the PDU 1212/1300 to its phase pair 1304, the PSU 1202e connected via outlet 9 on bank 3 of the PDU 1212/1300 to its phase pair 1308, and the PSU 1202f connected via outlet 15 on bank 5 of the PDU 1212/1300 to its phase pair 1306.

Similarly, the operating scenarios illustrated in FIGS. 15A and 15B include a server device 1204 portion 1500b that identifies the details about the PSUs 1204a-1204f in the server device 1204, with the PSU 1204a connected via outlet 5 on bank 2 of the PDU 1210/1300 to its phase pair 1304, the PSU 1204b connected via outlet 11 on bank 4 of the PDU 1210/1300 to its phase pair 1308, the PSU 1204c connected via outlet 17 on bank 6 of the PDU 1210/1300 to its phase pair 1306, the PSU 1204d connected via outlet 5 on bank 2 of the PDU 1212/1300 to its phase pair 1304, the PSU 1204e connected via outlet 11 on bank 4 of the PDU 1212/1300 to its phase pair 1308, and the PSU 1204f connected via outlet 17 on bank 6 of the PDU 1212/1300 to its phase pair 1306.

Similarly, the operating scenarios illustrated in FIGS. 16A and 16B include a server device 1206 portion 1600a that identifies the details about the PSUs 1206a-1206f in the server device 1206, with the PSU 1206a connected via outlet 3 on bank 1 of the PDU 1214/1300 to its phase pair 1304, the PSU 1206b connected via outlet 9 on bank 3 of the PDU 1214/1300 to its phase pair 1308, the PSU 1206c connected via outlet 15 on bank 5 of the PDU 1214/1300 to its phase pair 1306, the PSU 1206d connected via outlet 3 on bank 1 of the PDU 1216/1300 to its phase pair 1304, the PSU 1206e connected via outlet 9 on bank 3 of the PDU 1216/1300 to its phase pair 1308, and the PSU 1206f connected via outlet 15 on bank 5 of the PDU 1216/1300 to its phase pair 1306.

Similarly, the operating scenarios illustrated in FIGS. 16A and 16B include a server device 1208 portion 1600b that identifies the details about the PSUs 1208a-1208f in the server device 1208, with the PSU 1208a connected via outlet 5 on bank 2 of the PDU 1214/1300 to its phase pair 1304, the PSU 1208*b* connected via outlet 11 on bank 4 of the PDU 1214/1300 to its phase pair 1308, the PSU 1208*c* connected via outlet 17 on bank 6 of the PDU 1214/1300 to its phase pair 1306, the PSU 1208*d* connected via outlet 5 on bank 2 of the PDU 1216/1300 to its phase pair 1304, the PSU 1208*e* connected via outlet 11 on bank 4 of the PDU 1216/1300 to its phase pair 1308, and the PSU 1208*f* connected via outlet 17 on bank 6 of the PDU 1216 to its phase pair 1306.

As will be appreciated by one of skill in the art in possession of the present disclosure, FIGS. 15A and 16A illustrated an embodiment of a healthy operating scenario that may be analyzed by the power management engine 804 in the administrator device 702/800 when all of the power infrastructure components in the power infrastructure architecture 1200 of FIG. 12 (including the PDU 1300 of FIG. 13 providing the PDUs 1210-1216) are available. In these examples, the server devices 1202 and 1204 include power budgets (e.g., as identified in the power requirement information described above) having a maximum average power consumption (also called a Thermal Design Power (TDP)) of 4182 watts, a peak power consumption (also called dynamic power (Pdyn), which is typically 120%*TDP) of 5018 watts, and minimum throttling power (also called a Node Lower Boundary (NLB)) of 2509 watts. Similarly, in these examples, the server devices 1206 and 1208 include power budgets (e.g., as identified in the power requirement information described above) having a maximum average power consumption of 5408 watts, a peak power consumption of 6490 watts, and minimum throttling power of 3245 watts.

As can be seen in the server device 1202 portion 1500*a* in FIG. 15A, the healthy operating scenario includes the server device 1202 utilizing its maximum average power consumption and results in the PSU 1202*a* drawing a current of 3.35 amps via the phase pair 1304 in the PDU 1210, the PSU 1202*b* drawing a current of 3.35 amps via the phase pair 1308 in the PDU 1210, the PSU 1202*c* drawing a current of 3.35 amps via the phase pair 1306 in the PDU 1210, the PSU 1202*d* drawing a current of 3.35 amps via the phase pair 1304 in the PDU 1212, the PSU 1202*e* drawing a current of 3.35 amps via the phase pair 1308 in the PDU 1212, and the PSU 1202*f* drawing a current of 3.35 amps via the phase pair 1306 in the PDU 1212.

Similarly, as can be seen in the server device 1204 portion 1500*b* in FIG. 15A, the healthy operating scenario includes the server device 1204 utilizing its maximum average power consumption and results in the PSU 1204*a* drawing a current of 3.35 amps via the phase pair 1304 in the PDU 1210, the PSU 1204*b* drawing a current of 3.35 amps via the phase pair 1308 in the PDU 1210, the PSU 1204*c* drawing a current of 3.35 amps via the phase pair 1306 in the PDU 1210, the PSU 1204*d* drawing a current of 3.35 amps via the phase pair 1304 in the PDU 1212, the PSU 1204*e* drawing a current of 3.35 amps via the phase pair 1308 in the PDU 1212, and the PSU 1204*f* drawing a current of 3.35 amps via the phase pair 1306 in the PDU 1212.

As such, in the healthy operating scenario of FIG. 15A with the server devices 1202 and 1204 each utilizing their maximum average power consumption, the phase pair 1304 in the PDU 1210 will transmit a current of 6.70 amps, the phase pair 1306 in the PDU 1210 will transmit a current of 6.70 amps, the phase pair 1308 in the PDU 1210 will transmit a current of 6.70 amps, the phase pair 1304 in the PDU 1212 will transmit a current of 6.70 amps, the phase pair 1306 in the PDU 1212 will transmit a current of 6.70 amps, and the phase pair 1308 in the PDU 1212 will transmit a current of 6.70 amps. In other words, the healthy operating scenario of FIG. 15A illustrates an example in which the server devices 1202 and 1204 each utilizing their maximum average power consumption do not cause any of the phase pairs 1304-1308 in either of the PDUs 1210 and 1212 (which were determined to be the power infrastructure components that limit the amount of power that the server devices 1202 and 1204 may draw via the power infrastructure) to exceed their maximum currents of 13.856 amps.

Similarly, as can be seen in the server device 1206 portion 1600*a* in FIG. 16A, the healthy operating scenario includes the server device 1206 utilizing its maximum average power consumption and results in the PSU 1206*a* drawing a current of 4.33 amps via the phase pair 1304 in the PDU 1214, the PSU 1206*b* drawing a current of 4.33 amps via the phase pair 1308 in the PDU 1214, the PSU 1206*c* drawing a current of 4.33 amps via the phase pair 1306 in the PDU 1214, the PSU 1206*d* drawing a current of 4.33 amps via the phase pair 1304 in the PDU 1216, the PSU 1206*e* drawing a current of 4.33 amps via the phase pair 1308 in the PDU 1216, and the PSU 1206*f* drawing a current of 4.33 amps via the phase pair 1306 in the PDU 1216.

Similarly, as can be seen in the server device 1208 portion 1600*b* in FIG. 16A, the healthy operating scenario includes the server device 1208 utilizing its maximum average power consumption and results in the PSU 1208*a* drawing a current of 4.33 amps via the phase pair 1304 in the PDU 1214, the PSU 1208*b* drawing a current of 4.33 amps via the phase pair 1308 in the PDU 1214, the PSU 1208*c* drawing a current of 4.33 amps via the phase pair 1306 in the PDU 1214, the PSU 1208*d* drawing a current of 4.33 amps via the phase pair 1304 in the PDU 1216, the PSU 1208*e* drawing a current of 4.33 amps via the phase pair 1308 in the PDU 1216, and the PSU 1208*f* drawing a current of 4.33 amps via the phase pair 1306 in the PDU 1216.

As such, in the healthy operating scenario of FIG. 16A with the server devices 1206 and 1208 each utilizing their maximum average power consumption, the phase pair 1304 in the PDU 1214 will transmit a current of 8.67 amps, the phase pair 1306 in the PDU 1214 will transmit a current of 8.67 amps, the phase pair 1308 in the PDU 1214 will transmit a current of 8.67 amps, the phase pair 1304 in the PDU 1216 will transmit a current of 8.67 amps, the phase pair 1306 in the PDU 1216 will transmit a current of 8.67 amps, and the phase pair 1308 in the PDU 1216 will transmit a current of 8.67 amps. In other words, the healthy operating scenario of FIG. 16A illustrates an example in which the server devices 1206 and 1208 each utilizing their maximum average power consumption do not cause any of the phase pairs 1304-1308 in either of the PDUs 1214 and 1216 (which were determined to be the power infrastructure components that limit the amount of power that the server devices 1206 and 1208 may draw via the power infrastructure) to exceed their maximum currents of 13.856 amps.

As will be appreciated by one of skill in the art in possession of the present disclosure, FIGS. 15B and 16B illustrate embodiments of unavailable power infrastructure component operating scenarios that may be analyzed by the power management engine 804 in the administrator device 702/800 when power infrastructure components in the power infrastructure architecture 1200 of FIG. 12 (including the PDU 1300 of FIG. 13 providing the PDUs 1210-1216) are unavailable. In the example provided in FIG. 15B the PDU 1212 becomes unavailable such that the PDU 1210 must power both of the server devices 1202 and 1204, while in the example provided in FIG. 16B the PDU 1214 becomes unavailable such that the PDU 1216 must power both of the server devices 1206 and 1208.

As can be seen in the server device 1202 portion 1500*a* in FIG. 15B, the unavailability of the PDU 1212 during the unavailable power infrastructure component operating scenario when the server device 1202 is utilizing its maximum average power consumption results in the PSU 1202*a* drawing a current of 6.70 amps via the phase pair 1304 in the PDU 1210, the PSU 1202*b* drawing a current of 6.70 amps via the phase pair 1308 in the PDU 1210, and the PSU 1202*c* drawing a current of 6.70 amps via the phase pair 1306 in the PDU 1210. Similarly, as can be seen in the server device 1204 portion 1500*b* in FIG. 15B, the unavailability of the PDU 1212 during the unavailable power infrastructure component operating scenario when the server device 1204 is utilizing its maximum average power consumption results in the PSU 1204*a* drawing a current of 6.70 amps via the phase pair 1304 in the PDU 1210, the PSU 1204*b* drawing a current of 6.70 amps via the phase pair 1308 in the PDU 1210, and the PSU 1204*c* drawing a current of 6.70 amps via the phase pair 1306 in the PDU 1210.

As such, in the unavailable power infrastructure component operating scenario of FIG. 15B with the server devices 1202 and 1204 each utilizing their maximum average power consumption, the phase pair 1304 in the PDU 1210 will transmit a current of 13.40 amps, the phase pair 1306 in the PDU 1210 will transmit a current of 13.40 amps, and the phase pair 1308 in the PDU 1210 will transmit a current of 13.40 amps. In other words, the unavailable power infrastructure component operating scenario of FIG. 15B illustrates an example in which the server devices 1202 and 1204 each utilizing their maximum average power consumption do not cause any of the phase pairs 1304-1308 in the PDU 1210 (which was determined to be the power infrastructure component that limits the amount of power that the server devices 1202 and 1204 may draw via the power infrastructure) to exceed their maximum currents of 13.856 amps when the PDU 1212 is unavailable.

As can be seen in the server device 1206 portion 1600*a* in FIG. 16B, the unavailability of the PDU 1214 during the unavailable power infrastructure component operating scenario when the server device 1206 is utilizing its maximum average power consumption results in the PSU 1206*d* drawing a current of 8.67 amps via the phase pair 1304 in the PDU 1216, the PSU 1202*e* drawing a current of 8.67 amps via the phase pair 1308 in the PDU 1216, and the PSU 1202*f* drawing a current of 8.67 amps via the phase pair 1306 in the PDU 1216. Similarly, as can be seen in the server device 1208 portion 1600*b* in FIG. 16B, the unavailability of the PDU 1214 during the unavailable power infrastructure component operating scenario when the server device 1208 is utilizing its maximum average power consumption results in the PSU 1208*d* drawing a current of 8.67 amps via the phase pair 1304 in the PDU 1216, the PSU 1208*e* drawing a current of 8.67 amps via the phase pair 1308 in the PDU 1216, and the PSU 1208*f* drawing a current of 8.67 amps via the phase pair 1306 in the PDU 1216.

As such, in the unavailable power infrastructure component operating scenario of FIG. 16B with the server devices 1206 and 1208 each utilizing their maximum average power consumption, the phase pair 1304 in the PDU 1216 will transmit a current of 17.33 amps, the phase pair 1306 in the PDU 1216 will transmit a current of 17.33 amps, and the phase pair 1308 in the PDU 1216 will transmit a current of 17.33 amps. In other words, the unavailable power infrastructure component operating scenario of FIG. 16B illustrates an example in which the server devices 1206 and 1208 each utilizing their maximum average power consumption will cause each of the phase pairs 1304-1308 in the PDU 1216 (which was determined to be the power infrastructure component that limits the amount of power that the server devices 1206 and 1208 may draw via the power infrastructure) to exceed their maximum currents of 13.856 amps when the PDU 1214 is unavailable. As such, at block 908 and based on the unavailable power infrastructure component operating scenario of FIG. 16B, the power management engine 804 in the administrator device 702/800 may generate an input current limit for the PSUs in the server devices 1206 and 1208 that is configured to limit the current drawn by those PSUs from one of the PDUs 1214 or 1216 (i.e., in the event of the unavailability of the other) to under 13.856 amps.

As such, one of skill in the art in possession of the present disclosure will appreciate how the input current limits generated at block 908 may allow the server devices 706*a*-706*c* to reach a targeted, required, or otherwise desired performance level while ensuring that the power infrastructure remains available in the event of the unavailability of a subset of its power infrastructure components, and the desired performance level of any server device may attempt to maximum the performance of that server device while ensuring an unavailable power infrastructure component (or combinations of unavailable power infrastructure components) do not result in the unavailability of any portion of power infrastructure that renders any of the computing devices 706*a*-706*c* unavailable. As such, one of skill in the art in possession of the present disclosure will appreciate how the maximizing of the performance of a server device as described while ensuring power infrastructure availability above does not require (but while still allowing the possibility of) a maximum performance level of that server device, but rather may provide for the highest performance level of that server device that ensures that power infrastructure availability. Thus, the systems and methods of the present disclosure provide for the "right-sizing" of server devices and power infrastructure components in racks so that the server devices will be able to operate based on their typical power consumption for target workloads and conditions, while allowing the input current limits described above to be utilized to protect the power infrastructure in the event there is a power excursion (e.g., a power consumption beyond the target power consumption) by any of the server devices and/or their components.

Furthermore, while the embodiments described herein generally discuss a single input current limit that is applied to each PSU in a server device that operates to protect the power infrastructure in the event of the unavailability of power infrastructure components, one of skill in the art in possession of the present disclosure will appreciate how multiple input current limits may be generated for any PSU in a server device while remaining within the scope of the present disclosure as well. For example, first input current limits may be generated for PSUs in a server device for use in the healthy operating scenario described above in order to allow that server device to reach its maximum performance level, while second input current limits may be generated for those PSUs in that server device for use in any of the unavailable power infrastructure component scenarios discussed above so that that server device may reach targeted performance levels while ensuring the availability of the power infrastructure as described above. As such, one of skill in the art in possession of the present disclosure will recognize how any number of input current limits may be generated for any server device at block 908 while remaining within the scope of the present disclosure as well.

Further still, one of skill in the art in possession of the present disclosure will appreciate how input current limits may be generated for subsets of the server devices 706a-706c, thus allowing at least some of those server devices to subsequently operate without input current limits. For example, input current limits may not be generated for server devices running business critical applications in order to allow those server devices to operate at any needed performance level, while input current limits may be generated as described above for server devices running non-business critical applications and in consideration of the power consumption of the server devices that will operate without the input current limits, thus providing for the reduction in performance of only non-business critical functionality based on limitations of the power infrastructure and/or power infrastructure component unavailability. Similarly, server devices and/or applications may include priority assignments that may be used to determine whether to generate or enforce an input current limit for a server device in order to prevent the limiting of the performance of a server device performing any critical functionality, thus ensuring that only non-critical functionality is limited in the event of power infrastructure limitations or power infrastructure component unavailability (e.g., up to and including the shutting down of server devices performing non-critical functionality).

However, while specific examples of power infrastructure component unavailability analysis operations that consider the unavailability of PDUs in the power infrastructure have been illustrated and described, one of skill in the art in possession of the present disclosure will appreciate how the unavailability of other power infrastructure components and/or combinations of power infrastructure components may be considered during the power infrastructure component unavailability analysis operations discussed above while remaining within the scope of the present disclosure as well. For example, in some embodiments and in addition to 1) the healthy operating scenario in which all the PSUs in the server devices and all of the PDUs coupling those PSUs/server devices to the power source(s) are available, and 2) each of the unavailable power infrastructure component operating scenarios described above in which one of the PDUs coupling PSUs/server devices to the power source(s) is unavailable and results in the unavailability of one or more PSUs in the server devices, other unavailable power infrastructure component operating scenarios may be considered in which 3) one of the PSUs in the server devices is unavailable, and 4) one of the PSUs in the server devices and one of the PDUs coupling the PSUs/server devices to the power source(s) are unavailable. However, while three specific common power infrastructure component unavailability scenarios have been described, one of skill in the art in possession of the present disclosure will appreciate how any of a variety of power infrastructure component unavailability scenarios will fall within the scope of the present disclosure as well.

Furthermore, the power infrastructure component unavailability analysis operations discussed above may be performed by the power management engine 804 in the administrator device 702/800 for reasons other than (or in addition to) the input current limit generation operations discussed above. For example, the power management engine 804 may be configured to generate any a variety of alerts based on a variety of power infrastructure component availability and/or unavailability scenarios analyzed during power infrastructure component unavailability analysis operations like those discussed above. In an embodiment, following the analysis of the healthy operating scenario and the power infrastructure component unavailability scenarios described above, the power management engine 804 in the computing device 702/800 may identify if the power infrastructure is not sufficient to support maximum performance of the server devices 706a-706c when all of its power infrastructure components are available, and/or whether there is a risk of power unavailability or damage in the event of a common power infrastructure component unavailability scenario. In another embodiment, following the analysis of any of the healthy operating scenario and the power infrastructure component unavailability scenarios described above, the power management engine 804 in the computing device 702/800 may identify any power transmission limits of the power infrastructure components have been exceeded and, if so, generate a log that identifies that scenario and, in some cases, possible causes of that scenario, as well as provide that log for display to a user of the administrator device 702/800.

For example, using the specific embodiment described above in which the unavailable power infrastructure component operating scenario included the PDU 1214 becoming unavailable and resulted in the unavailability of the PSUs 1206a-c in the server device 1206 and the PSUs 1208a-c in the server device 1208, as well as the subsequent unavailability of the PDU 1216, the power management engine 804 in the administrator device 702/800 may generate a power infrastructure unavailability log that identifies the unavailable power infrastructure component operating scenario (e.g., "PDU 1214 unavailability results in PSU 1206a-c and PSU 1208a-c unavailability, subsequently resulting in PDU 1216 unavailability"), as well as possible causes of that unavailable power infrastructure component operating scenario (e.g., "3-Phase AC Line-to-Line derating" to indicate that the standard UL derating of the maximum current provided to the phase pairs 1304, 1306, and 1308 in the PDU 1216/1300 resulted in a maximum current for those phase pairs 1304, 1306, and 1308 that was exceeded when the PDU 1214 was unavailable and the server devices 1206 and 1208 continued to utilize their maximum average power consumption).

However, while a specific cause for a unavailable power infrastructure component operating scenario has been described, one of skill in the art in possession of the present disclosure will appreciate how other unavailable power infrastructure component operating scenario causes (e.g., the PDU circuit breaker derating, the PDU outlet maximum current, the PSU maximum AC input limit described above, and/or other unavailable power infrastructure component operating scenario causes that would be apparent to one of skill in the art in possession of the present disclosure) will fall within the scope of the present disclosure as well.

The method 900 then proceeds to decision block 910 where it is determined whether an input current limit issue has been detected. In an embodiment, at decision block 910 and following the analysis of any of the healthy operating scenario and the power infrastructure component unavailability scenarios described above and the generation of one or more input current limits for the server devices, the power management engine 804 in the computing device 702/800 may perform input current limit issue identification operations that include identifying if any issues exist with the input current limits that were generated at block 908. For example, at decision block 910, the power management engine 804 may determine whether an input current limit generated for PSU(s) in a server device is less than a minimum throttling power (i.e., the NLB) for that server device. In another example, at decision block 910, the power management engine 804 may determine whether an input current limit generated for a PSU(s) in a server device is less than a peak power consumption (i.e., Pdyn) for that server device. In yet another example, at decision block 910, the power management engine 804 may determine whether an input current limit generated for PSU(s) in a server device is less than a maximum average power consumption (i.e., TDP) for that server device. However, while a few specific examples of determining whether input current limit issue exist have been described, one of skill in the art in possession of the present disclosure will appreciate how other input current limit issues may be determined that will fall within the scope of the present disclosure as well.

If, at decision block 910, it is determined that an input current limit has been detected, the method 900 proceeds to block 912 where the power management subsystem generates an input current limit alert. In an embodiment, at block 912 and in response to identifying an issue with an input current limit that was generated by block 908, the power management engine 804 in the administrator device 702/800 may generate an alert or other log that identifies that issue, and provide that alert for display to a user of the administrator device 702/800. For example, if it is determined at decision block 910 that an input current limit generated for PSU(s) in a server device is less than a minimum throttling power (i.e., the NLB) for that server device, then at block 912 the power management engine 804 in the administrator device 702/800 may generate and display an alert to a user of the administrator device 702/800 that identifies that the input current limit generated at block 908 may not be capable of being honored by the PSU(s) in that server device (e.g., "minimum throttle power exceeds input current limit").

In another example, if it is determined at decision block 910 that an input current limit generated for PSU(s) in a server device is less than a peak power consumption (i.e., Pdyn) for that server device, then at block 912 the power management engine 804 in the administrator device 702/800 may generate and display a log to a user of the administrator device 702/800 that identifies that the input current limit generated at block 908 may prevent that server device from reaching its maximum performance level (e.g., "input current limit will prevent maximum performance"). In yet another example, if it is determined at decision block 910 that an input current limit generated for PSU(s) in a server device is less than a maximum average power consumption (i.e., TDP) for that server device, then at block 912 the power management engine 804 in the administrator device 702/800 may generate and display a log to a user of the administrator device 702/800 that identifies that the input current limit generated at block 908 may prevent that server device from reaching its expected, targeted, or otherwise desired performance level (e.g., "input current limit will prevent expected performance"). However, while a few specific input current limit alerts have been described, one of skill in the art in possession of the present disclosure will appreciate how a variety of other alerts for input current limits may be generated based on a variety of other factors while remaining within the scope of the present disclosure as well.

Figure 17A:
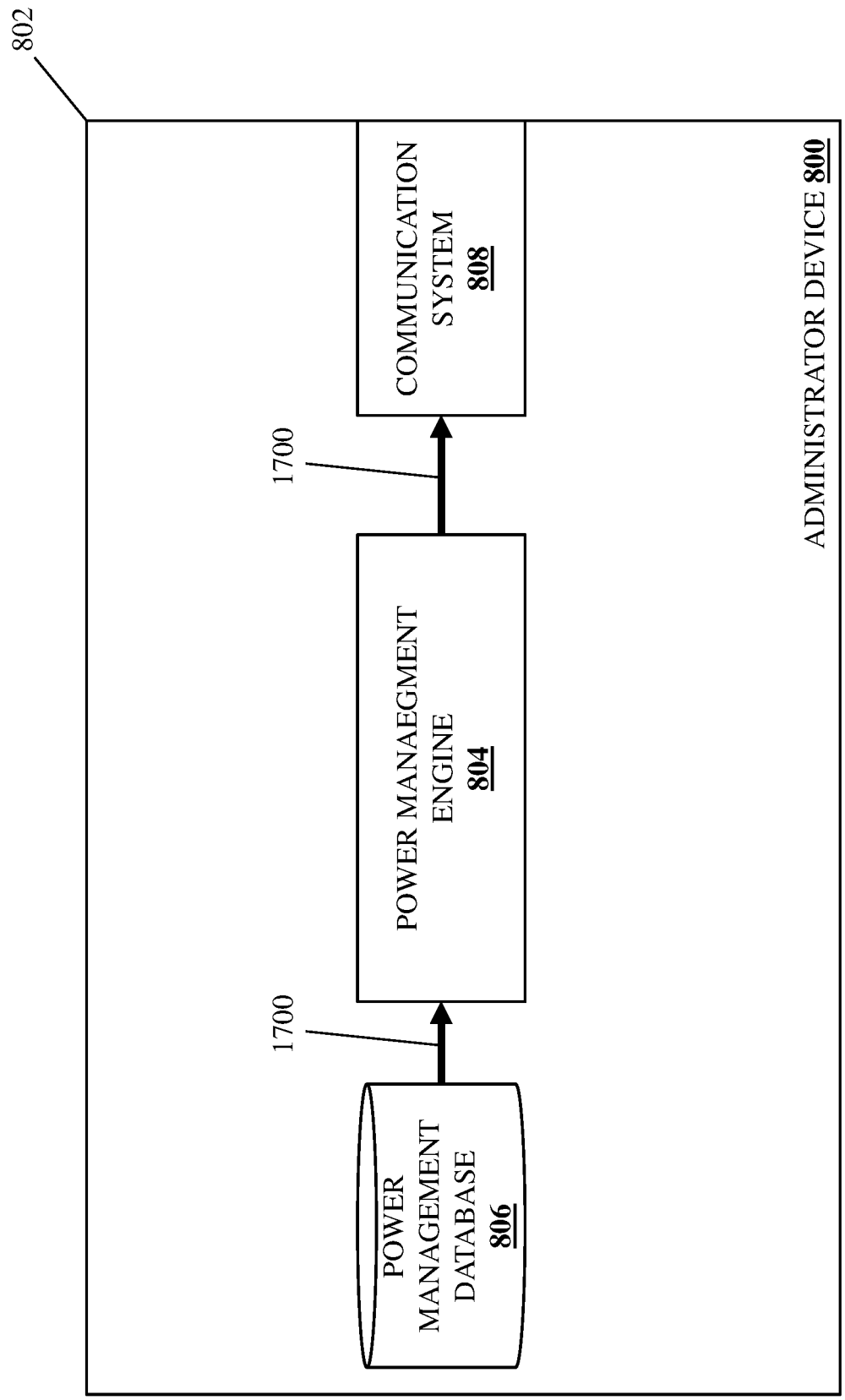
FIG. 17A is a schematic view illustrating an embodiment of the operation of the administrator device of FIG. 8 during the method of FIG. 9.
Figure 17B:
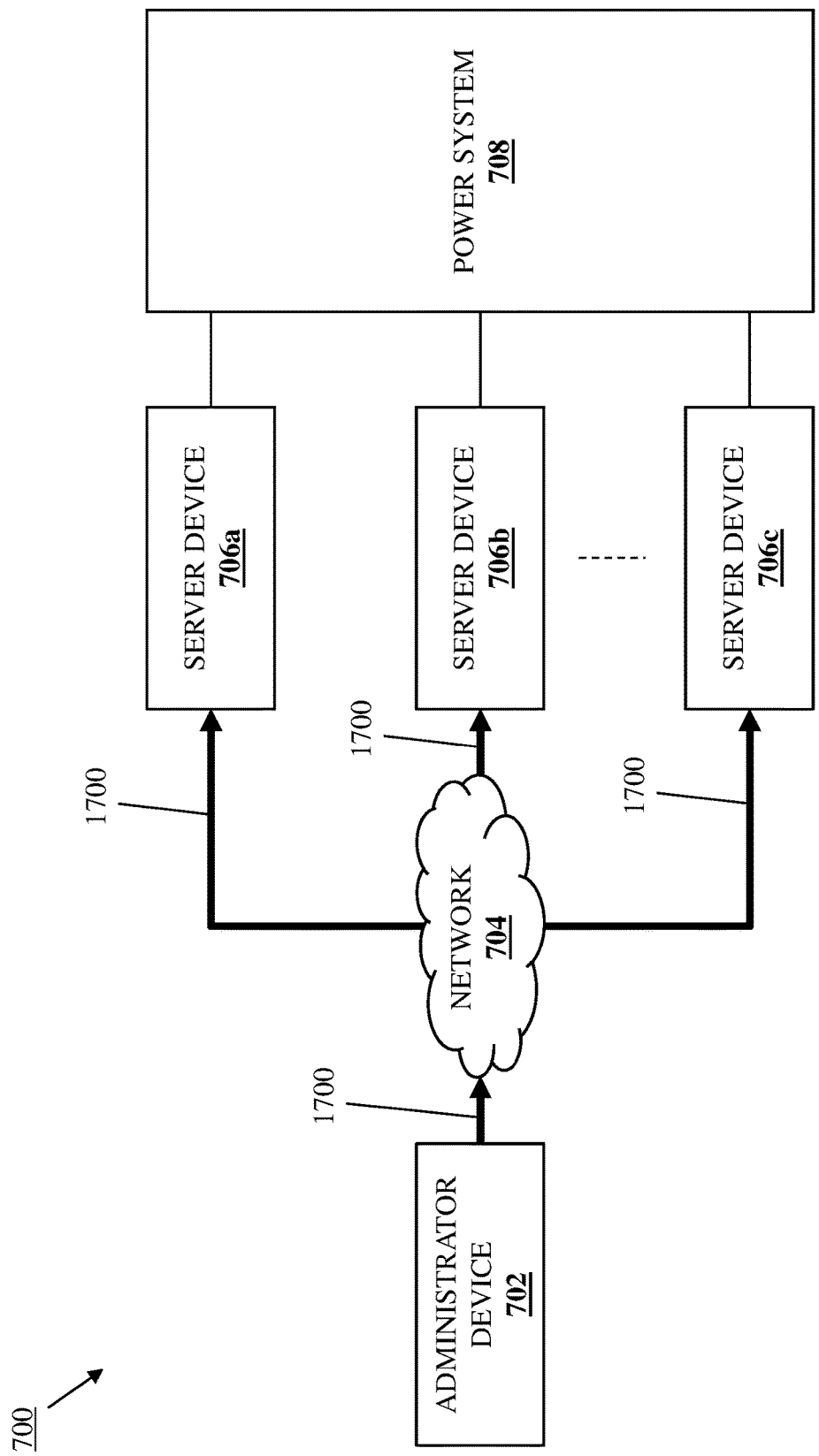
FIG. 17B is a chart view illustrating an embodiment of the operation of the networked system of FIG. 7 during the method of FIG. 9.

If at decision block 910 it is determined that no input current limit issue is detected, or following block 912, the method 900 proceeds to block 914 where the power management subsystem provides the input current limits to each of the server devices. With reference to FIGS. 17A and 17B, in an embodiment of block 914, the power management engine 806 in the administrator device 702/800 may perform input current limit provisioning operations 1700 that may include retrieving the input current limits generated at block 908 from its power management database 806 and transmitting those input current limits through the network 704 via its communication system 808 and to any of the server devices 706a-706c for which those input current limits were generated. For example, at block 914, each input current limit generated at block 908 may be transmitted to a BMC device (e.g., the iDRAC available from DELL® Inc. of Round Rock, Texas, United States) in the server device that includes the PSU for which that input current limit was generated, and that BMC device may apply that input current limit to that PSU (e.g., via the setting of a firmware policy, PSU policy, and/or other input current limit application technique that would be apparent to one of skill in the art in possession of the present disclosure). As such, following block 914, each of the PSUs in the server devices 706a-706c may be configured with the input current limits described above, and thus the performance of each of those server devices 706a-706c may be maximized while ensuring availability of the power infrastructure in the event of an unavailability of one or more of the power infrastructure components in the power infrastructure.

As will be appreciated by one of skill in the art in possession of the present disclosure, following the provisioning of the input current limits on the server devices 706a-706c, the techniques described above with reference to the method 400 may be utilized by any of those server devices in order to reduce stranded power that may result from the application of those input current limits. Furthermore, the power management engine 804 in the administrator device 702/800 may be configured to collect, analyze, and report any power consumption above and/or below the input current limits applied to the server devices 706a-706c in order to, for example, categorize a "health" status of the power infrastructure (e.g., with power consumption well under the limits of the power infrastructure indicating a "healthy" power infrastructure, power consumption at or near the limits of the power infrastructure indicating possible future health issues with the power infrastructure, and power consumption above the limits of the power infrastructure indicating an "unhealthy" power infrastructure).

Thus, systems and methods have been described that provide for the use of power requirements of server devices, power transmission limitations of power infrastructure components that couple those server devices to power source(s), and a power infrastructure architecture that identifies how the power infrastructure components couple the server devices to the power source(s), to generate input current limits for each of those server devices. For example, the power management system of the present disclosure may include a power infrastructure having power infrastructure components that couple server devices to power source(s), and a power management subsystem coupled to the server devices. The power management subsystem identifies power requirement information for each of the server devices and power transmission limitation information for the power infrastructure components, and determines a power infrastructure architecture that identifies how the power infrastructure components couple the server devices to the power source(s). The power management subsystem then uses the power requirement information, the power transmission limitation information, and the power infrastructure architecture to generate and provide a respective input current limit to each of the server devices. Each respective input current limit is configured to maximize performance of the respective server device for which it was generated while ensuring availability of the power infrastructure in the event of an unavailability of a subset of the power infrastructure components. As such, "right size" server device/power infrastructure deployments within racks are enabled that maximize compute density, minimize stranded power, minimize power outages (reducing associated financial losses), and maximum up-time.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A power management system, comprising:
  a plurality of computing devices;
  a physical power infrastructure that includes a plurality of physical power infrastructure components that couple the plurality of physical computing devices to at least one physical power source; and
  a power management subsystem that is coupled to the plurality of physical computing devices and that is configured to:
    identify power requirement information for each of the plurality of physical computing devices;
    identify power transmission limitation information for the plurality of physical power infrastructure components in the physical power infrastructure;
    determine a power infrastructure architecture that identifies how the physical power infrastructure components in the physical power infrastructure couple the plurality of physical computing devices to the at least one physical power source;
    generate, for each of the plurality of physical computing devices based on the power requirement information, the power transmission limitation information, and the physical power infrastructure architecture, a respective input current limit that is configured to maximize performance of that physical computing device while ensuring availability of the physical power infrastructure in the event of an unavailability of one or more of the physical power infrastructure components in the physical power infrastructure; and
    provide, to each of the plurality of physical computing devices, the respective input current limit that was generated for that physical computing device, wherein each of the plurality of physical computing devices is configured to:
      configure a power supply system included in that physical computing device with the respective input current limit received from the power management subsystem for that physical computing device to provide power to that physical computing device that maximizes performance of that physical computing device while ensuring availability of the physical power infrastructure in the event of an unavailability of one or more of the physical power infrastructure components in the physical power infrastructure.

2. The system of claim 1, wherein the physical power infrastructure components include:
  the power supply system included in each of the plurality of physical computing devices; and
  at least one power distribution unit coupled to the power supply system included in each of the plurality of physical computing devices.

3. The system of claim 2, wherein the generating the respective input current limit for each of the plurality of physical computing devices includes generating the respective input current for each power supply system included in each of the plurality of physical computing devices.

4. The system of claim 1, wherein the respective input current limit generated for each of the plurality of physical computing devices is configured to ensure that respective power infrastructure component loads provided by each of the plurality of physical computing devices on the physical power infrastructure components that couple those physical computing devices to the at least one physical power source do not exceed the power transmission limitations identified in the power transmission limitation information identified for any of those physical power infrastructure components.

5. The system of claim 1, wherein the power management subsystem is configured to:
  determine that the respective input current limit generated for one of the plurality of physical computing devices cannot be met by that physical computing device and, in response, generate an input current limit compliance alert; and
  determine that the respective input current limit generated one of the plurality of physical computing devices will prevent that physical computing device from reaching a threshold performance level for that physical computing device and, in response, generate an input current limit performance degradation alert.

6. The system of claim 1, wherein the power management subsystem is configured to:
  analyze the unavailability of at least one first physical power infrastructure component in the physical power infrastructure to determine whether it results in the unavailability of at least one second physical power infrastructure component in the physical power infrastructure due to a power infrastructure component load provided by each of the plurality of physical computing devices coupled to the at least one physical power source by the at least one second physical power infrastructure component; and
  generate, for each of the plurality of physical computing devices coupled to the at least one physical power source by the at least one second physical power infrastructure component, the respective input current limits that ensure that the unavailability of the at least one first physical power infrastructure component in the physical power infrastructure will not result in the unavailability of the at least one second physical power infrastructure component in the physical power infrastructure.

7. An Information Handling System (IHS), comprising:
  a plurality of physical computing devices; and
  an administrator device that is coupled to the plurality of physical computing devices and that includes:
    a processing system; and
    a memory system that is coupled to the processing system and that includes instructions that, when executed by the processing system, cause the processing system to provide a power management engine that is configured to:

identify power requirement information for each of the plurality of physical computing devices that are coupled to the processing system;

identify power transmission limitation information for a plurality of physical power infrastructure components in a physical power infrastructure that couple the plurality of physical computing devices to at least one physical power source;

determine a power infrastructure architecture that identifies how the physical power infrastructure components in the physical power infrastructure couple the plurality of physical computing devices to the at least one physical power source;

generate, for each of the plurality of physical computing devices based on the power requirement information, the power transmission limitation information, and the power infrastructure architecture, a respective input current limit that is configured to maximize performance of that physical computing device while ensuring availability of the physical power infrastructure in the event of an unavailability of one or more of the physical power infrastructure components in the physical power infrastructure; and provide, to each of the plurality of physical computing devices, the respective input current limit that was generated for that physical computing device, wherein each of the plurality of physical computing devices is configured to:

configure a power supply system included in that physical computing device with the respective input current limit received from the power management engine for that physical computing device to provide power to that physical computing device that maximizes performance of that physical computing device while ensuring availability of the physical power infrastructure in the event of an unavailability of one or more of the physical power infrastructure components in the physical power infrastructure.

8. The IHS of claim 7, wherein the power infrastructure components include:

the power supply system included in each of the plurality of physical computing devices; and at least one power distribution unit coupled to the power supply system included in each of the plurality of physical computing devices.

9. The IHS of claim 8, wherein the generating the respective input current limit for each of the plurality of physical computing devices includes generating the respective input current for each power supply system in each of the plurality of physical computing devices.

10. The IHS of claim 7, wherein the respective input current limit generated for each of the plurality of physical computing devices is configured to ensure that respective power infrastructure component loads provided by each of the plurality of physical computing devices on the physical power infrastructure components that couple those physical computing devices to the at least one physical power source do not exceed the power transmission limitations identified in the power transmission limitation information identified for any of those physical power infrastructure components.

11. The IHS of claim 7, wherein the power management engine is configured to:

determine that the respective input current limit generated for one of the plurality of physical computing devices cannot be met by that physical computing device and, in response, generate an input current limit compliance alert; and determine that the respective input current limit generated one of the plurality of physical computing devices will prevent that physical computing device from reaching a threshold performance level for that physical computing device and, in response, generate an input current limit performance degradation alert.

12. The IHS of claim 7, wherein the power management engine is configured to:

analyze the unavailability of at least one first physical power infrastructure component in the physical power infrastructure to determine whether it results in the unavailability of at least one second physical power infrastructure component in the physical power infrastructure due to a power infrastructure component load provided by each of the plurality of physical computing devices coupled to the at least one physical power source by the at least one second physical power infrastructure component; and generate, for each of the plurality of physical computing devices coupled to the at least one physical power source by the at least one second physical power infrastructure component, the respective input current limits that ensure that the unavailability of the at least one first physical power infrastructure component in the physical power infrastructure will not result in the unavailability of the at least one second physical power infrastructure component in the physical power infrastructure.

13. The IHS of claim 12, wherein the analyzing the unavailability of the at least one first physical power infrastructure component in the physical power infrastructure to determine whether it results in the unavailability of the at least one second physical power infrastructure component in the physical power infrastructure includes:

analyzing the unavailability of the power supply system included in one of the plurality of physical computing devices to determine whether it results in the unavailability of the at least one second physical power infrastructure component in the physical power infrastructure;

analyzing the unavailability of a power distribution unit to determine whether it results in the unavailability of the at least one second physical power infrastructure component in the physical power infrastructure; and analyzing the unavailability of the power supply system included in one of the plurality of physical computing devices and the power distribution unit to determine whether it results in the unavailability of the at least one second physical power infrastructure component in the physical power infrastructure.

14. A method for managing power, comprising:

identifying, by a power management subsystem, power requirement information for each of a plurality of physical computing devices;

identifying, by the power management subsystem, power transmission limitation information for a plurality of physical power infrastructure components in a physical power infrastructure that couple the plurality of physical computing devices to at least one physical power source;

determining, by the power management subsystem, a power infrastructure architecture that identifies how the physical power infrastructure components in the physical power infrastructure couple the plurality of physical computing devices to the at least one physical power source;

generating, by the power management subsystem for each of the plurality of physical computing devices based on the power requirement information, the power transmission limitation information, and the power infrastructure architecture, a respective input current limit that is configured to maximize performance of that physical computing device while ensuring availability of the physical power infrastructure in the event of an unavailability of one or more of the physical power infrastructure components in the physical power infrastructure;

providing, by the power management subsystem to each of the plurality of physical computing devices, the respective input current limit that was generated for that physical computing device; and configuring, by each of the plurality of physical computing devices, a power supply system included in that physical computing device with the respective input current limit received from the power management subsystem for that physical computing device to provide power to that physical computing device that maximizes performance of that physical computing device while ensuring availability of the physical power infrastructure in the event of an unavailability of one or more of the physical power infrastructure components in the physical power infrastructure.

15. The method of claim 14, wherein the physical power infrastructure components include:
the power supply system included in each of the plurality of physical computing devices; and
at least one power distribution unit coupled to the power supply system included in each of the plurality of physical computing devices.

16. The method of claim 15, wherein the generating the respective input current limit for each of the plurality of physical computing devices includes generating the respective input current for each power supply system in each of the plurality of physical computing devices.

17. The method of claim 14, wherein the respective input current limit generated for each of the plurality of physical computing devices is configured to ensure that respective power infrastructure component loads provided by each of the plurality of physical computing devices on the physical power infrastructure components that couple those physical computing devices to the at least one physical power source do not exceed the power transmission limitations identified in the power transmission limitation information identified for any of those physical power infrastructure components.

18. The method of claim 14, further comprising:
determining, by the power management subsystem, that the respective input current limit generated for one of the plurality of physical computing devices cannot be met by that physical computing device and, in response, generating an input current limit compliance alert; and determining, by the power management subsystem, that the respective input current limit generated one of the plurality of physical computing devices will prevent that physical computing device from reaching a threshold performance level for that physical computing device and, in response, generating an input current limit performance degradation alert.

19. The method of claim 14, further comprising:
analyzing, by the power management subsystem, the unavailability of at least one first physical power infrastructure component in the physical power infrastructure to determine whether it results in the unavailability of at least one second physical power infrastructure component in the physical power infrastructure due to a power infrastructure component load provided by each of the plurality of physical computing devices coupled to the at least one physical power source by the at least one second physical power infrastructure component; and generating, by the power management subsystem for each of the plurality of physical computing devices coupled to the at least one physical power source by the at least one second physical power infrastructure component, the respective input current limits that ensure that the unavailability of the at least one first physical power infrastructure component in the physical power infrastructure will not result in the unavailability of the at least one second physical power infrastructure component in the physical power infrastructure.

20. The method of claim 19, wherein the analyzing the unavailability of the at least one first physical power infrastructure component in the physical power infrastructure to determine whether it results in the unavailability of the at least one second physical power infrastructure component in the physical power infrastructure includes:
analyzing, by the power management subsystem, the unavailability of the power supply system included in one of the plurality of physical computing devices to determine whether it results in the unavailability of the at least one second physical power infrastructure component in the physical power infrastructure;

analyzing, by the power management subsystem, the unavailability of a power distribution unit to determine whether it results in the unavailability of the at least one second physical power infrastructure component in the physical power infrastructure; and analyzing, by the power management subsystem, the unavailability of the power supply system included in one of the plurality of physical computing devices and the power distribution unit to determine whether it results in the unavailability of the at least one second physical power infrastructure component in the physical power infrastructure.

* * * * *